United States Patent [19]

Shinmi et al.

[11] 4,296,309

[45] Oct. 20, 1981

[54] THERMAL HEAD

[75] Inventors: Akira Shinmi, Kawasaki; Masahisa Fukui, Yokohama; Toshitami Hara, Tokyo; Yoshiaki Shirato, Yokohama; Yoshioki Hajimoto, Chofu, all of Japan

[73] Assignee: Canon Kabushiki Kaisha, Tokyo, Japan

[21] Appl. No.: 906,359

[22] Filed: May 15, 1978

[30] Foreign Application Priority Data

| Date | | | |
|---|---|---|---|
| May 19, 1977 | [JP] | Japan | 52-57936 |
| Aug. 30, 1977 | [JP] | Japan | 52-103975 |
| Sep. 7, 1977 | [JP] | Japan | 52-107522 |
| Sep. 16, 1977 | [JP] | Japan | 52-111329 |
| Oct. 13, 1977 | [JP] | Japan | 52-122622 |
| Oct. 13, 1977 | [JP] | Japan | 52-122623 |
| Oct. 13, 1977 | [JP] | Japan | 52-122624 |
| Oct. 13, 1977 | [JP] | Japan | 52-122625 |
| Oct. 28, 1977 | [JP] | Japan | 52-129482 |
| Oct. 28, 1977 | [JP] | Japan | 52-129483 |
| Oct. 28, 1977 | [JP] | Japan | 52-129484 |
| Oct. 28, 1977 | [JP] | Japan | 52-129485 |
| Oct. 28, 1977 | [JP] | Japan | 52-129486 |
| Oct. 31, 1977 | [JP] | Japan | 52-131260 |
| Oct. 31, 1977 | [JP] | Japan | 52-131261 |
| Oct. 31, 1977 | [JP] | Japan | 52-131262 |
| Dec. 28, 1977 | [JP] | Japan | 52-160137 |
| Dec. 28, 1977 | [JP] | Japan | 52-160138 |
| Dec. 28, 1977 | [JP] | Japan | 52-160139 |
| Dec. 28, 1977 | [JP] | Japan | 52-160140 |
| Dec. 28, 1977 | [JP] | Japan | 52-160143 |
| Dec. 28, 1977 | [JP] | Japan | 52-160144 |
| Dec. 28, 1977 | [JP] | Japan | 52-160145 |
| Dec. 28, 1977 | [JP] | Japan | 52-160146 |
| Dec. 28, 1977 | [JP] | Japan | 52-160147 |
| Dec. 28, 1977 | [JP] | Japan | 52-160148 |
| Dec. 28, 1977 | [JP] | Japan | 52-160149 |
| Jan. 9, 1978 | [JP] | Japan | 53-1033 |
| Jan. 9, 1978 | [JP] | Japan | 53-1034 |
| Jan. 9, 1978 | [JP] | Japan | 53-1035 |
| Jan. 11, 1978 | [JP] | Japan | 53-1806 |
| Feb. 10, 1978 | [JP] | Japan | 53-14282 |
| Feb. 10, 1978 | [JP] | Japan | 53-14283 |

[51] Int. Cl.$^3$ .................................... H05B 1/00
[52] U.S. Cl. .................. 219/216; 219/543; 338/306
[58] Field of Search .............. 338/306, 307, 308, 309; 219/216, 543; 346/76PH

[56] References Cited

U.S. PATENT DOCUMENTS

| | | | |
|---|---|---|---|
| 3,240,625 | 3/1966 | Collins | 338/308 X |
| 3,503,801 | 3/1970 | Huang et al. | 338/308 X |
| 3,931,492 | 1/1976 | Takano et al. | 219/543 X |
| 3,973,106 | 8/1976 | Ura | 219/216 |
| 4,007,352 | 2/1976 | Ura | 338/308 X |
| 4,017,712 | 4/1977 | Baraff et al. | 219/216 |
| 4,038,517 | 7/1977 | Nelson | 338/308 X |
| 4,073,971 | 2/1978 | Yasujima et al. | 338/307 X |
| 4,129,848 | 12/1978 | Frank et al. | 338/308 |
| 4,136,274 | 1/1979 | Shibata et al. | 219/543 X |
| 4,169,032 | 9/1979 | Haase et al. | 219/216 X |
| 4,194,108 | 3/1980 | Nakajima et al. | 219/543 X |

FOREIGN PATENT DOCUMENTS 715691  8/1965  Canada ................................ 338/308

OTHER PUBLICATIONS

Brady, *Materials Handbook*, Ninth Edition, McGraw-Hill Book Comp., New York, 1956, pp. 630-631.
Shibata et al., IEEE Transactions on Parts, Hybrids and Packaging, "New type thermal printing head using thin film", vol. PHP-12, No. 3, pp. 223-230, Sep. 1976.

*Primary Examiner*—C. L. Albritton
*Attorney, Agent, or Firm*—Fitzpatrick, Cella, Harper & Scinto

[57] ABSTRACT

A thermal head of the present invention is composed of a substrate, a resistive heater element formed on the substrate, and electrically conductive members to supply electric power to the resistive heater element, wherein the resistive heater element contains a metal boride as the principal constituent. The thermal head of this construction is capable of selecting its resistivity to a high value and causing a large electric current to flow in the form of short pulses for the purpose of high speed printing, hence it is stable against repetitive pulse applications over a long period of time.

36 Claims, 48 Drawing Figures

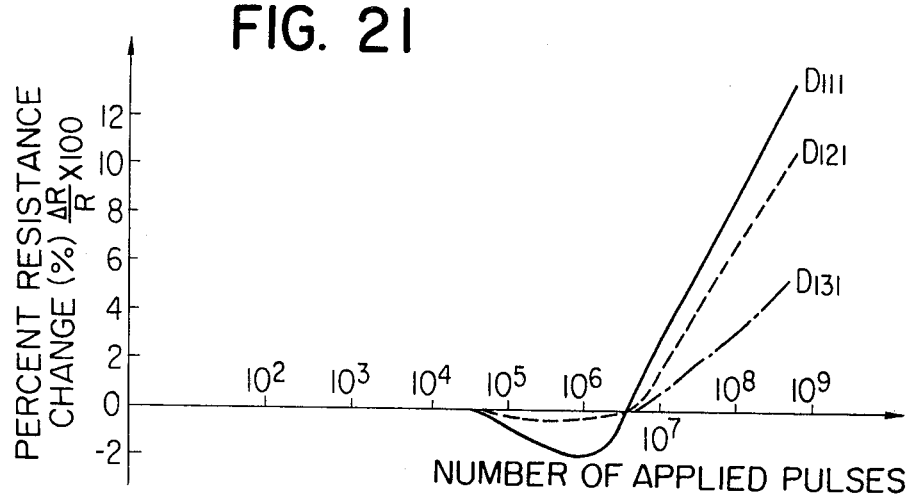
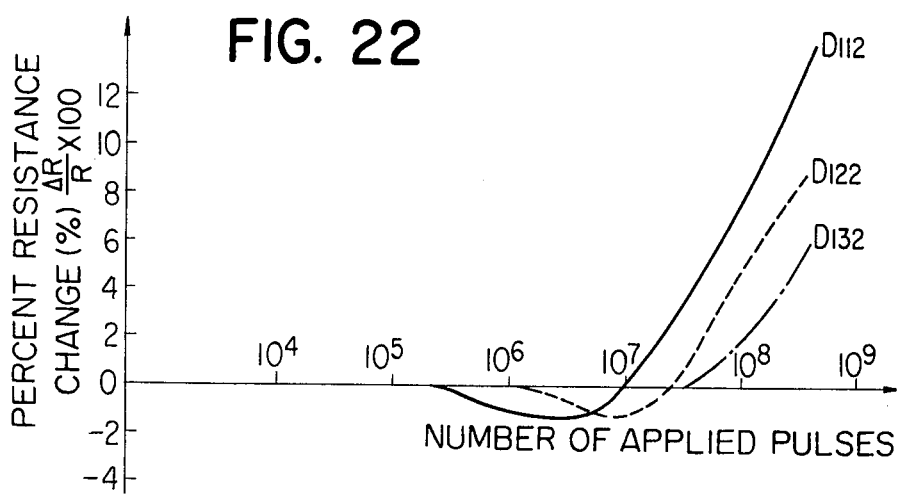
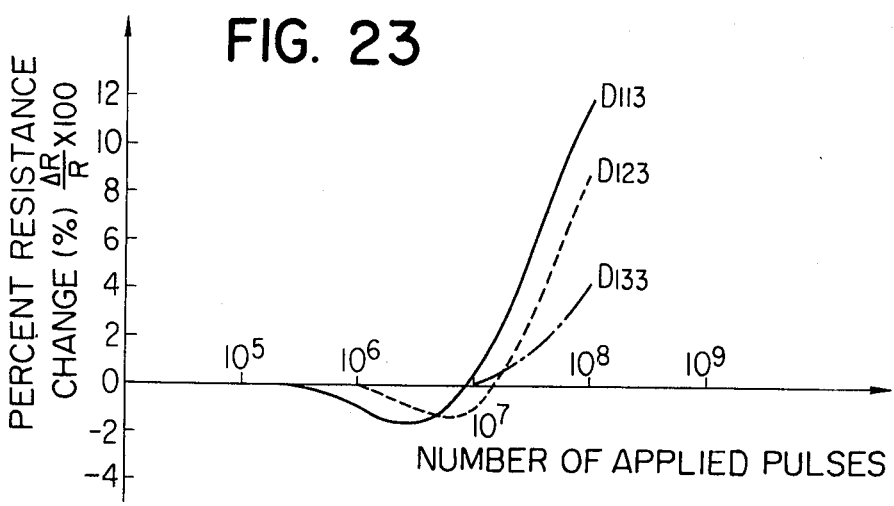

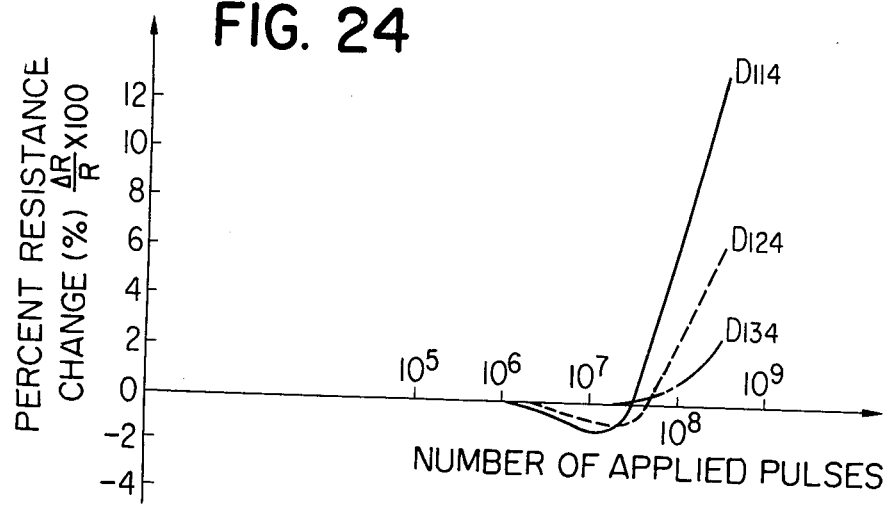
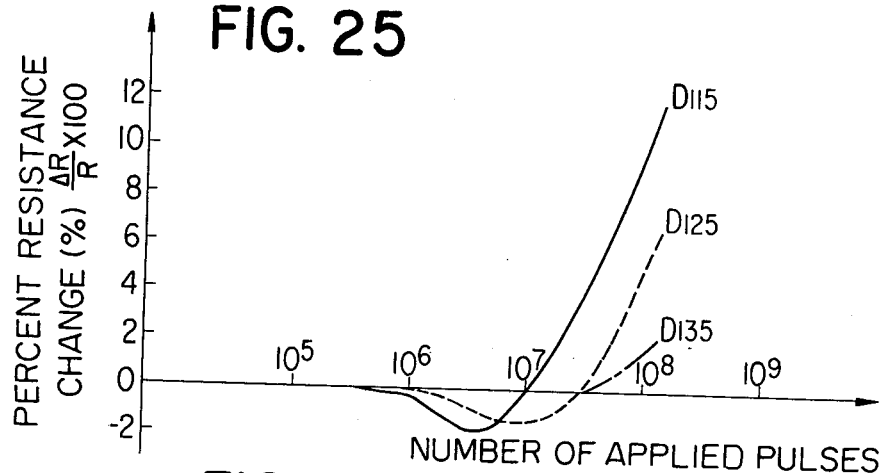
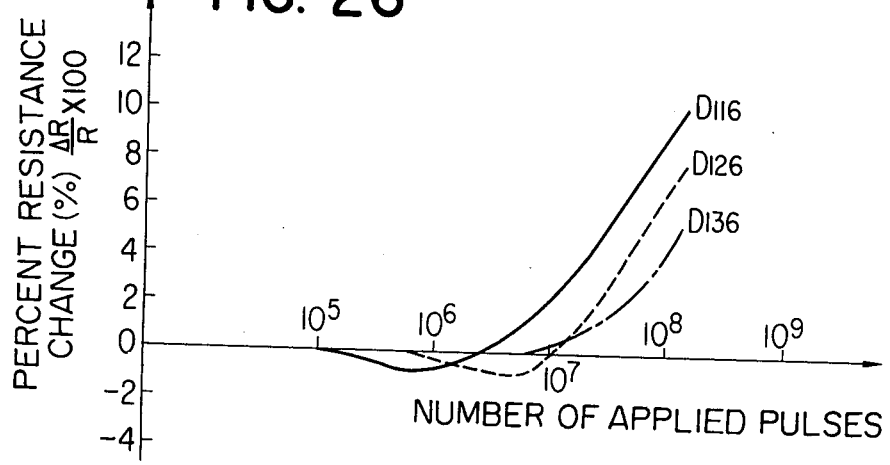

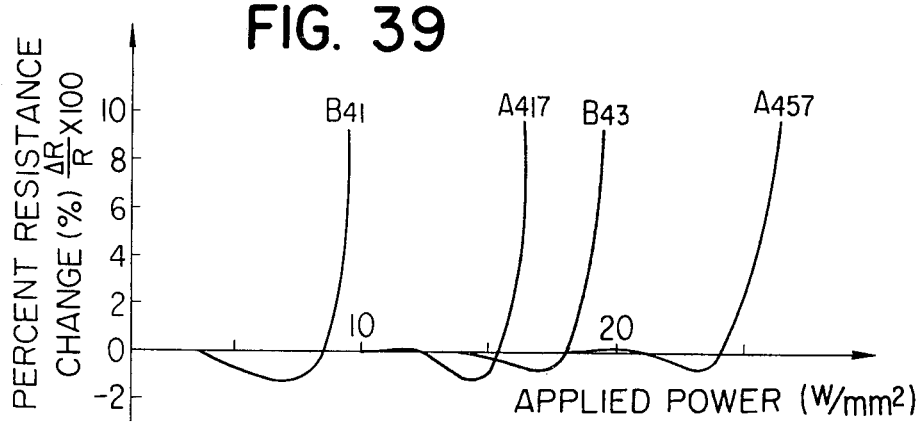
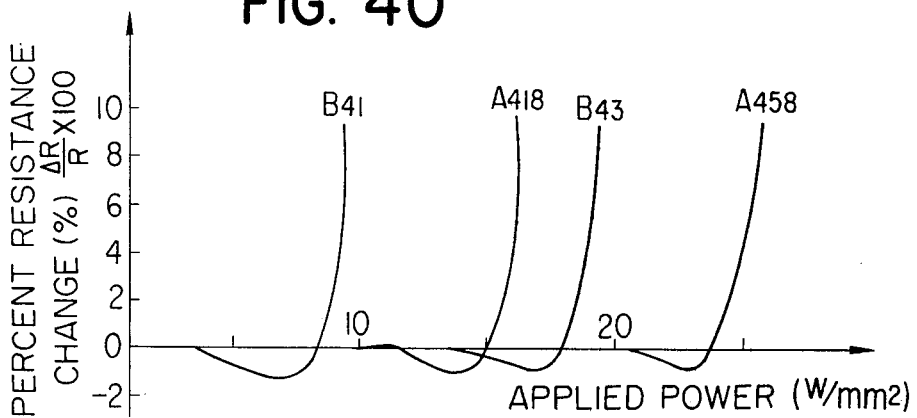
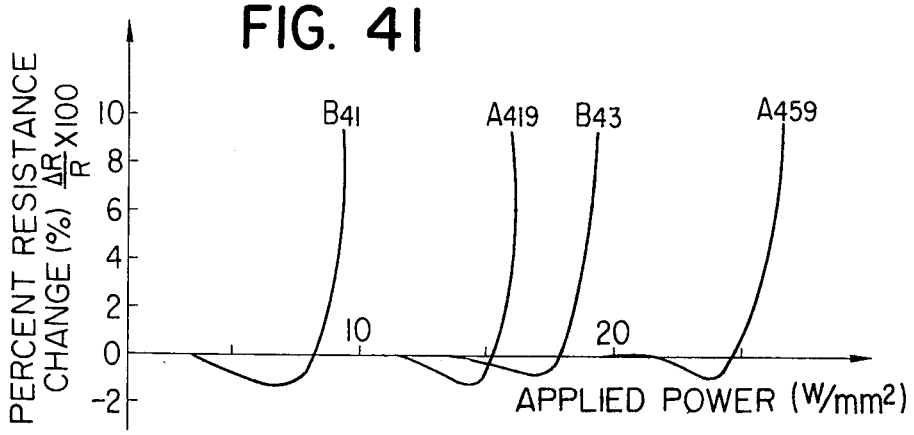

THERMAL HEAD

BACKGROUND OF THE INVENTION a. Field of the Invention

This invention relates to a thermal head having resistive heater elements composed of a metal boride as the principal constituent, and to a method for producing the same.

b. Description of the Prior Art

A thermal head for use in thermal print-recording is so constructed that a plurality of resistive heater elements and electrically conductive bodies to supply electric power to these resistive heater elements are provided on a substrate, or base plate, such as glass having the electric insulating property and a flat and smooth surface.

This type of thermal head is operated in such a manner that, in order to obtain a required heat pattern in accordance with information to be recorded, electric current is caused to flow through the resistive heater elements via corresponding electrically conductive bodies to thereby generate heat, and that the thus heat-generated head is contacted to a recording medium to effect recording of the information.

For the resistive heater element to be used in the thermal head, there have heretofore been known a thin film resistive heater element made of tantalum nitride, nickel-chromium alloy, etc., a thick film resistive heater element using silver-palladium alloy, etc., and a semiconductor resistive heater element using a silicon semiconductor. Of these, the thin film resistive heater element possesses such characteristics that it has higher heat-response, is more excellent in the heat-resistance and thermal shock resistance, and has a longer service life and higher reliability than those of the thick film resistive heater element and the semiconductor resistive heater element.

For this thin film resistive heater element, tantalum nitride has been particularly used heretofore, since the compound has a relatively high heat-resistant property, high reliability, and a comparatively high resistivity of 250 to 300 $\mu\Omega cm$, providing satisfactory controlling capability in its fabrication. This resistive heater element made of tantalum nitride is disclosed, for example, in U.S. Pat. No. 3,973,106.

However, tantalum nitride has such disadvantages that it is rapidly oxidized at a high temperature of approximately 300° C. and above to abruptly increase its resistance value, the increase of which deteriorates density in printing when the output informations are printed on a recording paper. In order to avoid such disadvantages, it has so far been a general practice in the manufacture of the thermal head using the tantalum nitride resistive heater element to provide an oxidation-resistant protective layer of silicon oxide ($SiO_2$) on the tantalum nitride resistive heater element and to provide over this protective layer a wear-resistant layer of tantalum oxide ($Ta_2O_5$). This combined protective layer of silicon oxide and tantalum oxide is disclosed in U.S. Pat. No. 3,931,492. Even with the thermal head utilizing this protective layer and the abovementioned tantalum nitride resistive heater element in combination, variations in resistance of such thermal head, when it is driven for a long period of time, is small and still unsatisfactory. In view of recent trend of increasing demand to thermal head for high speed recording, it is necessary for a narrow the pulse width for electric conduction through the thermal head so as to form color on heat-sensitive paper. In this consequence, the power consumption will increase more than ever, and the resistive heater element will increase its temperature to a higher level with the consequence that the thermal head shortens its service life. On account of this, there has been a demand for the resistive heater element having much higher heat resistance. The sheet resistance of tantalum nitride is usually 50 ohm/□ or so, and, even when the area is particularly enlarged for the thermal head, it is 100 ohm/□ or so. In order to further increase the resistance value, there are employed various expedients such as trimming, thinning of the film thickness, and so forth, although disadvantages such as complexity in its manufacturing processes, mal-effect to the service life, and so on would inevitably arise. Thus, with the thin film resistive heater element of tantalum nitride, it is not possible to take a large sheet resistance with the consequence that current flow should inevitably increase to feed the electric power necessary for heating the element, hence the resistance value of the electrically conductive body to be used for the electrode and circuit wiring becomes a problem. In other words, since the resistance value of the electrically conductive body with respect to the resistance value of the thin film resistive heater element becomes innegligible, quantity of heat-generation in each resistive heater element becomes different depending on the difference in the distance of each electrically conductive body connected to the resistive heater element, whereby there occurs a difference in density of the recorded pattern, and the quality of the recorded information becomes poor. When the size of the thin film resistive heater element is reduced to further increase the recording density, the power consumption in the electrically conductive body becomes a problem, since the resistance value of the electrically conductive body alone increases, while the sheet resistance of the thin film resistive heater element remains constant. On the other hand, when thickness of the electrically conductive body is extremely increased to avoid such problem of power consumption, the surface irregularity of the electrically conductive body becomes prohibitive at the time of multi-layer wiring to bring about serious structural inconveniences such as decreased durability against wear and tear of the conductive body. Furthermore, large current flow would inevitably lead to increased capacity of the heating power source, switching circuit, and so forth.

The substrate constituting the conventional thermal head still has a room for further improvement in that its heat responsive characteristic should be improved for increasing its recording speed. In more detail, temperature of the heat-generating section in the thermal head generally varies as shown in FIG. 1. In the graphical representation shown in FIG. 1, $t_1$ denotes a time, during which electrical pulses are applied to the heat generating section, and $t_2$ indicates a time, during which the thermal head returns to its initial temperature starting from the time instant when application of the electrical pulses is interrupted.

In order to increase the thermal recording speed, it is effective to shorten the time $t_2$ so that subsequent input of the electrical pulses may be done quickly. If the subsequent pulses are applied to the heat-generating section of the thermal head, while its state of cooling is incomplete, and the pulse application is repeated sequentially, the thermal head is brought to a temperature higher than a color-forming limit temperature $T_1$ as shown in FIG. 2 due to heat accumulating effect with the result that unnecessary recording is effected.

The substrate for the thermal head is desired to have the following properties.

(1) The surface thereof should be perfectly flat and smooth.

(2) The substrate should be able to efficiently transfer heat generated in the resistive heater element to heat-sensitive paper, and be small in its temperature increase due to heat accumulation.

(3) The substrate should be free from warping and twisting, and have satisfactory flatness (so that the photoetching technique may be applied thereto when fabricating delicate patterns on it such as the resistive heater element, electrodes, and so on).

(4) The substrate should be less in alkali ions which are liable to cause deterioration of the resistive heater element.

To meet these various conditions as mentioned above, glazed ceramics which consists of alumina ceramics coated thereon with a glass layer has generally been used very much.

Further, the glass layer for this glazed ceramics is required to have the following properties.

(1) It should have a thermal expansion coefficient similar to that of alumina (to maintain the required flatness).

(2) It should have good adhesion to alumina.

(3) It should be able to produce a flat and smooth glazed surface.

At the present stage, the glazed layer of the glazed ceramics having a high softening temperature to satisfy these various conditions is difficult to obtain, hence its maximum operating temperature is limited.

On the other hand, in view of increasing demand to the high speed thermal recording operation, the resistive heater element for the thermal head is required to have more durability against high temperature than ever.

As the results of various studies and experiments, therefore, it has been found out that, for improving durability of the thermal head at a high temperature, the substrate, on which the resistive heater element is to be formed, should be improved along with improvement in the resistive heater element per se.

Furthermore, for the electrically conductive body to be provided on the thermal head, there have been used various electrically conductive material such as gold, silver, copper, aluminum, etc. and their alloys having a low resistivity with respect to a certain definite film thickness, and being stable both chemically and thermally. Of these electrically conductive bodies, copper, aluminum, and their alloys have generally strong bonding force to the substrate. However, silver and gold have poor bonding force and therefore, in order to improve their adhesivity to the substrate, it has so far been the practice to coat a thin film of chromium or nickel-chromium alloy on the substrate as the priming layer, although even such priming layer has been found not sufficiently effective to the resistive heater element composed of the metal boride as the principal constituent.

SUMMARY OF THE INVENTION

According to the present invention, there is provided a thermal head comprising a substrate, a resistive heater element overlying the substrate, and electrically conductive members for supplying the resistive heater element with electric power in which the resistive heater element comprises a metal boride.

The primary object of the present invention is to provide a thermal head which is capable of setting resistivity of the resistive heater element at a high value, and has a wide setting range for the resistivity.

Another object of the present invention is to provide the thermal head for high speed printing which has a good heat resistant property, and is capable of applying large electric power within a short pulse width.

Still another object of the present invention is to provide the thermal head of prolonged service life, in which the thin film constituting the thermal head possesses various excellent properties such as adhesivity, acid-resistance, wear-resistance, economical stability, and responsive characteristic to the repeatedly applied pulses.

Another object of the present invention is to provide the thermal head which produces a recorded image having satisfactory image contrast, being free from any irregularity, and having excellent image resolution.

Still another object of the present invention is to provide the thermal head which can be manufactured with the least number of the manufacturing process steps and in various manufacturing methods, and is easy to control the resistance values of the thin film resistive heater element.

The foregoing objects, other objects as well as specific construction and functions of the present invention will become more apparent from the following detailed explanations, when read in conjunction with the accompanying drawing.

BRIEF DESCRIPTION OF THE DRAWINGS

FIGS. 4 to 14, FIGS. 16 to 42, FIG. 44 and FIG. 48 are respectively graphical representations showing characteristics of the thermal head according to the present invention;

DESCRIPTION OF THE PREFERRED EMBODIMENTS

The characteristic feature of the present invention resides in a thermal head having a substrate, a resistive heater element formed on the substrate, and electrically conductive members to supply electric power to the resistive heater element, each of the resistive heater element being composed of metal boride as the principal constituent thereof. The other components than the metal boride are oxygen, other metals and semi-metals, and the like.

Figure 1:
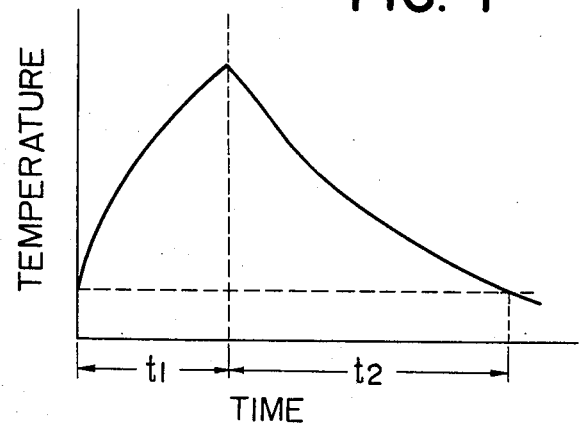
FIG. 1 is a graphical representation showing a relationship between temperature and time when heating and cooling the resistive heater element for the thermal head.
Figure 2:
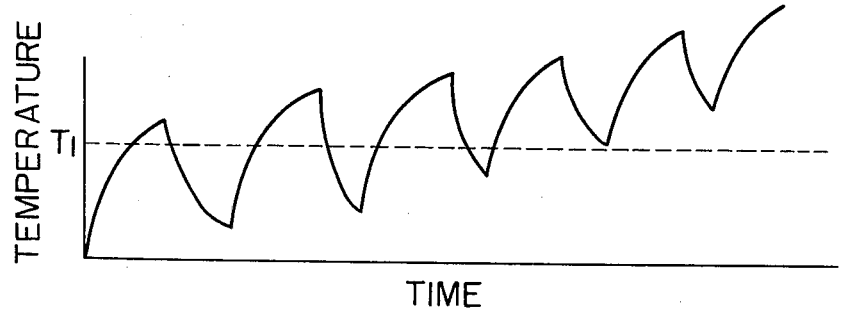
FIG. 2 is also a graphical representation showing a relationship between temperature and time of the resistive heater element when it is heated in a state of insufficient cooling, and such heating is done repeatedly.
Figure 3:
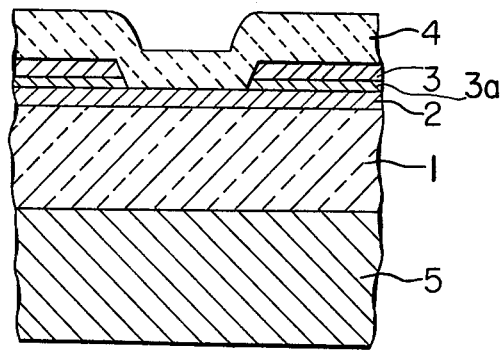
FIG. 3 and FIG. 45 are respectively enlarged cross-sectional views showing configurations of the main part of the thermal head for use in the present invention.

FIG. 3 is an enlarged cross-sectional view of the configuration of the main part of the thermal head to be applied to the present invention. In the drawing, a reference numeral 1 designates a substrate made of an electrically insulative material such as ceramics, glass, or glazed ceramics. 2 refers to a thin film resistive heater element composed of metal boride as the principal constituent. 3 denotes an electrically conductive member such as aluminum, gold, etc. to supply electric power to the thin film resistive heater element 3a denotes an optional priming layer. A numeral 4 refers to a protective layer for the thin film resistive heater element and the electrically conductive member. This protective layer is composed of a single layer of silicon oxide, magnesium oxide, aluminum oxide, tantalum oxide, zirconium oxide, or a multi-layer formed by combination of these single layers, such protective layer being coated by electron beam deposition, sputtering, and so on. Such protective film contributes to prolong the life of the thermal head. 5 denotes a heat discharging plate composed of aluminum and like other metals for quickly cooling the head part after the printing operation. This plate is also used for supporting the above-mentioned substrate 1.

The metal boride useful for the purpose of the present invention is selected from those borides of hafnium, zirconium, lanthanum, titanium, tantalum, tungsten, molybdenum, niobium, chromium, vanadium, and so forth. These metal borides can be used singly or in combination of more than two kinds. It has been found out that, of these metal borides, hafnium boride is particularly excellent in its characteristic, followed by zirconium boride, lanthanum boride, tantalum boride, vanadium boride, and niobium boride in the order as mentioned.

For the manufacture of the thin film resistive heater element made of metal boride, any of the electron beam deposition, sputtering can be utilized. With the electron beam deposition, powder of metal boride is pressed under a pressure of 100 kg/cm$^2$ and above to form a tablet, and then this tablet of metal boride is placed in a high vacuum of $1 \times 10^{-4}$ Torr to evaporatively deposit the compound on the substrate which has been maintained at a certain definite temperature beforehand. On the other hand, when the sputtering method is used for fabrication of the thin film resistive heater element, there are three ways of (1) using the metal boride as a target; (2) using boron and single body of metal as the simultaneous target; and (3) using the single body of the metal alone as the target to effect the reactive sputtering. In the case of using the metal boride as the target, the compound may be placed on, for example, a quartz dish, etc., in powder form or in a pressed form, although, from the standpoint of easy control of the sputtering operation, the compound may be previously sintered by a vacuum hot press at 1,100° C. and above, and be used as the target. In the case of using boron and a single body of metal as the simultaneous target, boron and metal in powder form may be mixed with each other, or any one of them may be embedded into the other or placed on one surface portion of the other. In either case, the sputtering should preferably be done in an argon atmosphere of $1 \times 10^{-3}$ Torr to $5 \times 10^{-1}$ Torr, or more preferably, $1 \times 10^{-2}$ Torr to $1 \times 10^{-1}$ Torr. When the reactive sputtering is to be conducted, it should preferably be done in a mixed gas atmosphere of argon and diborane with the single body of metal in the form of plate, etc. as the target. The gas pressure for this sputtering operation should preferably range, in terms of the total gas pressure of argon and diborande, from $1 \times 10^{-2}$ Torr to $5 \times 10^{-1}$ Torr, or more preferably, from $1 \times 10^{-2}$ Torr to $5 \times 10^{31\ 2}$ Torr, the pressure of diborane ranging from 1 to 10%, or preferably, from 2 to 6% of the total gas pressure.

During the sputtering or electron beam deposition when the substrate is heated to a temperature in the range of from 100° to 600° C., or preferably, from 200° to 500° C., the adhesivity of metal boride to the substrate remarkably improves, which is also effective in stabilizing the deposited film. Furthermore, after completion of the sputtering or electron beam deposition, when the combination of the substrate and the coated film is subjected to heat-treatment in the vacuum, or in the atmosphere, or in a gas atmosphere such as argon, etc. at a temperature range of from 200° to 650° C., the resistive heater element can be controlled to a required resistance value, and, moreover, its stability increases when it is used as the thermal head, hence remarkable effect of prolonged service life would result. A temperature of 200° C. or below for the heat-treatment requires a long period of time, since variation in the resistance value is very small. On the other hand, when the temperature is 650° C. or higher, there arises restrictions in use or difficulty in control such that variations in the resistance value takes place abruptly, or the substrate of glass or the like is hardly durable in practical use, and so on. Therefore, a preferable range of the heat-treatment temperature is from 200° to 650° C.

The same methods as mentioned in the foregoing may be applied when the thin film resistive heater element consisting of metal boride and oxygen is to be manufactured. That is, in the case of the electron beam deposition, a gas containing oxygen is introduced during the electron beam deposition through a needle valve, etc., whereby the oxygen content in the resistive heater element can be controlled to 0.005–1.0 (atomic ratio) with respect to the metal. In the case of the sputtering and reactive sputtering methods, oxygen is mixed in the atmosphere. In this case, by selecting a partial pressure of oxygen in the atmosphere in a range of from 0.1 to 10%, the atomic ratio of oxygen in the resistive heater element can be made 0.005 and higher with respect to the metal. When the oxygen content is very small, there accrues no expected effect, and when it is too large, control of the resistivity becomes difficult and the heat-resistant property of the resistive heater element deteriorates, hence a range of 0.01 to 1.0 (atomic ratio) with respect to the metal is appropriate, or a more preferable range is from 0.05 to 0.6, or the optimum range is from 0.1 to 0.3. The thin film resistive heater element thus obtained contains therein both metal boride and oxygen in an atomic scale with additional contents of carbon and nitrogen as impurities.

The thermal head having the resistive heater element consisting of metal boride or a combination of metal boride and oxygen is difficult to be oxidized, hence stable, and is sufficiently useful for power supply of 25 W/mm$^2$ at the maximum, in contrast to the maximum usable power limit (50 Hz, pulse width of 6 ms) of the conventional thermal head using the tantalum nitride resistive heater element and two-layered protective coating having beam 17 to 18 W/mm$^2$. Such increased power limitation enables the thermal head to be suited for high speed printing where a high temperature is generated by application of a large electric power to the resistive heater element within a short pulse width. This increase in the maximum power supply signifies that, in the case of a constant power driving, deterioration in the element accompanied by the exothermic phenomenon can be lessened. The power supply at the time of transfer of heat energy to the heat-sensitive recording paper usually depends upon a contact pressure between the thermal head and the recording paper. In general, however, it is sufficient for approximately 11 to 14 W/mm$^2$ (at 50 Hz and pulse width of 6 ms). Accordingly, in the case of the conventional tantalum nitride resistive heater element, the oxidation-preventing protective coating is essential, while, in the case of the resistive heater element according to the present invention, the thermal head is sufficiently durable in the practical use even in the absence of the oxidation-preventing protective coating, and its life can further be prolonged in the presence of such protective coating.

Furthermore, resistivity of the resistive heater element of the thermal head according to the present invention can be selected from a wide range of from 70 $\mu\Omega$cm to 5,000 $\mu\Omega$cm, so that, when it is set at a high resistance value, the current for the heat generation can be small in quantity, and variations in the heat generating quantity of the resistive heater element due to influence of resistance at the electrode section can be neglected. As the result, the electrode can be manufactured in a thin thickness, hence the manufacturing steps become simple, the surface irregularity becomes less, and the head becomes durable against wear.

Further, it is possible to include other metals and semi-metals in the thin film resistive heater element, as additives. For the semi-metals to be added, there are silicon, germanium, etc.. For the other metals to be added, there are the Group IV-b metals of the Periodic Table such as titanium, zirconium, and hafnium; the Group V-b metals such as vanadium, niobium, and tantalum; the Group VI-b metals such as chromium, molybdenum, and tungsten; the Group I-b metals such as copper, silver, and gold; the lanthanum series elements such as lanthanum, gallium, samarium, etc., or manganese, iron, cobalt, nickel, platinum, rhodium, palladium, osmium, iridium, and ruthenium, etc..

One or more kinds of these metals or semi-metals are selected, and combined with the abovementioned metal boride to constitute the resistive heater element. The metal boride and the metal, or the semi-metal constituting the resistive heater element are present in mixture in an atomic scale.

Appropriate adding quantity of the metal or semi-metal in the resistive heater element is from 0.5 mol% to 50 mol%. The content of the metal or the semi-metal in this quantity contributes to increase in the stability of the resistive heater element, thereby producing the element having good adhesive property with the substrate, the electrically conductive body, and the protective layer.

When the additives are contained in the resistive heater element as mentioned above, they may be mixed in the target for the sputtering operation. That is to say, there are such ways that (1) mixed powder of metal boride and the additive metal or semi-metal is sputtered, or (2) metal boride target covered with the additive metal or semi-metal over a required area is sputtered. In the case of the electron beam deposition, the additives are mixed in the tablet to be evaporatively deposited simultaneously. It is also feasible that two or more of the evaporating sources are provided by combination of the electron beam method, or by combination of the electron beam method and the resistive heating sputtering method, thereby controlling the deposition speed of metal boride and the additive metal or semi-metal, and fabricating the deposite of a predetermined ratio.

One of the characteristics of the present invention resides in that the heat response of the thermal head can be improved by limiting thickness of the glazed ceramics to be used as the substrate for the thermal head to a range of from 0.5 to 0.2 mm, or more preferably from 0.4 to 0.2 mm. For the ceramics to be used in the present invention, there may be used a sintered body of various oxides such as alumina, beryllia, magnesia, etc. as the principal constituent.

In so constructing the thermal head, there can be realized improvement in the cooling speed of the thermal head during the recession period of the power pulse to be imparted. As the consequence, an interval between the first pulse and the second pulse can be shortened, whereby the printing speed can be increased by about 13 to 125%. This improved speed increase in the printing operation is assumed to be that, when heat generated in the resistive heater element is discharged to aluminum as the heat-discharging plate through the glazed alumina plate, the heat conductivity (K) of the alumina plate is 0.210 J/cm S°K, while that of the aluminum plate is 2.38 J/cm S°K, a difference of one place, hence the thin alumina plate transfers more heat to the aluminum plate. A thickness of less than 0.2 mm of the alumina plate is not proper, since there takes place a problem of breakage of the plate during handling. Accordingly, the effective thickness range of the alumina plate according to the present invention is from 0.5 to 0.2 mm, or more preferably from 0.4 to 0.2 mm.

Incidentally, flatness of the glazed substrate according to the present invention, which is required for the pattern baking process of a photoresist in the case of fabricating an element, can be easily obtained by effecting vacuum-chucking of the same to the substrate holder of an aligner on account of its flexibility to be obtained as the result of thinning the alumina substrate. It has accordingly been found out that the substrate according to the present invention can be advantageously obtained with reduced amount of work and cost in comparison with the conventional substrate, the flatness of which has been obtained by abrasion, etc..

Another characteristic of the present invention is to provide a useful thermal head capable of effecting high speed thermal recording and which is durable against high operating temperature by interposing a glass layer of low alkali content and good heat-resistant property between the glazed layer of the glazed ceramics substrate and the resistive heater element of the thermal head to thereby improve a disadvantage of low maximum operating temperature of the glazed ceramics without impairing its favorable characteristics.

When this glass layer of low alkali content is composed of $K_2O+Na_2O \leqq 1.0$ wt.% and its softening point is 745° C. and above, its heat-resistant property and stability are favorable. When thickness of the above-mentioned glass layer is too thin, it is liable to be affected by the substrate. On the other hand, when it is too thick, heat accumulation takes place in the glass layer which is not favorable to the high speed recording. Accordingly, preferable thickness of this glass layer ranges from 0.2 to 50 microns, or more preferably from 1 to 10 microns.

The glass layer forming means according to the present invention may be selected from the high speed sputtering, the ion-plating, the electron beam deposition, the CVD, and so forth. Any of these methods can provide sufficient adhesion between the glass layer and the glazed layer.

As stated in the foregoing, the glazed ceramics substrate for the thermal head, on which glass of low alkali content and high softening point has been adhered, is able to improve the disadvantage of low maximum operating temperature thereof without impairing the characteristics of the excellent flatness, smoothness, and heat-resistance of the glazed ceramics, so that it is very useful for realizing the desired high speed thermal recording.

It should also be noted that the present invention can be used as the substrate for a thick film thermal head, a hybrid integrated circuit, and so on.

Still another characteristic of the present invention is that quartz ($SiO_2$) is interposed between the glass layer and the resistive heater element on the glazed ceramics substrate to improve a disadvantage of low heat resistant property of the glass layer without impairing the characteristics of the glazed ceramics, thereby providing useful thermal head which is durable against high temperature operation and capable of effecting the high speed thermal recording. If this quartz layer is too thin, it is liable to be affected by the substrate to bring about less effect. On the other hand, thickening of this layer would lead to an increased manufacturing cost, and, moreover, heat accumulation occurs in the thermal head to make it unfavorable to conduct high speed recording. Accordingly, a preferable range of thickness of the quartz layer is from 0.2 to 50 μm, or more preferably from 0.5 to 10 μm.

Forming of the quartz layer can be done by any methods such as evaporative deposition like high speed sputtering, electron beam deposition, ion-plating, etc., or chemical methods like CVD, etc..

As mentioned above, coating of a thin quartz film on the glazed ceramics substrate contributes to improve the disadvantage of low maximum operating temperature of the thermal head without impairing the advantages of surface flatness, heat transfer property, etc. of the glazed ceramics, hence the present invention is highly useful in realizing the speed increase in the thermal recording device.

The substrate according to the present invention can also be used for a thick film thermal head, a hybrid integrated circuit, and so on.

Further characteristic of the present invention is that the melting point of the glazed layer coated on the glazed ceramics substrate to be used as the thermal head is elevated, thereby providing the thermal head excellent in durability at a high temperature in comparison with the conventional thermal head. In other words, the present invention provides the thermal head having the substrate coated thereon with a glass layer of low alkali content or a quartz layer as the material of good heat conductivity.

The present invention coats on the substrate a composition containing therein $K_2O+Na_2O \leqq 1.0$ wt.% and having a softening temperature of 745° C. and higher, as the above-mentioned glass layer. When this glass or quartz coating layer is too thick, there occurs heat accumulation in the thermal head to unfavorably affect the high speed recording, and when it is too thin, the power consumption should be set at a high level on account of heat loss due to heat transfer to the substrate side, as the result of which load on the resistive heater element becomes large and the life of the thermal head becomes shortened. Accordingly, thickess of the layer should be in a range of from 1 to 90 microns, or more preferably from 5 to 60 microns. In this thickness range, the thin portion of the layer is suitable for high speed printing operation in the serial printer, etc., while the thick portion thereof is suitable for driving the facsimile, etc. with the matrix wiring.

Forming of these coating layers can be done by sputtering, ion-plating, electron beam deposition, etc..

For the substance having good heat conductivity and suitable as the substrate in the present invention, there can be used a sintered body principally consisting of oxides such as alumina, beryllia, magnesia, and so forth, or a metal plate such as aluminum.

Still further characteristic of the present invention is that the priming layer consisting principally of titanium or vanadium is provided between the resistive heater element mainly consisting of metal boride and the electrically conductive body for power supply.

When the titanium layer, the layer of an alloy principally consisting of titanium, the vanadium layer, and the layer of an alloy principally consisting of vanadium are too thin in their thickness, the adhesive effect of the layers to the resistive heater element and the electrically conductive body is not sufficient. On the other hand, when they are too thick, the adhesive effect thereof is saturated. Therefore, a preferred range of thickness of these layers should be from 5 to 1,000 angstroms, or more preferably from 10 to 500 angstroms, or the most preferably from 20 to 300 angstroms. Here, those metals which produce alloys with titanium or vanadium may be selected from aluminum, copper, gold, silver, zirconium, hafnium, niobium, titanium, vanadium, tantalum, chromium, molybdenum, tungsten, lanthanum, etc.. These priming layers can be produced by the resistive heating sputtering, electron beam deposition, sputtering, and so forth.

Of the protective films applicable to the thermal head according to the present invention, the thin film of silicon oxide is manufactured by the electron beam deposition or the sputtering. When the thickness of this protective coating is too thin, no effect of acid-resistance comes out, and when it is too thick, the effect becomes saturated. Therefore, a preferred range of thickness of this protective coating is from 2,000 angstroms to 5 μm, or more preferably from 5,000 angstroms to 3 μm. On the other hand, thin films of aluminum oxide, tantalum oxide, magnesium oxide, and zirconium oxide are manufactured by the electron beam deposition or the sputtering. When the thickness of this protective coating is too thin, the effects of wear-resistance and oxidation-resistance become reduced, and when it is too thick, the effect of color-forming of the heat recording medium (recording paper) deteriorates. In view of this, a preferred range of this thin film may be from 1 μm to 20 μm, or more preferably from 3 μm to 10 μm.

In so constructing the resistive heater element, the acid-resistance, wear-resistance of the thermal head improves remarkably, whereby the high speed recording and prolongation of the service life of the heat can be realized.

EXAMPLE 1

This example shows a thermal head having a resistive heater element of zirconium boride produced by sputtering and a protectively layer produced by electron beam deposition.

A target of $ZrB_2$ of 5 in.dia. produced by hot pressing at 1100° C. was used, and a glazed alumina substrate having a glass thickness of 50 μm was heated to 300° C., and then sputtering was effected under argon pressure of $3 \times 10^{-2}$ Torr by R.F. sputtering.

The sputtering rate was 200 Å/min. supplied power was 3.0 W/cm$^2$ and the sputtering was effected for 3 min. to produce a thin film resistive heater element having a thickness of 600 Å and a sheet resistance of 100 ohm/□. The resistivity was μohm.cm. Then, electron beam deposition was effected to deposit 100 Å of titanium and 1 μm of gold thereon. The resulting thermal head, $A_{110}$, had a resolving power of 4 lines/mm. of selected etching.

As a protective coating, $Ta_2O_5$, $Al_2O_3$ and MgO were deposited thereon by electron beam deposition at a substrate temperature of 300° C. to form 6μ, 8μ and 5μ thick protecting coatings, respectively, and these are hereinafter referred to as $A_{130}$, $A_{120}$, and $A_{140}$, respectively. For comparison, tantalum was used as a target and a reactive sputtering by R.F. sputtering was effected under a total pressure of argon and nitrogen of $3 \times 10^{-2}$ Torr and nitrogen pressure of $1 \times 10^{-4}$ Torr to produce a thermal head ($B_{110}$) having a resistive heater element of tantalum nitride of 600 Å thick. As a protective coating, silicon oxide ($SiO_2$) 1 μm and tantalum oxide ($Ta_2O_5$) 10 μm were formed by sputtering.

Figure 4:
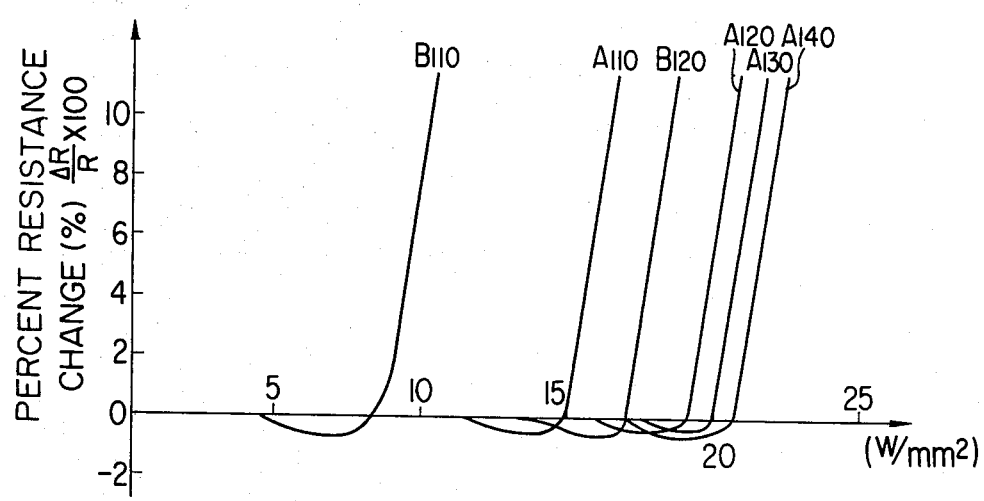

A step stress testing was conducted with respect to the thermal head thus produced by applying pulse of 6 m sec at 50 Hz to the thermal head with power-up of 1 W/mm$^2$ every 30 minutes to measure the percent resistance change. The result is shown in FIG. 4, where $A_{110}$ denotes a thermal head of zirconium boride produced by sputtering according to the present invention and having no protective coating; $A_{120}$ denotes that having a protective coating of aluminum oxide, $A_{130}$ denotes that having a protective coating of tantalum oxide, and $A_{140}$ denotes that having a protective coating of magnesium oxide. For comparison, a thermal head comprising tantalum nitride without a protective coating ($B_{110}$) and that having a silicon oxide layer of 1 μm thick and a tantalum oxide layer of 10 μm thick ($B_{120}$) were used. R denotes a resistivity before the test and ΔR denotes the difference of resistivity after the test. It has been found that a thermal head comprising a zirconium boride thin film resistive heater element produced by sputtering shows only a low resistance change at a high temperature, i.e. when high power is supplied.

EXAMPLE 2

This example is concerned with thermal heads having a hafnium boride resistive heater element prepared by sputtering and various protective coatings prepared by electron beam deposition.

A resistive heater element of 1000 Å thick was formed on a sufficiently washed glazed ceramics substrate by using a hafnium boride $HfB_2$ (99% purity, supplied by Ventron, U.S.A.) 1300° C. as a target under a total pressure of argon of $5 \times 10^{-2}$ Torr at a substrate heating temperature of 200° C. by R.F. sputtering. The sheet resistance was about 40 ohm/□ (resistivity being about 400 μohm.cm.). On the resulting product were deposited 10 Å thick of titanium and 1.5 μm thick of aluminum by electron beam deposition, and then selective etching gave a thermal head ($A_{111}$) having a resolving power of 4 lines/mm.

A thermal head $A_{121}$ was prepared by depositing a tantalum oxide film of 6 μm thick as a protective coating on the thermal head $A_{111}$ by electron beam deposition. A thermal head $A_{131}$ was prepared in a similar way by depositing an aluminum oxide film of 8 μm. A thermal head $A_{141}$ was prepared in a similar way by depositing a magnesium oxide film of 5 μm. A thermal head $A_{151}$ was prepared in a similar way by depositing a silicon oxide film of 1.5 μm thick and then a tantalum oxide film of 6 μm thick.

For comparison, a thermal head $B_{111}$ having a tantalum nitride resistive heater element of 1000 Å thick was produced by using tantalum as a target under a total pressure of argon and nitrogen of $3 \times 10^{-2}$ Torr and nitrogen partial pressure of $1 \times 10^{-4}$ Torr by a reactive sputtering using R.F. sputtering. The resulting thin film was analyzed by X-ray diffractiometry to find it is $TaN_2$. The sheet resistance was 24 ohm/□ (resistivity being 240 μohm.cm.). Thermal head $B_{111}$ was subjected to sputtering to form a tantalum oxide protective coating of 6 μm thick and the product is called $B_{121}$. Thermal head $B_{111}$ was subjected to sputtering to form a silicon oxide film of 1.5 μm thick and then a tantalum oxide film of 6 μm thick as a two-layered protective coating. The product is called $B_{131}$.

Figure 5:
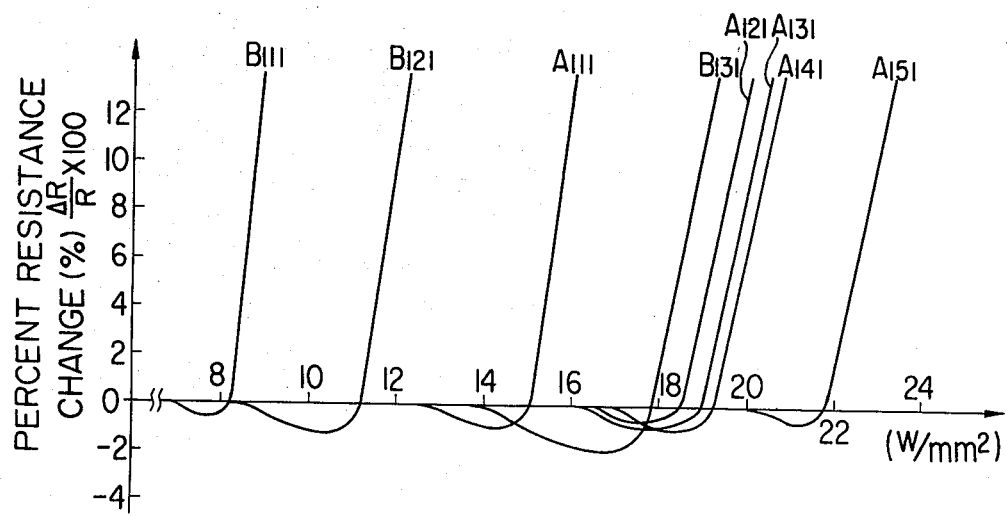

To the thermal heads thus prepared was applied a repeating voltage of 50 Hz with pulse width of 6 ms, and the supplied power was increased 1 watt/mm$^2$ every 30 minutes to conduct a step stress testing. The resulting percent resistance changes are shown in FIG. 5.

Resistive heater element $A_{111}$ can supply a power of about twice per unit area that resistive heater element $B_{111}$ can supply. Further, the protective coating serves to increase power supplied to a unit area to a great extent.

Thermal heads $A_{121}$, $A_{131}$, and $A_{141}$ having only one protective coating deposited on a hafnium boride thin film resistive heater element by electron beam deposition are better than thermal head $B_{131}$ having two-layered protective coating on a tantalum nitride thin film resistive heater element and much better than $B_{121}$ having only one protective coating.

Thermal head $A_{151}$ having a two-layered protective coating is a further improved one.

This increase in the maximum supply power means that deterioration of the resistive heater element caused by heat generation is lessened when driven by a constant power. Usually a supply power enough to transfer heat energy to a heat sensitive recording paper is about 11-14 W/mm$^2$ (at 50 Hz with a pulse width 6 ms) though it depends on the contact pressure and therefore, when a tantalum nitride thin film resistive heater element is used, a two-layered protective coating (a combination of silicon oxide layer and tantalum oxide layer) is necessary, while, in case of a hafnium boride thin film resistive heater, one layer protecting coating such as tantalum oxide, aluminum oxide, and magnesium oxide, was enough to print. When a two-layered protecting layer was used, the life was further prolonged.

EXAMPLE 3

In this example, hafnium boride in Example 2 was replaced by each of the various metal borides. The conditions are shown in Table 1 (located after Example 28) and the results of measurement are shown in FIG. 6 - FIG. 14.

EXAMPLE 4

This example is concerned with thermal heads having a zirconium boride resistive heater element and a protective coating produced by sputtering.

On a thermal head $A_{111}$ as prepared in Example 1 was formed a protective coating composed of tantalum oxide of 6 $\mu$m thick by sputtering to produce a thermal head $A_{220}$. In a similar way, a thermal head $A_{230}$ having an aluminum oxide protecting coating of 8 $\mu$m thick and a thermal head $A_{240}$ having a magnesium oxide protective coating of 5 $\mu$m thick by sputtering. These thermal heads were subjected to a step stress testing so in Example 1 to measure the percent resistance change. The limit values of power where the percent resistance change abruptly increases were 22 W/mm$^2$ for $A_{220}$, 22.5 W/mm$^2$ for $A_{230}$ and 23 W/mm$^2$ for $A_{240}$.

EXAMPLE 5

This example is concerned with thermal heads having a hafnium boride resistive heater element prepared by sputtering and a protecting coating prepared by sputtering.

To a thermal head $A_{111}$ as prepared in Example 2 was applied tantalum oxide to form a film of 6 $\mu$m thick as a protective coating by sputtering to produce a thermal head $A_{221}$. In a similar manner, a thermal head $A_{231}$ having an aluminum oxide protective coating of 8 $\mu$m thick, a thermal head $A_{241}$ having a magnesium oxide protective coating of 5 $\mu$m thick and a thermal head $A_{251}$ having a two-layered protective coating composed of a silicon oxide film of 1.5 $\mu$m thick and a tantalum oxide film of 6 $\mu$m thick, were produced by sputtering. Following the test of Example 2, percent resistance change of those thermal heads were measured. The limit values of power where the percent resistance change increases abruptly for $A_{221}$, $A_{231}$, $A_{241}$ and $A_{251}$ were 22, 23.0, 23.5 and 25.5 W/mm$^2$, respectively. This is a very good result. Protective coatings produced by sputtering were better than those produced by electron beam deposition.

EXAMPLE 6

This example is concerned with thermal heads having a resistive heater element of a metal boride produced by sputtering and a protective coating produced by sputtering.

On the thermal heads $A_{112}$-$A_{119}$ prepared according to Example 3 were formed protective coatings by sputtering to produce: thermal heads $A_{222}$-$A_{229}$ having a tantalum oxide protective coating of 6 $\mu$m thick; thermal heads $A_{232}$-$A_{239}$ having an aluminum oxide protective coating of 8 $\mu$m thick; thermal heads $A_{242}$-$A_{249}$ having a magnesium oxide protective coating of 5 $\mu$m thick; and thermal heads $A_{252}$-$A_{259}$ having a twolayered protective coating composed of a silicon oxide film of 1.5 $\mu$m thick and a tantalum oxide film of 6 $\mu$m thick. These thermal heads were subjected to the test as in Example 2 to measure the percent resistance change. Power limit values where the percent resistance change per unit area increases abruptly are listed in Table 2 (located after Example 28)

EXAMPLE 7

This example discloses substrate temperatures, heat treatment temperatures and resistivity values of thin films when a zirconium boride thin film is obtained by electron beam deposition.

In an electron beam deposition apparatus, at a high vacuum of less than $1 \times 10^{-4}$ Torr a substrate was heated to a desired temperature uniformly and then a zirconium boride sample pressed at a pressure higher than 100 Kg/mm$^2$ was melted at 2500° C. or higher and vapor-deposited on the substrate. The substrate used in the present invention was a usual glass plate, glazed ceramics (Tempax glass, supplied by Shot Co.), 25×50 mm., which was subjected to a supersonic washing in a pure water containing a small amount of a neutral detergent, then in pure water-isopropyl alcohol, dried under vacuum at about 100° C. and confirmed that no imputities were on thesurface.

Temperature of the substrate was set to a temperature between room temperature and 700° C. to effect electron beam deposition of zirconium boride.

Then the resulting zirconium boride deposited film was heat-treated at 200° C.–700° C. for 2 hours.

Figure 15:
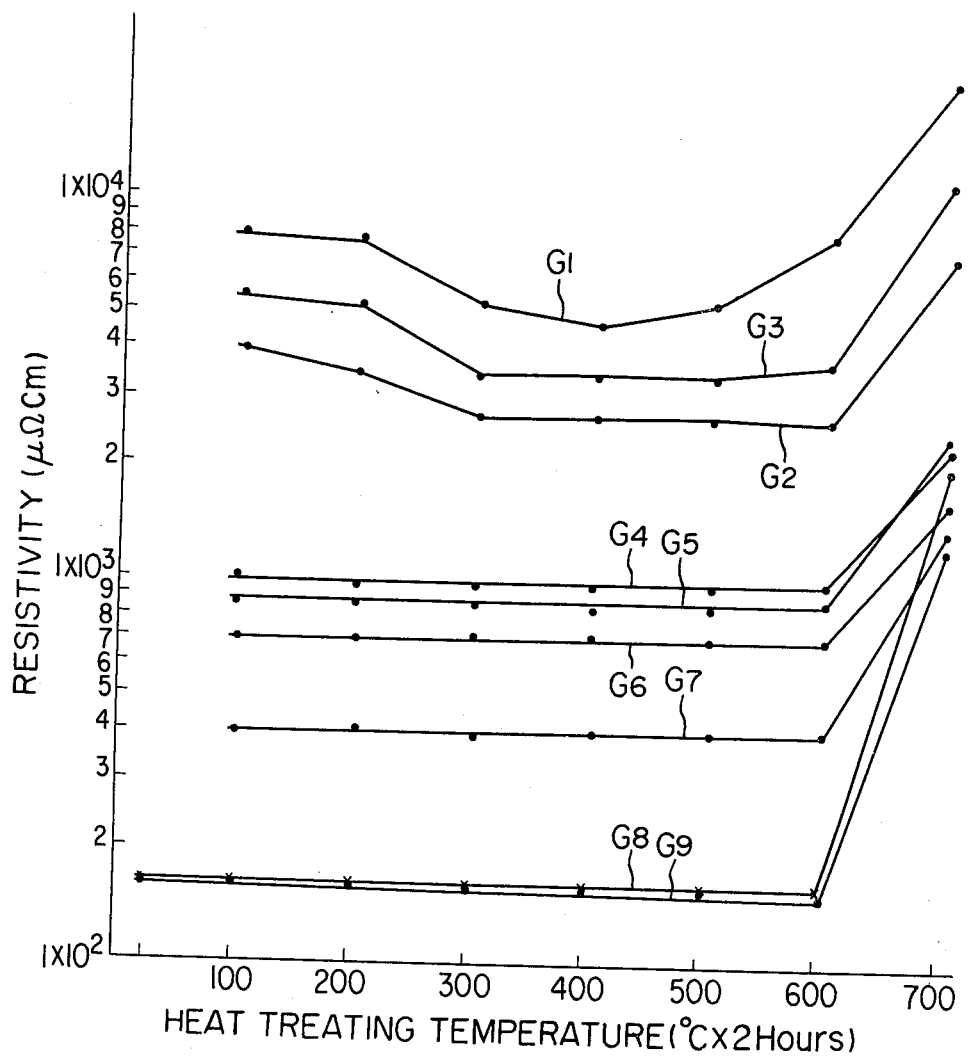
FIG. 15 is a graphical representation showing a relationship between the substrate temperature and the heat-treatment temperature at the time of forming a thin film of zirconium boride and resistivity of the thus obtained thin film.

FIG. 15 shows resistivity of the zirconium boride thin film thus produced and the substrate temperature. In FIG. 15, the abscissa represents the heat treatment temperature while the ordinate represents the resistivity of the resulting zirconium boride. Line $G_1$ represents zirconium boride thin film produced by electron beam deposition when the substrate temperature was room temperature; line $G_2$ represents the thin film produced by keeping the substrate temperature at 200° C. for 5 min. and then conducting electron beam deposition at room temperature; line $G_3$ represents the thin film produced by the deposition at a substrate temperature of 100° C.; lines $G_4$, $G_5$, $G_6$, $G_7$, $G_8$ and $G_9$ represent zirconium boride thin films produced by electron beam deposition at substrate temperatures of 200° C., 300° C., 400° C., 500° C., 600° C. and 700° C., respectively.

As is clear from FIG. 15, the resistivity can be adjusted in a wide range such as from 150 to $5 \times 10^4$ $\mu\Omega$cm by varying the substrate temperature for heat treatment. However, when the substrate temperature was room temperature, zirconium oxide was present sometimes as found by X-ray diffraction analysis, and therefore, the resistivity value was very unstable and its control was very difficult. When a substrate temperature was over 600° C., the resistivity became almost constant. Therefore, it has been found that when a substrate temperature range is selected in a range of from 100° C. to 600° C., various resistivity values can be obtained. It will be easily understood that when a substrate temperature between two lines is selected, a resistivity between two lines can be obtained. When line $G_2$ was once kept at 200° C. and then returned to room temperature and the deposition was effected, the resistivity appeared between that for a substrate temperature of 100° C. and that for a substrate temperature of 200° C. This seem to be due to that organic matters or such dirty matters remaining on the substrate were burned and disappeared.

Then the zirconium boride thin film resistor as obtained in FIG. 15 was subjected to a duration test without application of electric power at 150° C. for 1000 hours and change of the resistivity was measured. The results are shown in Tables 3-8 (appearing after Example 28).

Table 3 shows the result of a sample of zirconium boride deposition film with a heat treatment temperature of 200° C., and Tables 4, 5, 6, 7 and 8 show results of the samples with heat treatment temperatures of 300° C., 400° C., 500° C., 600° C. and 700° C., respectively. When a heat treatment temperature was 200° C., percent resistance change after non-application duration test at 150° C.×1000 hours was negative to a great extent. When the heat treatment temperature became 300° C., the percent resistance change became not more than 1.0% and so stable. The reason may be considered as follows. Inner strain in the deposited thin film formed during deposition is not sufficiently released at the heat treatment temperature while it is gradually released during the non-application duration test and thereby the percent resistance change becomes large. When the heat treatment temperature is from 300° C. to 600° C., the inner strain is release so that the percent resistance change is as low as not more than 1.0% and the resulting thin film resistor is very stable.

On the contrary, when a heat treatment temperature is over 700° C., the zirconium boride deposition film is oxidized to a great extent and the resistivity values in Table 6 are very unstable and therefore, the resistive heater element does not appear to be practical.

In view of the foregoing, the heat treatment temperature for the zirconium boride thin film resistive heater element is preferably ranging from 300° C. to 600° C.

EXAMPLE 8

This example is concerned with heating test for a thermal head having a zirconium boride resistive heater element produced by electron beam deposition.

Thermal head $C_{110}$ was prepared by using zirconium boride ($ZrB_2$) as a sample and depositing it on a glazed ceramics at about $2 \times 10^{-5}$ Torr in the thickness of 1200 Å by electron beam deposition. The sheet resistance was 60 Ω/□.

For comparison, thermal head $B_{310}$ having a thickness of 1200 Å was prepared by reactive sputtering of R.F. sputtering type using tantalum as a target at a total pressure of argon and nitrogen of $3 \times 10^2$ Torr, nitrogen partial pressure of $1 \times 10^{-4}$ Torr. The resulting thin film was analyzed by X-ray diffraction and found to be $Ta_2N$. The sheet resistance was 20 Ω/□.

Figure 16:
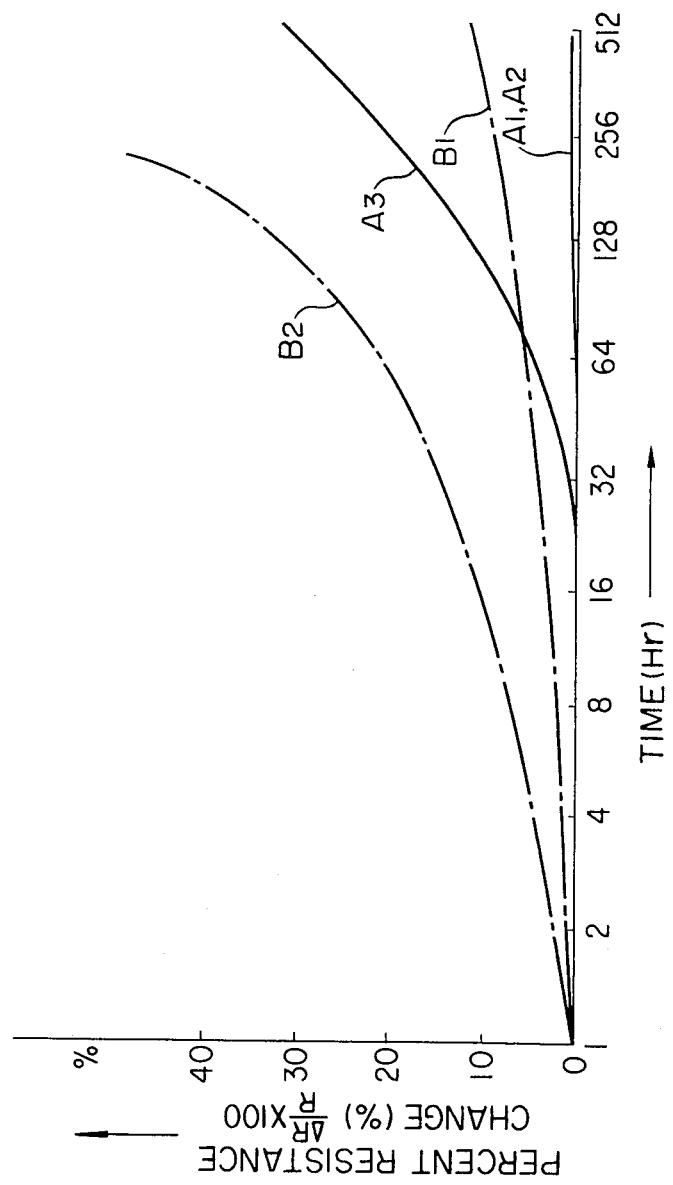

The thermal head thus produced was heated for a long time at a certain temperature (300° C., 400° C. and 500° C.) and the percent resistance change (%) was measured. The result is shown in FIG. 16. In FIG. 16 the ordinate represents the percent resistance change and the abscissa the heating time.

$A_1$ indicates zirconium boride heated at 300° C., $A_2$ that heated at 400° C., and $A_3$ that heated at 500° C., and $B_1$ indicates tantalum nitride heated at 300° C. and $B_2$ that heated at 400° C.

As is clear from this figure, the thermal head using a zirconium boride thin film resistor according to the present invention hardly shows different resistance at 300° C. and 400° C. On the contrary, thermal heads in comparison examples using tantalum nitride was oxidized to a great extent even at 300° C. and the resistance changed. When they are practically used, the thermal heads become 300° C. or higher by heat generation and therefore, thermal heads using zirconium boride thin film resistor have a far longer life for generating heat than those using tantalum nitride.

EXAMPLE 9

This example is concerned a thermal head having a resistive heater element of zirconium boride produced by electron beam deposition and a protective coating produced by electron beam deposition.

There were prepared thermal head $C_{110}$ having a zirconium boride thin film produced according to Example 8, and thermal heads $C_{120}$, $C_{130}$ and $C_{140}$ produced by providing thermal head $C_{110}$ with tantalum oxide, aluminum oxide and magnesium oxide protective coatings, respectively, by electron beam deposition. The protective coatings were 6 μm, 10 μm and 4 μm in thickness, respectively.

For comparison, there were prepared thermal head $B_{310}$ having a tantalum nitride thin film resistor according to Example 8, thermal head $B_{320}$ having a tantalum oxide protective coating of 6 μm thick, and thermal head $B_{330}$ having a silicon oxide film of 2μ thick and then a tantalum oxide film of 6μ thick (two-layered protective coating).

Figures 14, 17:
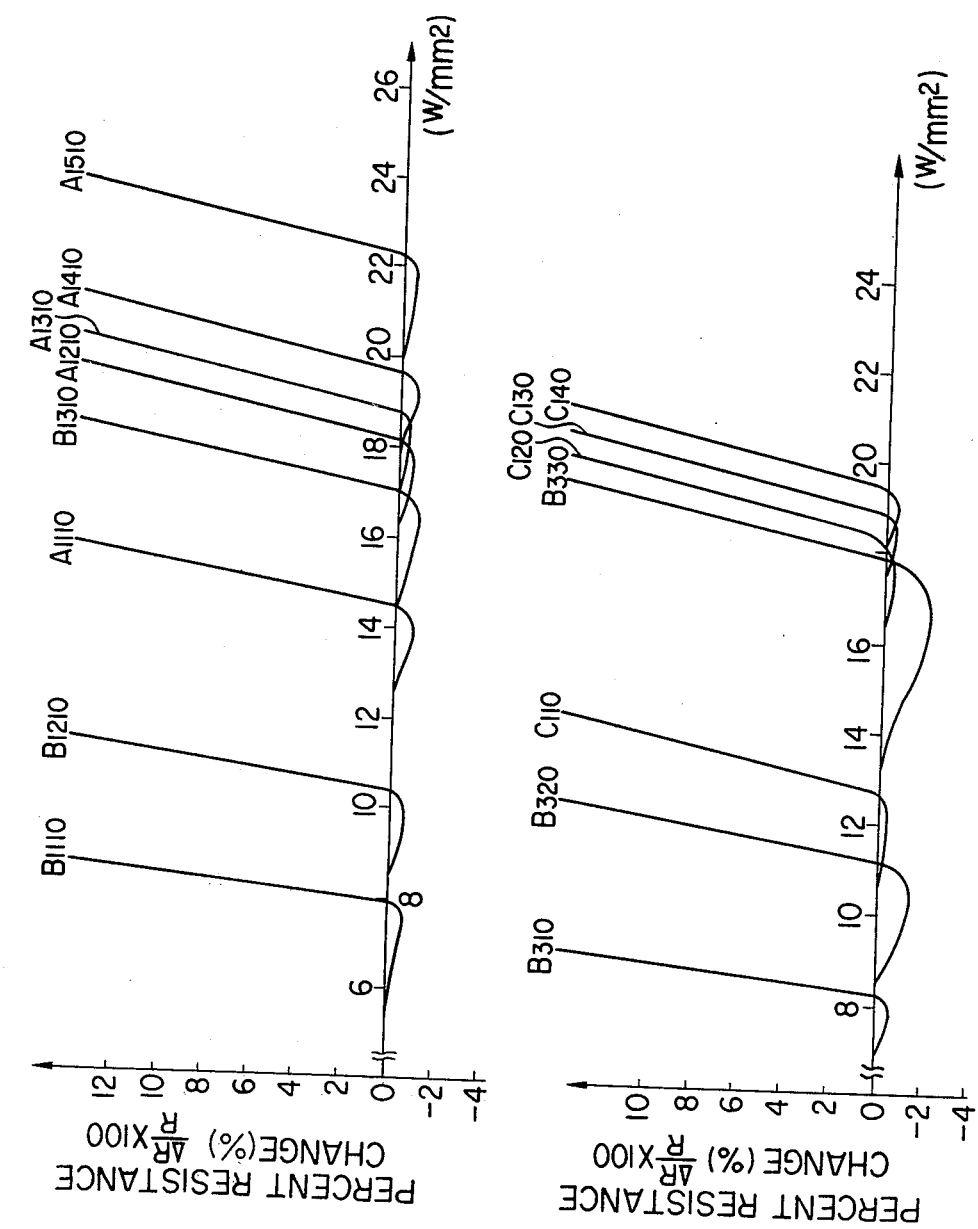

To these thermal heads was applied a repeating voltage of 50 Hz and having a pulse width of 6 ms, and the supplied power was increased 1 watt/mm² every 30 min. and percent resistance change, $(\Delta R/R) \times 100$, was measured. Their results are shown in FIG. 17. The zirconium boride thin film resistor can supply power of about 1.5 times per unit area that the tantalum nitride thin film does. The power supply per unit area can be improved by using a protective coating. A zirconium boride thin film resistor having a one layer protecting coating is much better than a tantalum nitride thin film resistor having a two-layered protecting coating.

Thermal heads $C_{120}$, $C_{130}$ and $C_{140}$ was subjected to an abrasion resistance test with a contact pressure of about 600 g/cm² against a heat sensitive recording member. As the result, the degree of abrasion was as excellent as 0.1 μ/km for magnesium oxide, 0.8 μ/km for aluminum oxide, and 0.2 μ/km for tantalum oxide.

EXAMPLE 10

This example is concerned with a thermal head having a hafnium boride resistive heater element produced by electron beam deposition and a protective coating produced by electron beam deposition.

Hafnium bromide, $HfB_2$ (supplied by Veatron Co., U.S.A.), powder was pressed under a pressure higher than 100 Kg/cm² to form a tablet and deposited in the thickness of 1000 Å on a glazed ceramics substrate preliminarily washed sufficiently at a substrate temperature of 300° C. under $5 \times 10^{-6}$ Torr by electron beam deposition. The resistivity was about 800 μΩcm and the sheet resistance was about 80 Ω/□. Then, titanium film of 10 Å thick and aluminum film of 1.5 μm thick were deposited thereon by electron beam deposition, and a selective etching was applied to form a pattern having a resolving power of 4 lines/mm². This is called hereinafter "thermal head $C_{111}$".

Thermal head $C_{121}$ was prepared by depositing a tantalum oxide protective coating of 6 μm thick on thermal head $C_{111}$ by electron beam deposition; thermal head $C_{131}$ was prepared by providing thermal head $C_{111}$ with an aluminum oxide protective coating of 8 μm thick; thermal head $C_{141}$ was prepared by providing thermal head $C_{111}$ with a magnesium oxide protecting coating of 5 μm thick; and thermal head $C_{151}$ was prepared by providing thermal head $C_{111}$ with a two-layered protective coating composed of a silicon oxide thin film of 1.5 μm and then a tantalum oxide thin film of 6 μm thick.

These resulting thermal heads were subjected to a step stress testing as in Example 1.

The resulting power limit value per unit area where percent resistance change increases abruptly was 13 W/mm² for $C_{111}$, 18.5 W/mm² for $C_{121}$, 18.5 W/mm² for $C_{131}$, 19 W/mm² for $C_{141}$ and 20 W/mm² for $C_{151}$.

EXAMPLE 11

This example is concerned with a thermal head having a resistive heater element of a boride produced by electron beam deposition and a protective coating produced by electron beam deposition.

Thermal heads $C_{112}$–$C_{119}$ were prepared by substituting various borides for hafnium boride in Example 10, and thermal heads $C_{122}$–$C_{129}$, $C_{132}$–$C_{139}$, $C_{142}$–$C_{149}$ and $C_{152}$–$C_{159}$ prepared by depositing tantalum oxide, aluminum oxide, magnesium oxide, silicon oxide and tantalum oxide on thermal head $C_{112}$–$C_{119}$, respectively as a protective coating.

These thermal heads were measured. The results are listed in Table 9 (appearing after Example 28).

EXAMPLE 12

This example is concerned with a thermal head having a hafnium boride resistive heater element produced by electron beam deposition and a protective coating produced by sputtering.

A protective coating was formed on thermal head $C_{111}$ as prepared in Example 10 by sputtering. The resulting thermal head $C_{221}$ has a tantalum oxide protective coating of 6 μm thick; the resulting thermal head $C_{231}$ has an aluminum oxide protective coating of 8 μm thick; the resulting thermal head $C_{241}$ has a magnesium oxide protective coating of 5 μm thick; and the resulting thermal head $C_{251}$ has a two-layered protective coating composed of a silicon oxide thin layer of 1.5 μm thick and then a tantalum oxide layer of 6 μm thick.

These thermal heads were subjected to a test similar to Example 1 to measure the percent resistance change.

The power limit value per unit area at which the percent resistance change increases abruptly was 19 W/mm² for $C_{221}$, 19 W/mm² for $C_{231}$, 19.5 W/mm² for $C_{241}$ and 22 W/mm² for $C_{251}$.

EXAMPLE 13

This example is concerned with thermal head having a boride resistive heater element produced by electron beam and a protective coating produced by sputtering.

Thermal heads $C_{112}$–$C_{119}$ were prepared according to Example 11.

Thermal head $C_{1110}$ was prepared according to Example 10 by using a tablet produced by thoroughly mixing zirconium boride, $ZrB_2$, (70 wt%) and titanium boride, $TiB_2$ (30 wt%) and pressing the resulting powder mixture at 100 Kg/cm² in place of the tablet in Example 10.

On thermal heads $C_{1110}$ were deposited protective coatings of tantalum oxide, aluminum oxide, magnesium oxide, and a combination of silicon oxide and tantalum oxide in a way similar to Example 12 to prepare thermal heads $C_{222}$–$C_{2210}$, $C_{231}$–$C_{2310}$, $C_{242}$–$C_{2410}$ and $C_{252}$–$C_{2510}$, respectively.

Power limit values for these thermal heads are shown in Table 10 (appearing after Example 28).

EXAMPLE 14

This example is concerned with a thermal head having a zirconium boride reactive heater element produced by reactive sputtering.

A metallic zirconium plate of 6 in. dia. was used as a target. A sufficiently washed glazed alumina substrate having a glass thickness of 50 μm was heated to 400° C. and subjected to reactive sputtering in an atmosphere of a mixture of argon and diborane, at a pressure (argon+diborane) of $3.5 \times 10^{-2}$ Torr and a diborane partial pressure of $1.5 \times 10^{-4}$ Torr at a power density of 2.5 W/mm² for 5 min. by R.F. sputtering. The sputtering rate was 100 Å/min. to give a thin film resistive heater element of 500 Å thick having a sheet resistance of 160 Ω/□. Resistivity was 800 μΩcm. On the resulting resistive heater element was deposited a vanadium film of 100 Å and a gold thin film of 1 μm by electron beam deposition and subjected to a selective etching to prepare a thermal head pattern having a resolving power of 4 lines/mm. Then, 10 μm of aluminum oxide ($Al_2O_3$) was laminated thereon by sputtering. A step stress testing was conducted by applying square wave at 50 Hz and 6 ms with power-up of 1 W/mm² every 30 min. and it was found that the percent resistance change up to 23 W/mm² was with ±2%.

EXAMPLE 15

This example is concerned with a thermal head having a resistive heater element produced by reactive sputtering.

Repeating the procedure of Example 14 except that a metal plate was used in place of the metallic zirconium plate, a thermal head was prepared. The resulting thermal head was subjected to step stress testing in a manner similar to Example 14 and a power limit value where the percent resistance change exceeds ±2% was measured. The results are shown in Table 11 (appearing after Example 28).

EXAMPLE 16

This example is concerned with a process for preparing a zirconium boride resistive heater element by sputtering in which a metallic zirconium plate and a boron plate were placed side by side as targets.

On a metallic zirconium plate of 6 in. dia. were placed many sintered boron plates having a diameter of ¼ in. so that the ratio of surface area of zirconium to that of boron might be 1:2, and this combinated plates were used as a target. A sufficiently washed glazed alumina substrate having a glass thickness of 50 μm was heated to 500° C. and subjected to R.F. sputtering at an argon pressure of $3 \times 10^{-2}$ Torr for 4 min. at a sputtering rate of 200 Å/min. with a supplied power of 3.0 W/cm², and there was prepared a thin film resistive heater element of 800 Å thick having a sheet resistance of 90 Ω/□ and resistivity of 720 μΩcm, followed by depositing 10 Å of titanium and 1 μm of aluminum on the element by electron beam deposition to prepare a thermal head pattern having a resolving power of 4 lines/mm. Then 10 μm of tantalum oxide ($Ta_2O_5$) was sputtered thereon. Step stress testing was applied by power-up of 1 W/mm² every 30 min. with square wave of 6 ms and 50 Hz, and a good result of durability was observed until 25 W/mm².

EXAMPLE 17

This example is concerned with step stress testing (the same testing as in Example 16) applied to thermal heads prepared by repeating the procedures of Example 16 except various resistive heater elements were used in place of the element in Example 16.

The result is shown in Table 12 (appearing after Example 28).

EXAMPLE 18

This example is concerned with a process for preparing a thermal head having a zirconium boride resistive heater element and a two-layered protective coating composed of a silicon oxide thin layer and a tantalum oxide thin layer in which sputtering and electron beam deposition in are used in combination. Zirconium boride powders were pressed to form tablets and then deposited in the thickness of about 1000 Å on a glazed ceramics substrate at a substrate temperature of 300° C. under about $4 \times 10^{-5}$ Torr, and further, titanium and gold were deposited in the thickness of 50 Å and 1.5 $\mu$m, respectively, as an electrode material. Selective etching was conducted to form a heater element and an electrode pattern.

Then, silicon oxide ($SiO_2$) and tantalum oxide ($Ta_2O_5$) was deposited in the thickness of 2 $\mu$m and 5 $\mu$m, respectively, as a protective coating of electron beam deposition at a substrate temperature of 300° C. under $5 \times 10^{-4}$ Torr or higher vacuum to produce a thermal head EB.

In place of the electron beam deposition as above, a protective coating of the same thickness as above composed of silicon oxide ($SiO_2$) and tantalum ($Ta_2O_5$) on the electrode pattern was formed by sputtering using $SiO_2$ and $Ta_2O_5$ as a target under $3 \times 10^{-2}$ Torr at a substrate temperature of about 200° C. to produce a thermal head ES.

A hot pressed zirconium boride was used to sputter on a glazed ceramics substrate in the thickness of about 600 Å under $3 \times 10^{-2}$ Torr and then, titanium and gold were deposited in the thickness of 50 Å and 1.5 $\mu$m, respectively, followed by a selective etching to form a heater element and a electrode pattern.

Then, silicon oxide ($SiO_2$) and tantalum oxide ($Ta_2O_5$) were deposited in the thickness of 2 $\mu$m and 5 $\mu$m, respectively, as a protective coating by electron beam deposition at a substrate temperature of 300° C. under $5 \times 10^{-4}$ Torr or higher vacuum to produce a thermal head SE.

A protective coating having the same thickness as above was formed by sputtering with $SiO_2$ and $Ta_2O_5$ as a target at a substrate temperature of about 200° C. under $3 \times 10^{-2}$ Torr to produce a thermal head SS.

For comparison, a thermal head $B_{430}$ having a resistive heater element composed of tantalum nitride was prepared. The heater element composed of tantalum nitride was prepared by R.F. sputtering with a metallic tantalum target in the thickness of 800 Å at a total pressure of argon and nitrogen of $3 \times 10^{-2}$ Torr and a partial pressure of nitrogen of $1 \times 10^{-4}$ Torr. X-ray diffraction showed that the deposited film was $Ta_2N$. On the film were formed electrodes as mentioned above and silicon oxide ($SiO_2$) of 2 $\mu$m thick and tantalum ($Ta_2O_5$) of 5 $\mu$m thick were formed as a protective coating by sputtering to prepare a thermal head $B_{430}$.

Figure 18:
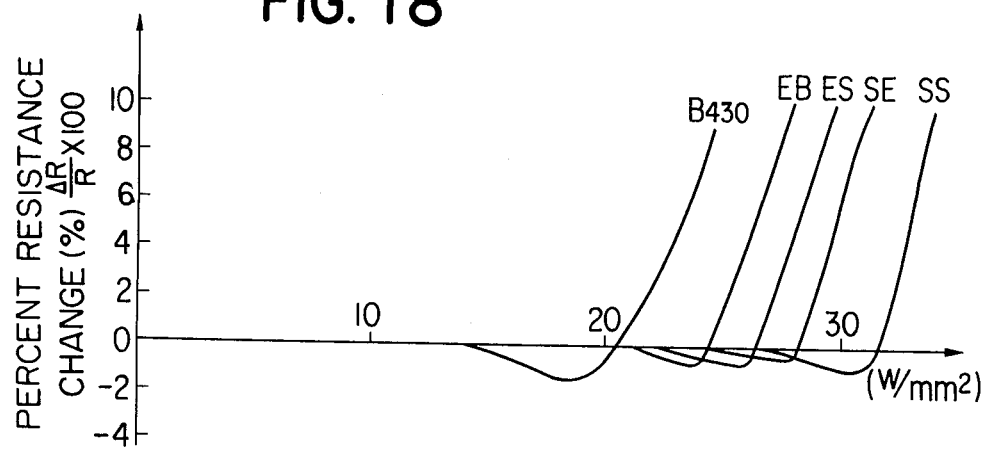

These thermal heads were subjected to a measurement of the percent resistance change, $(\Delta R/R) \times 100$, comprising applying electric pulse having a repeating cycle of 25 m sec and a pulse width of 2.8 m sec and increasing the supply power 1 W/mm² every 30 min. The results are shown in FIG. 18.

EXAMPLE 19

Figure 19:
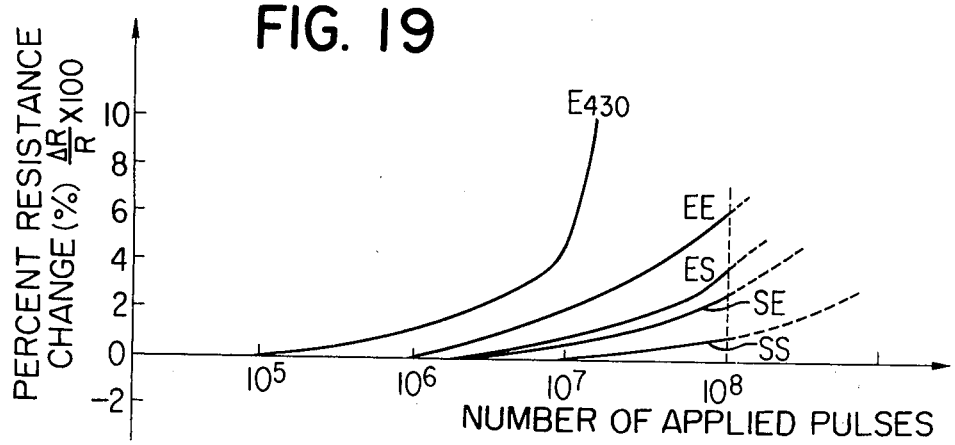

The thermal heads $B_{430}$, EE(corresponding to EB in Example 18), ES, SE, and SS prepared in a way similar to in Example 18 were measured with respect to percent resistance change, $(\Delta R/R) \times 100$ and number of applied pulses by supplying power of 23 W/mm² with a repeating pulse width of 25 m sec. and a pulse width of 2.8 m sec. The results are shown in FIG. 19. When a heat sensitive recording paper was color-formed by pulse having a pulse width of 2.8 m sec with a supplied power of 23 W/mm², the resulting color density was $\Delta D \approx 0.6$. Since $\Delta D$ is required to be 0.6 or more for identification as a letter image, the above mentioned supplied power is a practical value. When percent resistance change exceeds 10%, the thermal head can not be practically used. Therefore, as is clear from FIG. 19, a thermal head $B_{430}$ using tantalum nitride can be used only $2 \times 10^7$ times while percent resistance change of thermal heads using zirconium boride is less then +6% even at $10^8$ times. Thus, the latter shows a life more than 10 times that of the former.

EXAMPLE 20

When pulse having a repeating cycle of 20 m sec and a pulse width of 0.65 m sec with supplied power of 65 W/mm² was applied $10^8$ times to a thermal head using a zirconium boride resistive heater element as produced according to Example 18, the percent resistance changes for thermal heads EE, ES, SE and SS were +9%, +6%, +5% and +3%, respectively. On the contrary, thermal head $B_{430}$ using a tantalum nitride resistive heater element produced in Example 18 for comparison was subjected to the same conditions as above, the resulting percent resistance change was 15%. In conclusion, the thermal head for comparison shows a life of less than $10^7$ times.

EXAMPLE 21

This example is concerned with a thermal head having a zirconium boride resistive heater element which was heat-treated.

A $ZrB_2$ of 5 in. dia. hot-pressed at 1100° C. was used as a target and a sufficiently washed glazed alumina substrate having a glass thickness of 50 $\mu$m was heated to 200° C. and subjected to R.F. sputtering under argon pressure of $3 \times 10^{-2}$ Torr at a sputtering rate of 200 Å/min. with a supplied power of 3.0 W/cm² for 3 min. to form a thin film resistive heater element of 600 Å thick and a sheet resistance of 100 $\Omega/\square$ and a resistivity of 600 $\mu\Omega$cm. Titanium and gold were deposited in the thickness of 100 Å and 1 $\mu$m, respectively, by electron beam deposition and then selective etching was applied to produce a thermal head pattern having a resolving power of 4 lines/mm. The resulting product was subjected to a heat treatment at 550° C. for 10 hours in air, and thereby the sheet resistance of the resistive heater element increased from 100 $\Omega/\square$ to 250 $\Omega/\square$. A magnesium oxide (MgO) film was formed in the thickness of 8 $\mu$m on the resistive heater element as a protective coating by sputtering to produce a thermal head $D_{120}$.

For comparison, repeating the above procedure except that the heat treatment was not conducted, there was obtained a thermal head $D_{110}$, to which a square wave of 50 Hz, 6 ms and 16 Watt/mm$^2$ was continuously applied. The result of measurement of percent resistance change is shown in FIG. 20.

Figure 20:
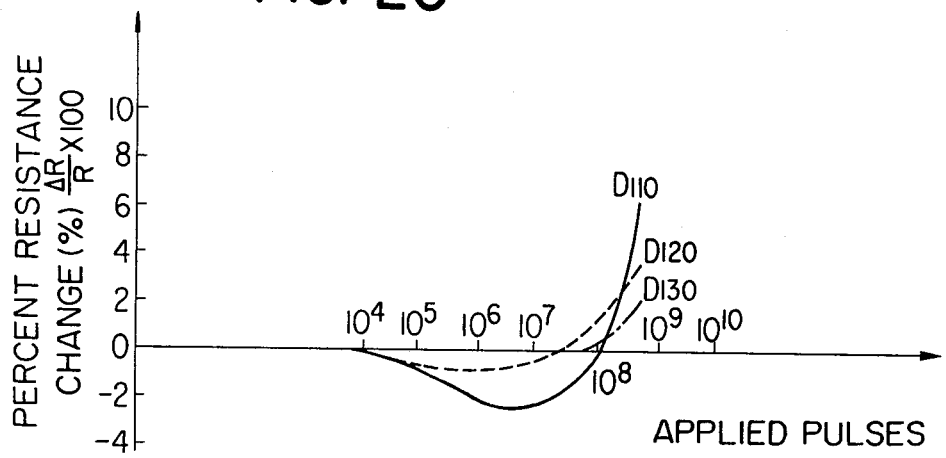

As is clear from FIG. 20, thermal head $D_{120}$ which was heat-treated shows a stable resistance and the percent resistance change after $5 \times 10^8$ times of pulse application is less than 4%.

When in the above production process the heat treatment was effected in argon at 650° C. for 2 hours, the sheet resistance changed from 100 Ω/□ to 85 Ω/□, and a magnesium oxide protective coating of 8 μm thick was formed by sputtering to prepare a thermal head $D_{130}$, which was subjected to a duration test similar to above. The result is shown in FIG. 20.

EXAMPLE 22

This example is concerned with a hafnium boride resistive heater element which was heat-treated.

Hafnium boride powders placed in a quartz dish were used as a target and a sufficiently washed glazed ceramics substrate was subjected to R.F. sputtering at a substrate temperature of 200° C. under an argon pressure of $5 \times 10^2$ Torr at a sputtering rate of 100 Å/min. for 6 min. to produce a hafnium boride thin film resistive heater element having a resistivity of 720 μΩcm, and a sheet resistance of 120 Ω/□. On the resulting resistive heater element were deposited titanium and gold in the thickness of 100 Å and 1 μm by electron beam deposition and further a selective etching was applied to form a thermal head pattern having a resolving power of four lines/mm. Then the element was heat-treated at 550° C. for 10 hours in air and thereby a sheet resistance of the resistive heater element increased from 120 Ω/□ to 200 Ω/□. A magnesium oxide protective coating of 8 μm thick was formed on the element by sputtering to prepare a thermal head $D_{121}$.

For comparison, a thermal head $D_{111}$ was prepared by repeating the above procedure excluding the heat treatment.

A square wave of 50 Hz, 6 ms and 16 Watt/mm$^2$ was continuously applied to these thermal heads to measure the percent resistance change. The result is shown in FIG. 21.

When the pulse was applied $5 \times 10^8$ times, percent resistance change of $D_{111}$ was more than 12% while that of $D_{121}$ was 10%. This means that the heat treatment reduced the percent resistance change and the resistance was stabilized.

When in the above production process the heat treatment was effected in argon at 650° C. for 2 hours, the sheet resistance changed from 120 Ω/□ to 110 Ω/□. Then a magnesium oxide protective coating of 8 μm thick was formed by sputtering to prepare a thermal head $D_{131}$, which was subjected to the same duration test as above.

The result is shown in FIG. 21. The result is good and even when pulse was applied $5 \times 10^8$ times, the percent resistance change was less than 5%.

EXAMPLE 23

In this example, repeating the procedure of Example 22 except that various resistive heater elements were used in place of the resistance heater element used in Example 22, there were obtained thermal head patterns and these were heat-treated in air as in Example 23 to form a protective coating to prepare thermal heads $D_{122}$–$D_{129}$. Thermal heads $D_{112}$–$D_{119}$ were prepared by omitting the heat treatment in the above procedure, and thermal heads $D_{132}$–$D_{139}$ were prepared by forming a protective coating after the heat treatment in argon in a way similar to Example 22.

These thermal heads were subjected to a pulse application test in a way similar to in Example 22. The results are shown in Table 13 (appearing after Example 28).

EXAMPLE 24

Examples 24–38 are concerned with thermal heads having a resistive heater element composed of two or more metal borides or composed of two or more metal borides and other metal or metals.

As metal borides, the compositions as shown in Table 14 (appearing after Example 28) were selected from $ZrB_2$, $HfB_2$, $TiB_2$, $CrB_2$, $NbB_2$, $VB_2$, $MoB$, $WB$, $TaB_2$, and $LaB_2$, and powders of these metal borides were uniformly mixed and placed on a quartz dish of 5 in. dia. as a target. A resistive heater element of 1000 Å thick was produced by R. F. sputtering with the above mentioned target under an argon total pressure of $5 \times 10^{-2}$ Torr at a substrate temperature of 200° C.

On the element was deposited titanium of 30 Å thick and aluminum of about 1.5 μm thick by electron beam deposition and then a selective etching was effected to give a thermal head having a resolving power of 4 lines/mm.

Further, another thermal head having a two-layered protective coating composed of a silicon oxide thin film of about 1.5 μm thick and a tantalum oxide thin film of 6 μm thick was prepared by sputtering these thin films on the thermal head as obtained above.

Step stress testing as in Example 1 was applied to each of the thermal head having a protective coating and the thermal head without a protective coating to measure percent resistance change. Power limit values per unit area at which the percent resistance change increased abruptly are listed in Table 15 (appearing after Example 28).

EXAMPLE 25

A mixture of metal boride powders (90 mole %) and molybdenum powders (10 mole %) was hot-pressed at about 1100° C. to produce a target. A sufficiently washed glazed alumina substrate having a glass thickness of 50 μm was heated to 200° C. and subjected to R. F. sputtering under an atmosphere of argon pressure of $4 \times 10^{-2}$ Torr using the target as prepared above to form a resistive heater element of 1000 Å thick composed of the metal boride and molybdenum.

Thus, the ten resistive heater elements as shown in Table 16 (appearing after Example 28) were prepared.

On the element were deposited titanium of 10 Å thick and aluminum of 1 μm thick by electron beam deposition and a selective etching was conducted to form a thermal head pattern having a resolving power of 4 lines/mm.

Then a silicon oxide film of 2 μm and a tantalum oxide film of 5 μm were deposited thereon continuously by sputtering to prepare thermal heads having a resistive heater element produced by using the target No. 25-1 through No. 25-10 in Table 16. X-ray diffraction analysis of the resistive heater elements of the thermal heads No. 25-1 through No. 25-10 showed that the elements contained molybdenum and the metal boride in the target. Further, ion microanalyzer showed that a small amount of oxygen, nitrogen and carbon was present therein.

For comparison, a tantalum nitride thermal head $B_{430}$ was prepared as in Example 18. $B_{430}$ has a resistive heater element of 1000 Å thick and a two-layered protective coating composed of a silicon oxide film of 2 μm and a tantalum oxide film of 5 μm.

To the thermal head of the present invention and that of the comparison sample was applied a square wave pulse having a repeating cycle of 20 ms. and a pulse width of 0.6 ms with a power of 3.2 watt per one resistive heater element for the purpose of conducting a test of deterioration of resistive heater element. The results after application of one million pulses are shown in Table 16 (appearing after Example 28). Thermal head $B_{430}$ having a tantalum oxide resistive heater element showed 15% increase in resistance when a pulse was applied one million times. A thermal head containing a metal boride and molybdenum showed only a little increase in resistance when a pulse was applied one million times. The increase in resistance of them was less than 10% when a pulse was applied ten million times. Therefore, duration of the thermal heads was 10 or more times that of the conventional tantalum nitride resistive heater element.

EXAMPLE 26

Eight hot-pressed targets containing zirconium boride and a metal as shown in Table 17 (appearing after Example 28) were used to prepare thermal heads No. 26-1 through 26-8 in Table 17 (appearing after Example 28) according to the procedure of Example 25. The thermal heads were subjected to the testing as in Example 25 and the results are shown in Table 17 (appearing after Example 28). Change of the resistance after application of a pulse one million times was little. Further, even after a pulse was applied ten million times, the change of resistance was less than 10%.

EXAMPLE 27

Thermal heads No. 27-1 through No. 27-7 in Table 18 (appearing after Example 28) were prepared according to the procedure of Example 25 by using targets composed of two or more metal borides and one or more of metal or semimetal as shown in Table 18 and subjected to the testing as in Example 25. The results are shown in Table 18.

EXAMPLE 28

Metal boride powders and metal or semimetal powders were mixed at ratios as shown in Table 19, pressed at a pressure of about 100 Kg/cm² to form a tablet. The materials of the resulting target was deposited in the thickness of 1000 Å on a sufficiently washed glazed alumina substrate having a glass layer of 50 μm thick by electron beam deposition under $5 \times 10^{-5}$ Torr at a substrate temperature of 200° C. Thermal heads were prepared by treating the resulting element according to the procedure of Example 25. Testing results following the testing of Example 25 are shown in Table 19 (infra). Change of resistance after application of pulse one million times was a little. Even when the pulse was applied ten million times, the change of resistance was less than 10%.

TABLE 1

| Target Material | | 3-2 Lanthanum boride $LaB_6$ Purity: 99.9%*1 | 3-3 Chromium boride $CrB_2$ Cr 70.2% B 29.3%*2 | 3-4 Titanium boride $TiB_2$ Ti 68.70% B 30.72%*3 | 3-5 Tantalum boride $TaB_2$ Purity: 99.7%*2 | 3-6 Niobium boride $NbB_2$ Purity: 99.8%*2 | 3-7 Tungsten boride*2 | 3-8 Molybdenum boride MoB Purity: 99%*2 | 3-9 Vanadium boride Purity: 99%*1 | 3-10 Zirconium boride 50 wt % Hafnium boride 50 wt % |
|---|---|---|---|---|---|---|---|---|---|---|
| Hot press temperature (°C.) | | 1300 | 1100 | 1300 | 1300 | 1300 | 1300 | 1300 | 1300 | 1300 |
| Substrate heating temperature (°C.) | | 200 | 200 | 200 | 200 | 200 | 200 | 200 | 300 | 200 |
| Thickness of resistive heater element (Å) | | 700 | 1000 | 400 | 700 | 1000 | 500 | 1000 | 1000 | 700 |
| Resistivity (μΩ cm) | | 420 | 250 | 360 | 210 | 200 | 250 | 350 | 180 | 420 |
| Sheet resistance (Ω/□) | | 60 | 25 | 90 | 30 | 20 | 50 | 35 | 18 | 60 |
| Thermal head sign | No protective coating | $A_{112}$ | $A_{113}$ | $A_{114}$ | $A_{115}$ | $A_{116}$ | $A_{117}$ | $A_{118}$ | $A_{119}$ | $A_{1110}$ |
| | Tautalum oxide protective coating | $A_{122}$ | $A_{123}$ | $A_{124}$ | $A_{125}$ | $A_{126}$ | $A_{127}$ | $A_{128}$ | $A_{129}$ | $A_{1210}$ |
| | Aluminium oxide protective coating | $A_{132}$ | $A_{133}$ | $A_{134}$ | $A_{135}$ | $A_{136}$ | $A_{137}$ | $A_{138}$ | $A_{139}$ | $A_{1310}$ |
| | Magnesium oxide protective coating | $A_{142}$ | $A_{143}$ | $A_{144}$ | $A_{145}$ | $A_{146}$ | $A_{147}$ | $A_{148}$ | $A_{149}$ | $A_{1410}$ |
| | Silicon oxide protective coating + Tantalum oxide protective coating | $A_{152}$ | $A_{153}$ | $A_{154}$ | $A_{155}$ | $A_{156}$ | $A_{157}$ | $A_{158}$ | $A_{159}$ | $A_{1510}$ |
| $Ta_2N$ comparison Example | Thickness of resistive heater element (Å) | 700 | 1000 | 400 | 700 | 1000 | 500 | 1000 | 1000 | 700 |

TABLE 1-continued

Figure 6:
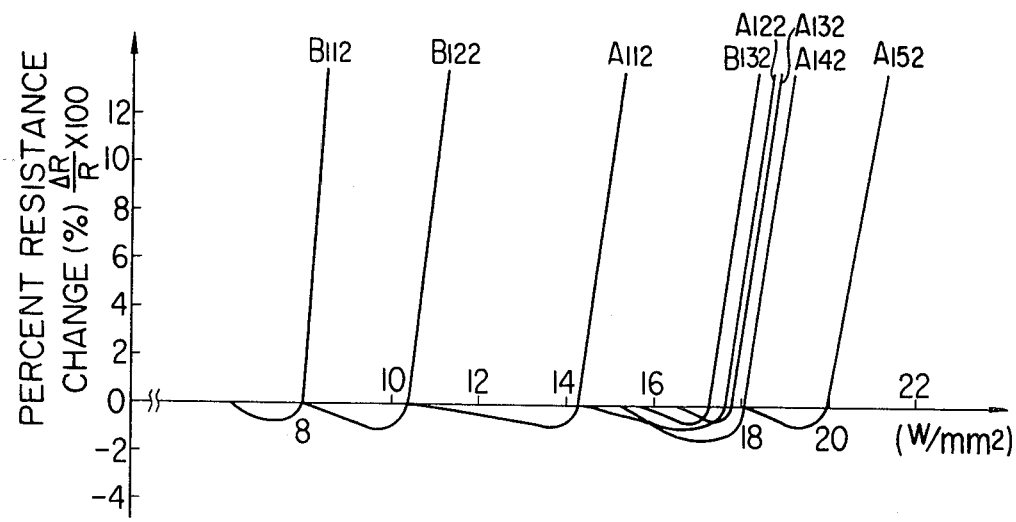
Figure 7:
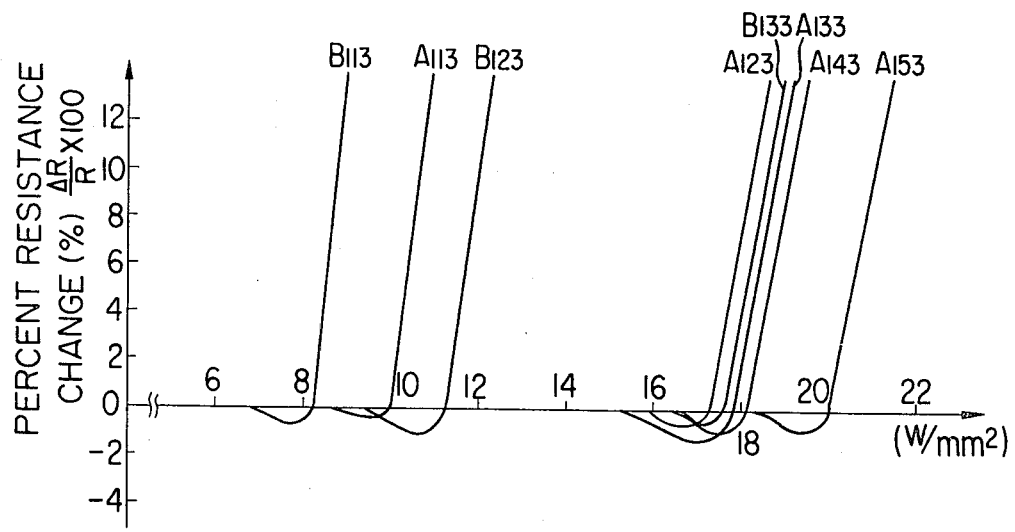
Figure 8:
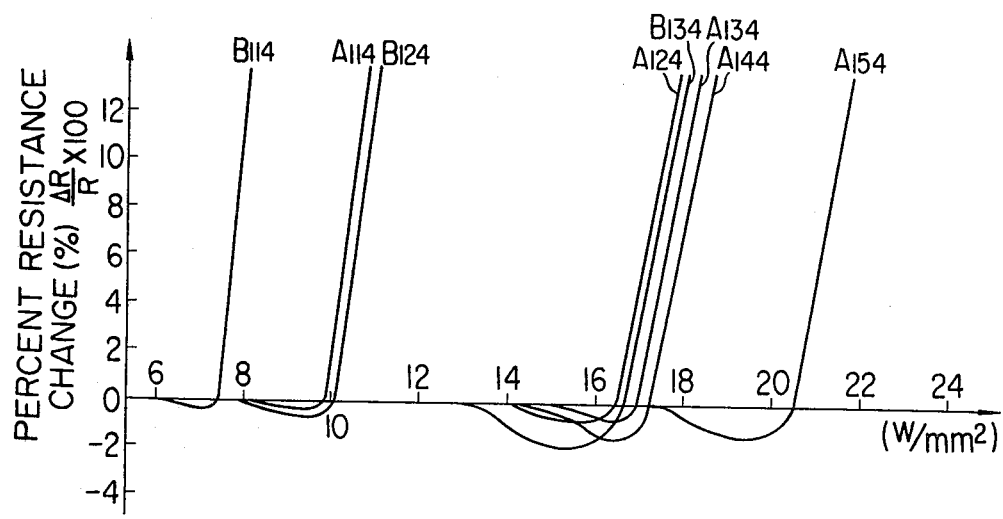
Figure 9:
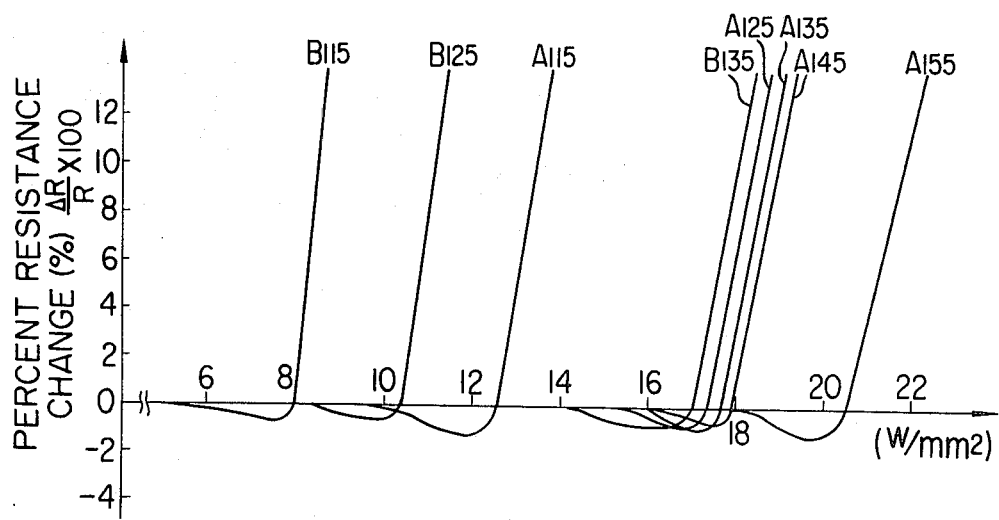
Figure 10:
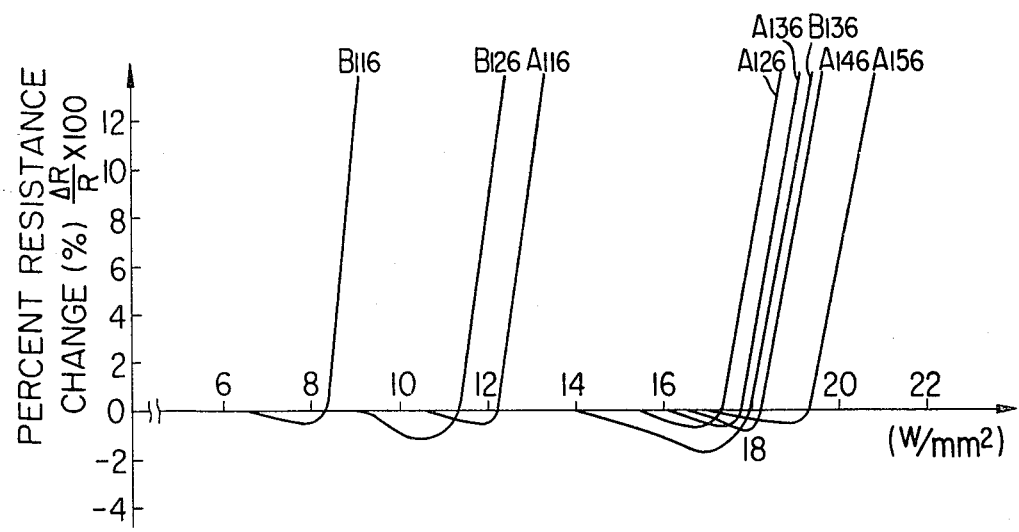
Figure 11:
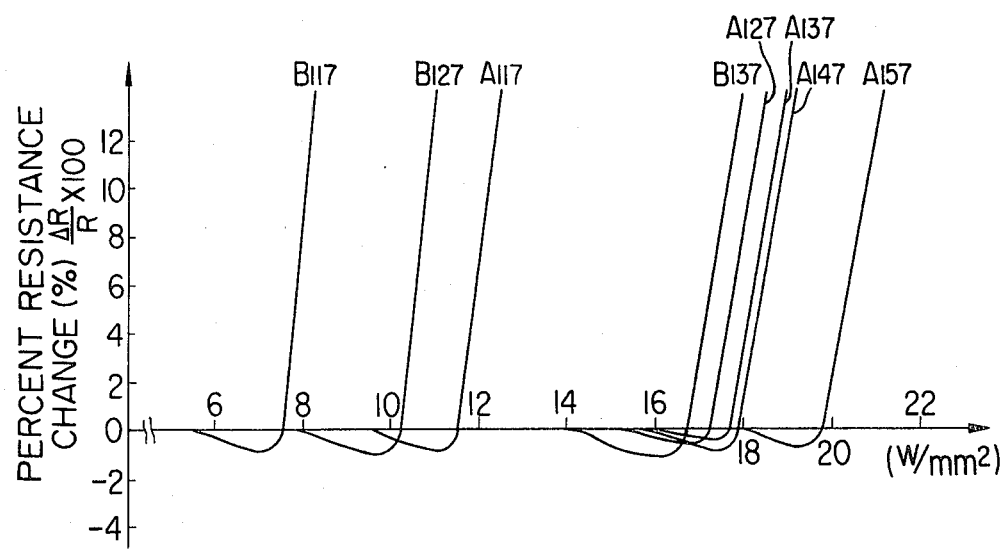
Figure 12:
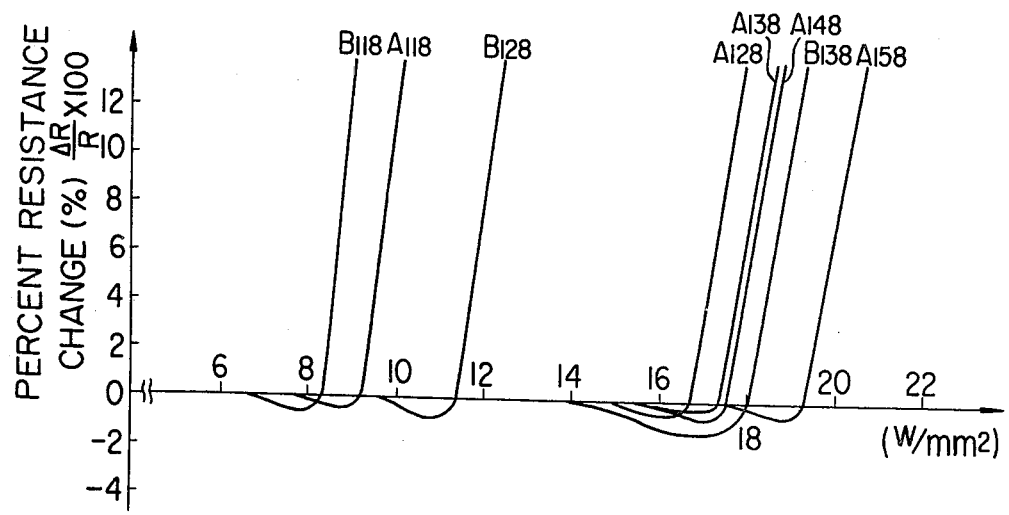
Figure 13:
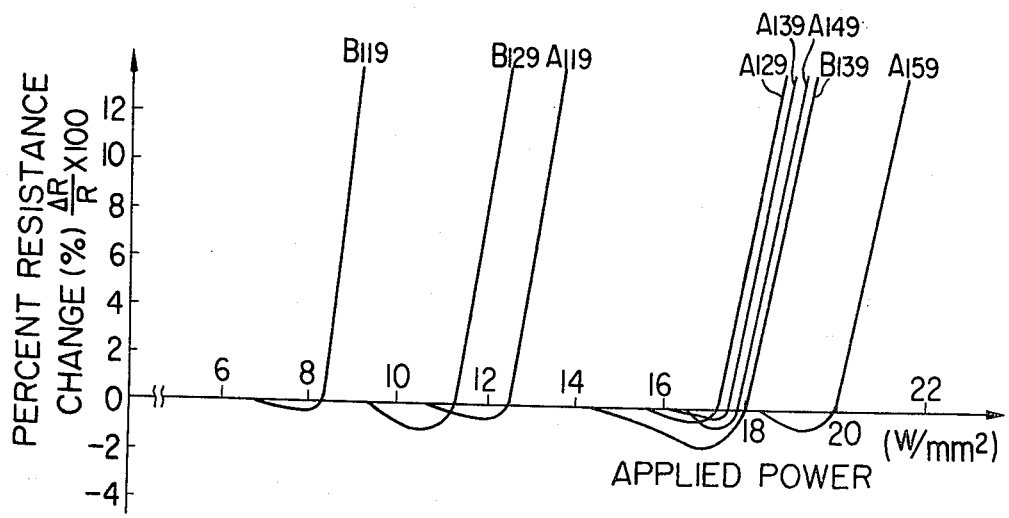

| Target Material | | 3-2 Lanthanum boride LaB$_6$ Purity: 99.9%*[1] | 3-3 Chromium boride CrB$_2$ Cr 70.2% B 29.3%*[2] | 3-4 Titanium boride TiB$_2$ Ti 68.70% B 30.72%*[3] | 3-5 Tantalum boride TaB$_2$ Purity: 99.7%*[2] | 3-6 Niobium boride NbB$_2$ Purity: 99.8%*[2] | 3-7 Tungsten boride*[2] | 3-8 Molybdenum boride MoB Purity: 99%*[2] | 3-9 Vanadium boride Purity: 99%*[1] | 3-10 Zirconium boride 50 wt % Hafnium boride 50 wt % |
|---|---|---|---|---|---|---|---|---|---|---|
| | Resistivity ($\mu\Omega$ cm) | 210 | 240 | 240 | 245 | 240 | 200 | 240 | 240 | 245 |
| | Sheet resistance ($\Omega/\square$) | 30 | 24 | 60 | 35 | 24 | 40 | 24 | 24 | 35 |
| | No protective coating | B$_{112}$ | B$_{113}$ | B$_{114}$ | B$_{115}$ | B$_{116}$ | B$_{117}$ | B$_{118}$ | B$_{119}$ | B$_{1110}$ |
| | Tantalum oxide protective coating | B$_{122}$ | B$_{123}$ | B$_{124}$ | B$_{125}$ | B$_{126}$ | B$_{127}$ | B$_{128}$ | B$_{129}$ | B$_{1210}$ |
| | Silicon oxide protective coating + Tantalum oxide coating | B$_{132}$ | B$_{133}$ | B$_{134}$ | B$_{135}$ | B$_{136}$ | B$_{137}$ | B$_{138}$ | B$_{139}$ | B$_{1310}$ |
| Corresponding Figure | | FIG. 6 | FIG. 7 | FIG. 8 | FIG. 9 | FIG. 10 | FIG. 11 | FIG. 12 | FIG. 13 | FIG. 14 |

*[1]Supplied by Research Co., U.S.A.
*[2]Supplied by Ventron Co., U.S.A.
*[3]Supplied by Mitsuwa Kagaku Yakuhin Japan

TABLE 2

| No. | 6-2 | 6-3 | 6-4 | 6-5 | 6-6 | 6-7 | 6-8 | 6-9 |
|---|---|---|---|---|---|---|---|---|
| Protective coating | Boride | | | | | | | |
| | Lanthanum boride | Chromium boride | Titanium boride | Tantalum boride | Niobium boride | Tungsten boride | Molybdenum boride | Vanadium boride |
| Protective coating | A$_{222}$ 21.5 | A$_{223}$ 19.5 | A$_{224}$ 18.0 | A$_{225}$ 20.5 | A$_{226}$ 18.5 | A$_{227}$ 19.0 | A$_{228}$ 18.0 | A$_{229}$ 19.0 |
| Aluminum oxide | A$_{232}$ 23.0 | A$_{233}$ 20.0 | A$_{234}$ 18.5 | A$_{235}$ 21.0 | A$_{236}$ 19.0 | A$_{237}$ 19.5 | A$_{238}$ 18.5 | A$_{239}$ 19.0 |
| Magnesium oxide | A$_{242}$ 23.5 | A$_{243}$ 20.0 | A$_{244}$ 19.0 | A$_{245}$ 21.0 | A$_{246}$ 19.0 | A$_{247}$ 19.5 | A$_{248}$ 18.5 | A$_{249}$ 19.5 |
| Silicon oxide + Tantalum oxide | A$_{252}$ 25.0 | A$_{253}$ 22.0 | A$_{254}$ 23.0 | A$_{255}$ 23.0 | A$_{256}$ 21.5 | A$_{257}$ 20.0 | A$_{258}$ 21.0 | A$_{259}$ 22.5 |

(Unit: W/mm$^2$)

TABLE 3

| Deposited film No. (Temperature of substrate) | Resistivity after 200° C. × 2 hours ($\mu\Omega$cm) | Resistivity after 150° C. × 1000 hours ($\mu\Omega$cm) | Percent resistance change (%) |
|---|---|---|---|
| 7-1-A (100° C.) | 5.23 × 10$^3$ | 3.48 × 10$^3$ | −33.5% |
| 2-A (200° C.) | 1.01 × 10$^3$ | 0.926 × 10$^3$ | −8.32% |
| 3-A (300° C.) | 0.835 × 10$^3$ | 0.790 × 10$^3$ | −5.39% |
| 4-A (400° C.) | 0.762 × 10$^3$ | 0.738 × 10$^3$ | −3.15% |
| 5-A (500° C.) | 0.422 × 10$^3$ | 0.405 × 10$^3$ | −4.03% |
| 6-A (600° C.) | 0.165 × 10$^3$ | 0.152 × 10$^3$ | −7.88% |
| 7-A (700° C.) | 0.169 × 10$^3$ | 0.153 × 10$^3$ | −9.47% |

TABLE 4

| Deposited film No. (Temperature of substrate) | Resistivity after 300° C. × 2 hours ($\mu\Omega$cm) | Resistivity after 150° C. × 1000 hours ($\mu\Omega$cm) | Percent resistance change (%) |
|---|---|---|---|
| 7-1-B (100° C.) | 3.51 × 10$^3$ | 3.49 × 10$^3$ | −0.57 |
| 2-B (200° C.) | 0.996 × 10$^3$ | 0.989 × 10$^3$ | −0.70 |
| 3-B (300° C.) | 0.809 × 10$^3$ | 0.808 × 10$^3$ | −0.12 |
| 4-B (400° C.) | 0.735 × 10$^3$ | 0.736 × 10$^3$ | +0.14 |
| 5-B (500° C.) | 0.428 × 10$^3$ | 0.428 × 10$^3$ | 0 |
| 6-B (600° C.) | 0.152 × 10$^3$ | 0.152 × 10$^3$ | 0 |
| 7-B (700° C.) | 0.151 × 10$^3$ | 0.151 × 10$^3$ | 0 |

TABLE 5

| Deposited film No. (Temperature of substrate) | Resistivity after 400° C. × 2 hours ($\mu\Omega$cm) | Resistivity after 150° C. × 1000 hours ($\mu\Omega$cm) | Percent resistance change (%) |
|---|---|---|---|
| 7-1-C (100° C.) | 3.32 × 10$^3$ | 3.31 × 10$^3$ | −0.3 |
| 2-C (200° C.) | 0.991 × 10$^3$ | 0.991 × 10$^3$ | 0 |
| 3-C (300° C.) | 0.805 × 10$^3$ | 0.806 × 10$^3$ | +0.12 |
| 4-C (400° C.) | 0.712 × 10$^3$ | 0.712 × 10$^3$ | 0 |
| 5-C (500° C.) | 0.403 × 10$^3$ | 0.404 × 10$^3$ | +0.25 |
| 6-C (600° C.) | 0.158 × 10$^3$ | 0.158 × 10$^3$ | 0 |
| 7-C (700° C.) | 0.159 × 10$^3$ | 0.159 × 10$^3$ | 0 |

TABLE 6

| Deposited film No. (Temperature of substrate) | Resistivity after 500° C. × 2 hours ($\mu\Omega$cm) | Resistivity after 150° C. × 1000 hours ($\mu\Omega$cm) | Percent resistance change (%) |
|---|---|---|---|
| 7-1-D (100° C.) | 3.31 × 10$^3$ | 3.32 × 10$^3$ | +0.3 |
| 2-D (200° C.) | 0.982 × 10$^3$ | 0.985 × 10$^3$ | +0.31 |
| 3-D (300° C.) | 0.815 × 10$^3$ | 0.816 × 10$^3$ | +0.12 |
| 4-D (400° C.) | 0.703 × 10$^3$ | 0.705 × 10$^3$ | +0.28 |
| 5-D (500° C.) | 0.411 × 10$^3$ | 0.414 × 10$^3$ | +0.73 |
| 6-D (600° C.) | 0.163 × 10$^3$ | 0.164 × 10$^3$ | +0.61 |
| 7-D (700° C.) | 0.156 × 10$^3$ | 0.157 × 10$^3$ | +0.64 |

TABLE 7

| Deposited film No. (Temperature of substrate) | Resistivity after 600° C. × 2 hours ($\mu \Omega cm$) | Resistivity after 150° C. × 1000 hours ($\mu \Omega cm$) | Percent resistance change (%) |
|---|---|---|---|
| 7-1-E (100° C.) | $3.36 \times 10^3$ | $3.38 \times 10^3$ | +0.60 |
| 2-E (200° C.) | $0.996 \times 10^3$ | $1.00 \times 10^3$ | +0.40 |
| 3-E (300° C.) | $0.812 \times 10^3$ | $0.816 \times 10^3$ | +0.49 |
| 4-E (400° C.) | $0.723 \times 10^3$ | $0.730 \times 10^3$ | +0.97 |
| 5-E (500° C.) | $0.408 \times 10^3$ | $0.410 \times 10^3$ | +0.49 |
| 6-E (600° C.) | $0.162 \times 10^3$ | $0.163 \times 10^3$ | +0.62 |
| 7-E (700° C.) | $0.165 \times 10^3$ | $0.166 \times 10^3$ | +0.61 |

TABLE 8

| Deposited film No. (Temperature of substrate) | Resistivity after 700° C. × 2 hours ($\mu \Omega cm$) | Resistivity after 150° C. × 1000 hours ($\mu \Omega cm$) | Percent resistance change (%) |
|---|---|---|---|
| 7-1-F (100° C.) | $10.1 \times 10^3$ | $10.1 \times 10^3$ | 0 |
| 2-F (200° C.) | $2.23 \times 10^3$ | $2.23 \times 10^3$ | 0 |
| 3-F (300° C.) | $2.41 \times 10^3$ | $2.42 \times 10^3$ | +0.42 |
| 4-F (400° C.) | $1.65 \times 10^3$ | $1.69 \times 10^3$ | +2.42 |
| 5-F (500° C.) | $1.32 \times 10^3$ | $1.39 \times 10^3$ | +5.30 |
| 6-F (600° C.) | $2.10 \times 10^3$ | $2.56 \times 10^3$ | +21.9 |
| 7-F (700° C.) | $1.23 \times 10^3$ | $1.30 \times 10^3$ | +5.7 |

TABLE 9

| No. | | | 11-2 | 11-3 | 11-4 | 11-5 | 11-6 | 11-7 | 11-8 | 11-9 |
|---|---|---|---|---|---|---|---|---|---|---|
| Tablet material | | | Lanthanum boride | Chromium boride | Titanium boride | Tantalum boride | Niobium boride | Tungsten boride | Molybdenum boride | Vanadium boride |
| Thickness of resistive heater element (Å) | | | 1000 | 1000 | 1000 | 1000 | 800 | 1000 | 1000 | 1000 |
| Resistivity ($\mu \Omega cm$) | | | 900 | 750 | 600 | 600 | 640 | 650 | 800 | 750 |
| Sheet resistance ($\Omega/\square$) | | | 90 | 75 | 60 | 60 | 80 | 65 | 80 | 75 |
| Power limit value (W/mm²) | No protective coating | | $C_{112}$ 12.5 | $C_{113}$ 11.0 | $C_{114}$ 11.0 | $C_{115}$ 11.0 | $C_{116}$ 11.5 | $C_{117}$ 11.0 | $C_{118}$ 11.5 | $C_{119}$ 11.0 |
| | Protective coating | Tantalum oxide | $C_{122}$ 17.5 | $C_{123}$ 18.0 | $C_{124}$ 18.0 | $C_{125}$ 18.0 | $C_{126}$ 16.5 | $C_{127}$ 17.5 | $C_{128}$ 17.5 | $C_{129}$ 16.0 |
| | | Aluminum oxide | $C_{132}$ 18.5 | $C_{133}$ 18.5 | $C_{134}$ 18.5 | $C_{135}$ 18.5 | $C_{136}$ 17.0 | $C_{137}$ 18.0 | $C_{138}$ 18.0 | $C_{139}$ 16.5 |
| | | Magnesium oxide | $C_{142}$ 19.0 | $C_{143}$ 18.5 | $C_{144}$ 18.5 | $C_{145}$ 18.5 | $C_{146}$ 17.0 | $C_{147}$ 18.0 | $C_{148}$ 18.0 | $C_{149}$ 16.5 |
| | | Silicon oxide + Tantalum oxide | $C_{152}$ 21.0 | $C_{153}$ 20.0 | $C_{154}$ 20.5 | $C_{155}$ 20.5 | $C_{156}$ 18.5 | $C_{157}$ 19.5 | $C_{158}$ 19.5 | $C_{159}$ 19.0 |

TABLE 10

| No. | 13-2 | 13-3 | 13-4 | 13-5 | 13-6 | 13-7 | 13-8 | 13-9 | 13-10 |
|---|---|---|---|---|---|---|---|---|---|
| Protective coating | Boride | | | | | | | | |
| | Lanthanum boride | Chromium boride | Titanium boride | Tantalum boride | Niobium boride | Tungsten boride | Molybdenum boride | Vanadium boride | Zirconium boride 70 wt. % Titanium boride 30 wt. % |
| Tantalum oxide | $C_{222}$ 18.5 | $C_{223}$ 19.0 | $C_{224}$ 18.5 | $C_{225}$ 19.5 | $C_{226}$ 17.5 | $C_{227}$ 18.5 | $C_{228}$ 18.0 | $C_{229}$ 17.0 | $C_{2210}$ 18.5 |
| Aluminum oxide | $C_{232}$ 19.0 | $C_{233}$ 19.5 | $C_{234}$ 19.0 | $C_{235}$ 20.0 | $C_{236}$ 18.5 | $C_{237}$ 19.0 | $C_{238}$ 18.5 | $C_{239}$ 18.0 | $C_{2310}$ 18.5 |
| Magnesium oxide | $C_{242}$ 20.5 | $C_{243}$ 19.5 | $C_{244}$ 20.0 | $C_{245}$ 20.0 | $C_{246}$ 18.5 | $C_{247}$ 19.0 | $C_{248}$ 18.5 | $C_{249}$ 18.0 | $C_{2410}$ 18.5 |
| Silicon oxide + Tantalum oxide | $C_{252}$ 22.0 | $C_{253}$ 22.0 | $C_{254}$ 22.0 | $C_{255}$ 22.0 | $C_{256}$ 20.0 | $C_{257}$ 20.0 | $C_{258}$ 20.5 | $C_{259}$ 20.5 | $C_{2510}$ 20.0 |

TABLE 11

| No. | 15-1 | 15-2 | 15-3 | 15-4 | 15-5 | 15-6 | 15-7 | 15-8 | 15-9 |
|---|---|---|---|---|---|---|---|---|---|
| Target metal plate | Hafnium | Lanthanum | Chromium | Titanium | Tantalum | Niobium | Tungsten | Molybdenum | Vanadium |
| Thickness of resistive heater element (Å) | 550 | 1000 | 800 | 800 | 1000 | 700 | 1000 | 1000 | 800 |
| Resistivity ($\mu \Omega cm$) | 800 | 800 | 440 | 880 | 500 | 1050 | 400 | 800 | 1040 |
| Sheet resistance ($\Omega/\square$) | 160 | 80 | 55 | 110 | 50 | 150 | 40 | 80 | 130 |
| Power limit value (W/mm²) | 22.0 | 23.0 | 19.0 | 20.0 | 21.0 | 18.0 | 20.5 | 19.0 | 17.5 |

TABLE 12

| No. | 17-1 | 17-2 | 17-3 | 17-4 | 17-5 | 17-6 | 17-7 | 17-8 | 17-9 |
|---|---|---|---|---|---|---|---|---|---|
| Target metal plate | Hafnium | Lanthanum | Chromium | Titanium | Tantalum | Niobium | Tungsten | Molybdenum | Vanadium |
| Target surface area ratio Metal:Boron | 1:2 | 1:6 | 1:2 | 1:2 | 1:2 | 1:2 | 1:2 | 1:1 | 1:2 |
| Thickness of resistive heater element (Å) | 800 | 1000 | 1000 | 1000 | 800 | 800 | 800 | 800 | 1000 |
| Resistivity ($\mu \Omega cm$) | 1040 | 1500 | 900 | 1500 | 1200 | 960 | 1280 | 960 | 850 |
| Sheet resistance ($\Omega/\square$) | 130 | 150 | 90 | 150 | 150 | 120 | 160 | 120 | 85 |

TABLE 12-continued

| No. | 17-1 | 17-2 | 17-3 | 17-4 | 17-5 | 17-6 | 17-7 | 17-8 | 17-9 |
|---|---|---|---|---|---|---|---|---|---|
| Target metal plate | Hafnium | Lanthanum | Chromium | Titanium | Tantalum | Niobium | Tungsten | Molybdenum | Vanadium |
| Power limit value (W/mm$^2$) | 20.0 | 20.5 | 19.5 | 18.5 | 19.5 | 17.5 | 20.0 | 18.0 | 17.0 |

TABLE 13

Figure 27:
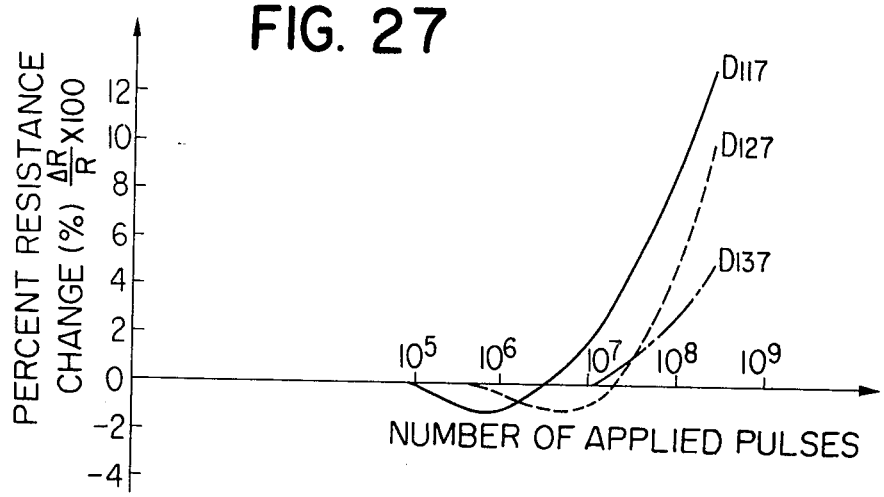
Figure 28:
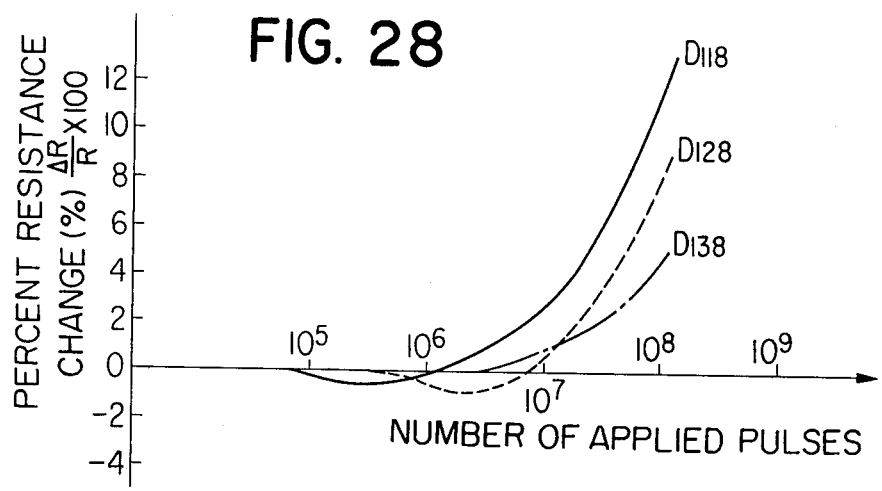
Figure 29:
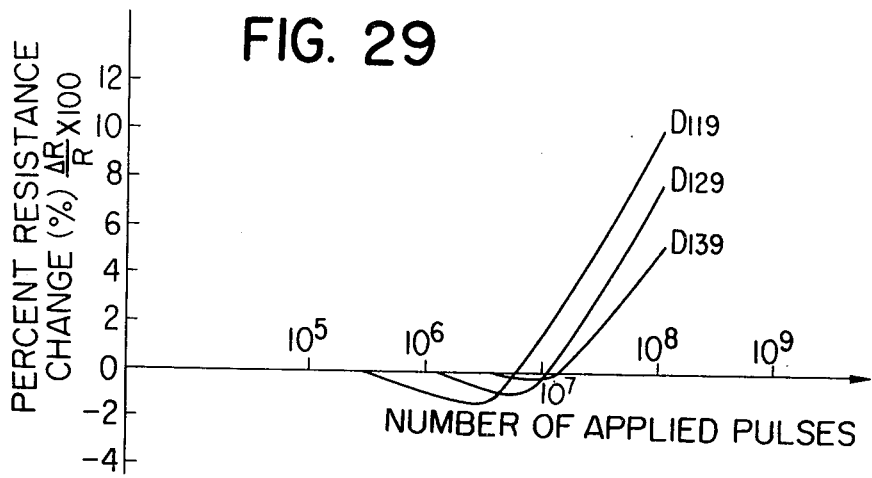
Figure 30:
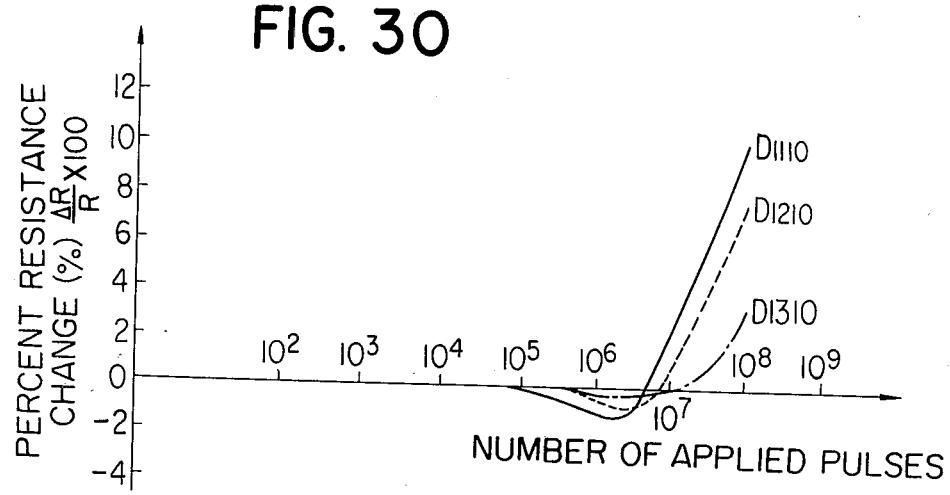

| No. | | 23-2 | 23-3 | 23-4 | 23-5 | 23-6 | 23-7 | 23-8 | 23-9 | 23-10 |
|---|---|---|---|---|---|---|---|---|---|---|
| Target powder | | Lanthanum boride | Chromium boride | Titanium boride | Tantalum boride | Niobium boride | Tungsten boride | Molybdenum boride | Vanadium boride | Hafnium boride 80 wt.% Lanthanum boride 20 wt.% |
| Thickness of resistive heater element (Å) | | 1000 | 1000 | 900 | 1000 | 900 | 1000 | 1000 | 1000 | 1000 |
| Resistivity before heat treatment (μ Ωcm) | | 800 | 350 | 990 | 400 | 315 | 300 | 350 | 400 | 400 |
| Sheet resistance before heat treatment (Ω/□) | | 80 | 35 | 110 | 40 | 35 | 30 | 35 | 40 | 40 |
| Sign of thermal head | Without heat treatment | $D_{112}$ | $D_{113}$ | $D_{114}$ | $D_{115}$ | $D_{116}$ | $D_{117}$ | $D_{118}$ | $D_{119}$ | $D_{1110}$ |
| | Heat treatment in air sheet resistance (Ω/□) | $D_{122}$ 145 | $D_{123}$ 140 | $D_{124}$ 180 | $D_{125}$ 100 | $D_{126}$ 95 | $D_{127}$ 130 | $D_{128}$ 100 | $D_{129}$ 120 | $D_{1210}$ 75 |
| | Heat treatment in argon sheet resistance (Ω/□) | $D_{132}$ 74 | $D_{133}$ 31 | $D_{134}$ 100 | $D_{135}$ 35 | $D_{136}$ 31 | $D_{137}$ 28 | $D_{138}$ 33 | $D_{139}$ 35 | $D_{1310}$ 38 |
| Pulse Application test | Applied pulse power (W/mm$^2$) | 15 | 14 | 15 | 15 | 14 | 14 | 14 | 14 | 14 |
| | Corresponding FIGS. | FIG. 22 | FIG. 23 | FIG. 24 | FIG. 25 | FIG. 26 | FIG. 27 | FIG. 28 | FIG. 29 | FIG. 30 |

TABLE 14

| No. | Composition of two or more metal borides |
|---|---|
| 24-1 | HfB$_2$ (60 wt %) - TiB$_2$ (40 wt %) |
| 24-2 | LaB$_6$ (80 wt %) - CrB$_2$ (20 wt %) |
| 24-3 | MoB (50 wt %) - WB (50 wt %) |
| 24-4 | VB$_2$ (50 wt %) - TaB$_2$ (50 wt %) |
| 24-5 | NbB$_2$ (50 wt %) - TaB$_2$ (50 wt %) |
| 24-6 | ZrB$_2$ (40 wt %) - HfB$_2$ (30 wt %) - LaB$_6$ (30 wt %) |
| 24-7 | HfB$_2$ (40 wt %) - ZrB$_2$ (30 wt %) - TiB$_2$ (30 wt %) |

TABLE 15

| | Maximum power limit value (W/mm$^2$) | |
|---|---|---|
| No. | Thermal head without protective coating | Thermal head with protective coating |
| 24-1 | 15.0 | 25.0 |
| 24-2 | 13.0 | 24.5 |
| 24-3 | 10.5 | 22.0 |
| 24-4 | 12.0 | 23.0 |
| 24-5 | 12.5 | 23.5 |
| 24-6 | 15.5 | 25.5 |
| 24-7 | 15.5 | 25.5 |

TABLE 16

| No. | Target components | Percent resistance change |
|---|---|---|
| 25-1 | ZrB$_2$(90%) + Mo(10%) | Not more than 0.3% |
| 25-2 | HfB$_2$(90%) + Mo(10%) | Not more than 0.6% |
| 25-3 | TiB$_2$(90%) + Mo(10%) | Not more than 1.2% |
| 25-4 | LaB$_6$(90%) + Mo(10%) | Not more than 0.4% |
| 25-5 | MoB(90%) + Mo(10%) | Not more than 0.8% |
| 25-6 | WB(90%) + Mo(10%) | Not more than 1.2% |
| 25-7 | TaB$_2$(90%) + Mo(10%) | Not more than 1.5% |
| 25-8 | CrB$_2$(90%) + Mo(10%) | Not more than 1.8% |
| 25-9 | VB$_2$(90%) + Mo(10%) | Not more than 2.1% |
| 25-10 | NbB$_2$(90%) + Mo(10%) | Not more than 1.5% |

TABLE 16-continued

| No. | Target components | Percent resistance change |
|---|---|---|
| Control | Tantalum nitride | Not less than 15% |

TABLE 17

| No. | Target components | Percent resistance change |
|---|---|---|
| 26-1 | ZrB$_2$(95%) + Mo(5%) | Not more than 0.3% |
| 26-2 | ZrB$_2$(90%) + Ti(10%) | Not more than 0.5% |
| 26-3 | ZrB$_2$(97%) + Ta(3%) | Not more than 0.4% |
| 26-4 | ZrB$_2$(97%) + Co(3%) | Not more than 1.1% |
| 26-5 | ZrB$_2$(99%) + Pt(1%) | Not more than 0.2% |
| 26-6 | ZrB$_2$(98%) + Ag(2%) | Not more than 0.4% |
| 26-7 | ZrB$_2$(95%) + La(5%) | Not more than 0.5% |
| 26-8 | ZrB$_2$(80%) + Si(20%) | Not more than 0.9% |

TABLE 18

| No. | Target component | Percent resistance change |
|---|---|---|
| 27-1 | ZrB$_2$(50%) + HfB$_2$(40%) + Zr(10%) | Not more than 0.1% |
| 27-2 | TiB$_2$(50%) + LaB$_6$(40%) + Ge(10%) | Not more than 0.2% |
| 27-3 | WB(50%) + VB$_2$(45%) + Cr(5%) | Not more than 1.2% |
| 27-4 | MoB(90%) + Ni(5%) + Si(5%) | Not more than 0.9% |
| 27-5 | HfB$_2$(90%) + Hf(5%) + W(5%) | Not more than 0.5% |
| 27-6 | TaB$_2$(50%) + CrB$_2$(40%) + Mn(8%) + Au(2%) | Not more than 1.0% |
| 27-7 | NbB$_2$(50%) + VB$_2$(30%) + Si(18%) + Pd(2%) | Not more than 0.7% |

TABLE 19

| No. | Target component | Percent resistance change |
| --- | --- | --- |
| 28-1 | $ZrB_2(90\%) + Nb(10\%)$ | Not more than 0.8% |
| 28-2 | $TiB_2(90\%) + Ta(5\%) + Co(5\%)$ | Not more than 1.5% |
| 28-3 | $LaB_6(80\%) + Si(15\%) + Zr(5\%)$ | Not more than 0.4% |
| 28-4 | $HfB_2(50\%) + TaB_2(30\%) + Si(20\%)$ | Not more than 1.7% |
| 28-5 | $TaB_2(40\%) + CrB_2(20\%) + Si(35\%) + Ag(5\%)$ | Not more than 2.1% |
| 28-6 | $ZrB_2(30\%) + TiB_2(20\%) + Ge(45\%) + Mo(5\%)$ | Not more than 0.8% |

EXAMPLE 29

A thermal head was prepared by substituting one of the following oxide protective coatings for the protective coating of thermal head No. 25-3 in Example 25.

An oxide protective coating such as silicon oxide, tantalum oxide, aluminum oxide, and magnesium oxide was deposited in the thickness of 7 μm by electron beam deposition.

The resulting thermal heads were subjected to a testing similar to in Example 25. After application of a pulse one million times, the resulting resistance change was less than 2% for each case.

EXAMPLE 30

A duration test was effected for each of thermal head No. 25-2 in Table 16, thermal head No. 26-2 in Table 17, thermal head No. 27-1 in Table 18, and thermal head No. 28-3 in Table 19 by printing continuously on a heat sensitive paper (commercially available as TP-50KH, supplied by Jujo Seishi, Japan) at a repeating cycle of 20 ms, pulse width of 0.6 ms, 3.2 watt per one resistive heater element and a pressing pressure of 800 g/cm². After printing one hundred million times, the resistance change was less than +10%, and any peeling of the protective coating occurs and the results are practically satisfactory. The supplied power of 3.2 W per one resistive heater element gave a practically satisfactory print density to the heat sensitive paper (TP-50 KH).

EXAMPLE 31

A mixture of zirconium powder, hafnium powder and boron which were uniformly dispersed in an atomic ratio of 2:1:1, was hot-pressed at 1100° C. to prepare a target of 6 inches in diameter.

R.F. sputtering was carried out under an atmosphere of argon by using the target thus prepared and employing a sufficiently washed, glazed alumina substrate, the glass of which was 50 μm in thickness while the substrate was heated at 300° C. and the argon pressure was controlled to $4 \times 10^{-2}$ Torr. The sputtering rate was 200 Å/min. and supplied power 3.0 W/cm². The sputtering was effected for 5 minutes to form a thin film of a resistive heater element of 1000 Å in thickness on the substrate. The resistivity and sheet resistance of the resistive heater element were found to be 900 μΩcm and 90Ω/□, respectively.

A titanium film of 20 Å in thickness and aluminum film of 1 μm in thickness were formed on the resistive heater element by electron beam deposition. The etching was selectively effected thereon to form a thermal head pattern having a resolution of 4 lines/mm. The resulting thermal head is designated by $A_{1111}$.

A silicon oxide ($SiO_2$) film of 1 μm in thickness and tantalum oxide ($Ta_2O_5$) film of 10 μm were laminated as the protective layers, on the thermal head pattern by the continuous sputtering to prepare a thermal head. This head is designated by $A_{1511}$.

For comparison, a thermal head having a resistive heater element of tantalum nitride of 1000 Å in thickness was prepared by R.F. sputtering. The sputtering was carried out under an atmosphere of argon and nitrogen by using tantalum as the target under conditions that the total pressure of the argon and nitrogen was $3 \times 10^{-2}$ Torr and the partial pressure was $1 \times 10^{-4}$ Torr. The resistivity and sheet resistance of the tantalum nitride resistive heater element were 260 μΩcm and 26Ω/□, respectively. The thermal head thus prepared is indicated by $B_{1111}$.

A silicon oxide ($SiO_2$) film of 1 μm in thickness and tantalum oxide ($Ta_2O_5$) film of 10 μm in thickness were laminated on the thermal head $B_{1111}$, as the protective layer, by the continuous sputtering to prepare a thermal head $B_{1311}$.

Figure 31:
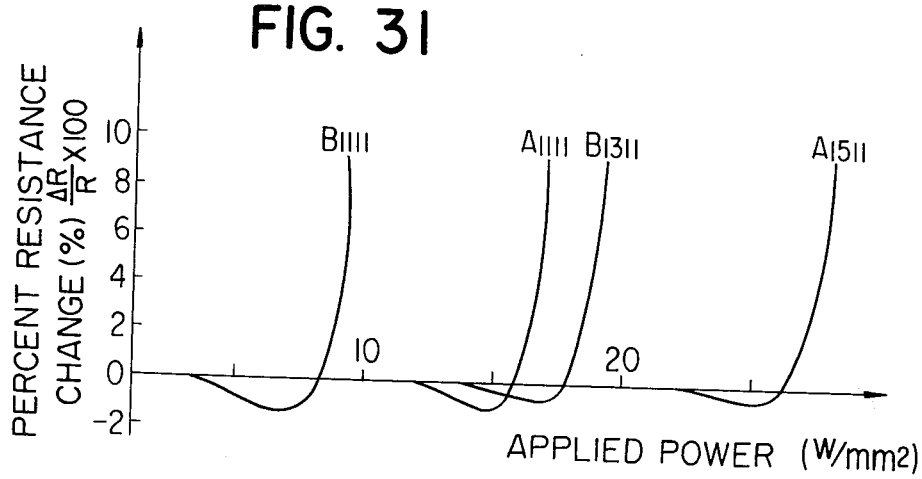

The step stress test was carried out with respect to the above mentioned thermal heads while the power of the rectangular wave in which the pulse duration was 6 mS and the cycle was 50 Hz, was increased by 1 W/mm² at each 30 minutes. The results are shown in FIG. 31.

EXAMPLE 32

A sintered boron plate of ¼ inch in diameter and a sintered zirconium plate of the same inch in diameter were placed on a metal tantalum plate of 6 inches in diameter so that the surface area ratio of tantalum:-boron:zirconium might be 1:8:3. The target thus prepared was used to carry out the R.F. sputtering. The sputtering was done under an atmosphere of argon by using a sufficiently washed, glazed ceramics substrate while the substrate was heated at 500° C. and the argon pressure was controlled to $3 \times 10^{-2}$ Torr. The sputtering was continued at a rate of 100 Å/min. for 8 minutes to obtain a resistive heater element, the thickness of which was 800 Å, the resistivity 1280 μΩcm and the sheet resistance 160 Ω/□.

A titanium film of 10 Å in thickness and aluminum film of 1 μm in thickness were formed on the resistive heater element by the electron beam deposition. The etching was selectively carried out to prepare a thermal head pattern having a resolution of 4 lines/mm. Further, a magnesium oxide (MgO) film of 10 μm in thickness was laminated by the sputtering so that a thermal head was obtained.

This thermal head was subjected to the step stress test in the same manner as that in Example 31. The percent resistance change was found to be within ±2% up to a power of 23 W/mm².

EXAMPLE 33

Metal hafnium powder, metal chromium powder and boron powder were uniformly mixed in a molar ratio of 2:1:1. The mixed powder was placed on a quartz plate of 5 inches in diameter, which was used as a target. The sputtering was carried out by using the target under the same conditions as those in Example 31 to obtain a resistive heater element of 1000 Å in thickness. Then, a titanium film of 30 Å in thickness and aluminum film of 1.5 μm in thickness were further formed on the resistive heater element by the electron beam deposition. The selective etching was effected to prepare a thermal head having a resolution of 4 lines/mm. Thereafter, a silicon oxide film of 3 μm in thickness and aluminum oxide film of 6 μm in thickness were laminated on the thermal head as the protective layer by the sputtering method.

The thus obtained thermal head was subjected to the step stress test in the same manner as in Example 31. It was found to be very excellent in the heat resistance as compared with the conventional thermal head using tantalum nitride.

EXAMPLE 34

A small piece of nickel was placed on a metal zirconium plate of 6 inches in diameter so that the surface area ratio of the two might by 1:1, which was used as a target. The reactive sputtering was carried out under an atmosphere of mixed gas, argon and diborane by using the target and a sufficiently washed, glazed ceramics substrate while the substrate was heated at 400° C. and the pressure of the argon plus diborane was controlled to $3.5 \times 10^{-2}$ Torr and further the partial pressure of the diborane was also controlled to $1.5 \times 10^{-4}$ Torr. A thin film of 1000 Å in thickness was formed on the substrate by such sputtering procedure. The sheet resistance of the thin film was 60Ω/□ and the resistivity 600 μΩcm.

A vanadium film of 100 Å in thickness and gold film of 1 um in thickness were formed on the thin film as mentioned above, by the electron beam deposition method. The etching was then selectively carried out to form a thermal head pattern having a resolution of 4 lines/mm. Thereafter, an aluminum oxide ($Al_2O_3$) film of 10 μm in thickness was laminated on the thermal head pattern by the sputtering.

The step stress test was conducted with respect to the thermal head in the same manner as in Example 31. It was found that the percent resistance change was within ±2% up to a power of 22 W/mm².

EXAMPLE 35

Titanium powder, lanthanum powder and boron were uniformly mixed in an atomic ratio of 1:1:4. The mixture was hot-pressed at 1200° C. to prepare a target.

R.F. sputtering was carried out under an atmosphere of argon by using the target and a sufficiently washed, glazed alumina substrate, the glass of which was 50 μm in thickness while the substrate was heated at 200° C. and the argon pressure was controlled to $2 \times 10^{-2}$ Torr. The sputtering rate was 200 Å/min. and the supplied power was 3.0 W/cm². The sputtering was conducted for 5 minutes to obtain a resistive heater element of 100 Å in thickness. The resistivity and sheet resistance of the resistive heater element were 1100 μΩcm and 110Ω/□, respectively.

A titanium film of 20 Å in thickness and aluminum film of 1 μm in thickness were formed on the resistive heater element by the electron beam deposition. The etching was selectively carried out to form a thermal head pattern having a resolution of 4 lines/mm. Further, a silicon oxide film of 3 μm in thickness and tantalum oxide film of 10 μm in thickness were laminated on the thermal head pattern as the protective layer by the sputtering method.

The step stress test was conducted with respect to the thermal head in the same manner as in Example 31. The thermal head was found to be very excellent in the heat resistance as compared with the conventional thermal head using tantalum nitride.

EXAMPLE 36

Metal hafnium powder, metal zirconium powder, metal lanthanum powder and boron powder were uniformly mixed in a molar ratio of 2:2:1:14. The mixture was placed on a quartz plate of 5 inches in diameter, which was used as a target.

The sputtering was carried out under the same conditions as in Example 31 to form a resistive heater element of 1000 Å in thickness. A titanium film of 30 Å in thickness and aluminum film of 1.5 μm in thickness were then formed on the resistive heater element by the electron beam deposition. Thereafter, the etching was selectively carried out to obtain a thermal head having a resolution of 4 lines/mm.

Further, a silicon oxide film of 3 μm in thickness and aluminum oxide film of 6 μm in thickness were laminated on the thermal head as the protective layer by the sputtering method.

The same step stress test as that in Example 31 was conducted with respect to the thermal head. The thermal head was found to be very excellent in the heat resistance as compared with the conventional thermal head using tantalum nitride.

EXAMPLE 37

Zirconium powder, titanium powder and boron powder were uniformly mixed in an atomic ratio of 3:2:10. The mixture was pressed under the pressure of more than 100 Kg/cm² to prepare a tablet.

The electron beam deposition was carried out by using the tablet and a preliminary washed, glazed ceramics substrate while the substrate was heated at 400° C. and vacuum degree was controlled to $5 \times 10^{-6}$ Torr. As the result, a resistive heater element of 1000 Å in thickness was formed on the substrate. The sheet resistance of the resistive heater element was found to be 65Ω/□ (the resistivity: about 650 μΩcm).

A titanium film of 10 Å in thickness and an aluminum film of 1.5 μm were formed on the resistive heater element by the electron beam deposition. The etching was selectively effected to form a thermal head pattern having a resolution of 4 lines/mm. Further, a silicon oxide ($SiO_2$) film of 1 μm in thickness and a tantalum oxide ($Ta_2O_5$) film of 10 μm in thickness were laminated on the thermal head pattern by the sputtering method so that a thermal head was obtained.

The step stress test was carried out with respect to the thermal head in the same manner as in Example 31. A good result was obtained as in the case of the thermal head $A_{1511}$.

EXAMPLE 38

Zirconium powder, hafnium powder, lanthanum powder and boron powder were uniformly mixed. The mixture was pressed under a pressure of more than 100 Kg/cm² to prepare a tablet. The electron beam deposition was carried out by using the tablet and a sufficiently washed, glazed ceramic substrate while the substrate was heated at 100° C. and the vacuum degree was controlled to $8 \times 10^{-5}$ Torr. As a result, a thin film of 1000 Å in thickness was formed on the substrate. The sheet resistance of the thin film was found to be about 200Ω/□ (resistivity: about 2000 μΩcm).

A titanium film of 10 Å in thickness and an aluminum film of 1.5 μm in thickness were formed on the thin film by the electron beam deposition. The etching was then selectively effected to form a thermal head pattern having a resolution of 4 lines/mm. Further, a silicon oxide (SiO$_2$) film of 1 μm in thickness and tantalum oxide (Ta$_2$O$_5$) film of 10 μm in thickness were continuously laminated on the thermal head pattern to obtain a thermal head.

The step stress test was carried out with respect to the thermal head in the same manner as in Example 31. A good result was obtained as in the case of the thermal head A$_{1511}$.

EXAMPLE 39

This example is concerned with a thermal head having a resistive heater element composed of zirconium boride and oxygen.

R.F. sputtering was carried out under an atmosphere of mixed gas, argon and oxygen by using a target of zirconium bordide (ZrB$_2$) of 5 inches in diameter hot-pressed at 1100° C. and a sufficiently washed, glazed alumina substrate while the substrate was heated at 300° C. and the argon pressure was controlled to $4 \times 10^{-2}$ Torr and also the oxygen pressure was controlled to $3 \times 10^{-3}$ Torr. The glass of the glazed substrate is 50 μm in thickness. In addition, the sputtering rate was 200 Å/min. and the supplied power 3.0 W/cm$^2$. The sputtering was continued for 5 minutes to obtain a resistive heater element of zirconium boride of 1000 Å in thickness. The resistivity and sheet resistance of the resistive heater element were 1400 μΩcm and 140Ω/□, respectively.

A titanium film of 10 Å in thickness and aluminum film of 1 μm in thickness were formed on the resistive heater element by the electron beam deposition. The selective etching was effected to form a thermal head pattern having a resolution of 4 lines/mm. This thermal head is incidated by A$_{410}$.

A silicon oxide (SiO$_2$) film of 1 μm in thickness and tantalum oxide (Ta$_2$O$_5$) film of 10 μm in thickness were continuously laminated by the sputtering procedure to obtain a thermal head A$_{450}$.

For comparison, another thermal head was prepared which has a resistive heater element of tantalum nitride. That is, R.F. sputtering was carried out in the same manner as mentioned above except that it was done under an atmosphere of argon and nitrogen by using a target of tantalum and the total pressure of argon plus nitrogen was controlled to $3 \times 10^{-2}$ Torr and the partial pressure of nitrogen was $1 \times 10^{-4}$ Torr. By the sputtering, a resistive heater element of tantalum nitride of 1000 Å in thickness was formed on the glazed alumina substrate. The resistivity and sheet resistance of the resistive heater element were 260 μΩcm and 26Ω/□, respectively. Further, in the same manner as that in case of the thermal head A$_{410}$, a titanium film and aluminum film were formed and the etching was selectively effected so that a thermal head B$_{41}$ (for comparison) was prepared.

A silicon oxide (SiO$_2$) film of 1 μm in thickness and tantalum oxide (Ta$_2$O$_5$) film of 10 μm in thickness were laminated on the thermal head B$_{41}$ by the sputtering to prepare a thermal head B$_{43}$ (for comparison).

For another comparison, a further thermal head (E$_{40}$) was prepared which was the same as the thermal head A$_{410}$ in the structure except that the resistive heater element is composed of zirconium boride (ZrB$_2$). The resistive heater element of zirconium boride was formed by the electron beam deposition which was conducted under the condition that the vacuum degree was $2 \times 10^{-5}$ Torr. The resistive heater element was 1000 Å in thickness, 800 μΩcm in resistivity and 80Ω/□ in sheet resistance.

A silicon oxide (SiO$_2$) film of 1 μm in thickness and tantalum oxide (Ta$_2$O$_5$) film of 10 μm in thickness were laminated on the thermal head E$_{40}$ as the protective layer by the sputtering to prepare a thermal head E$_{41}$ (for comparison).

Figure 32:
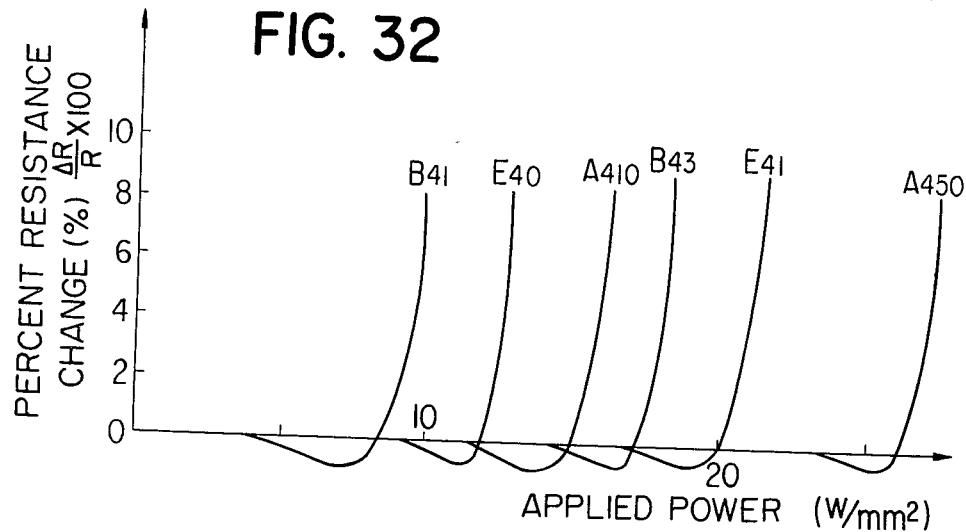

The step stress test was conducted with respect to the above mentioned thermal heads while the power of the rectangular wave of 6 ms in 50 Hz was increased by 1 W/mm$^2$ at each 30 minutes. This results are shown in FIG. 32.

EXAMPLE 40

In the procedure of Example 39, zirconium boride used therein was replaced by various materials in this example. Table 20 (appearing after Example 64) shows conditions for preparation of the thermal head, the characteristics of the resistive heater element, and the like. The results of the step stress test are shown in FIGS. 33-42.

In Table 20, the content of the oxygen in the resistive heater element was determined by means of an ion microanalyzer and it is shown by the atomic ratio of the oxygen to the metal constituting the resistive heater element. In addition, the thermal heads B$_{41}$ and B$_{43}$ (for comparison) having a resistive heater element of tantalum nitride are the same as those in Example 39.

EXAMPLE 41

This example shows relation between the oxygen pressure controlled in the sputtering and the resistivity of the resistive heater element.

R.F. sputtering was carried out under an atmosphere of argon and oxygen by using a target of zirconium boride (ZrB$_2$) of 5 inches in diameter hot-pressed at 1100° C. and a sufficiently washed, glazed alumina substrate while the substrate was heated at 300° C. and the argon pressure was controlled to $4 \times 10^{-2}$ Torr and further the oxygen pressure was $4 \times 10^{-3}$ Torr. The glass of the glazed alumina substrate is 50 μm in thickness. The sputtering rate was 200 Å/min. and the supplied power was 3.0 W/cm$^2$. The sputtering was done for three minutes to obtain a resistive heater element of zirconium boride of 600 Å in thickness. The resistivity and sheet resistance of the resistive heater element were 2600 μΩcm and 430 Ω/□, respectively.

A vanadium film of 10 Å in thickness and aluminum film of 1 μm in thickness were formed on the resistive heater element by the electron beam deposition. The etching was selectively effected to obtain a thermal head pattern having a resolution of 4 lines/mm. Further, a silicon oxide (SiO$_2$) film of 1 μm in thickness and a tantalum oxide (Ta$_2$O$_5$) film of 10 μm in thickness were laminated on the thermal head pattern, as the protective layer, by the sputtering method to obtain a thermal head A$_{4501}$.

Another resistive heater element of zirconium boride of 600 Å in thickness was obtained in the same procedure as mentioned above except that the oxygen pressure was changed to $5 \times 10^{-3}$ Torr. The resistivity and sheet resistance of the resistive heater element were 4400 μΩcm and 730 Ω/□, respectively. Further, the same electrode and protective layer as mentioned above were formed on the resistive heater element to obtain a thermal head A$_{4502}$.

A further resistive heater element of zirconium boride of 1000 Å in thickness was formed in the same manner as mentioned above except that the oxygen pressure was changed to $2\times10^{-3}$ Torr. Its resistivity and sheet resistance were found to be 550 $\mu\Omega$cm and 55 $\Omega/\square$, respectively. Further, the same electrode and protective layer were formed on the resistive heater element to obtain a thermal head $A_{4503}$.

A still another resistive heater element of zirconium boride of 1000 Å in thickness was prepared in the same manner as mentioned above except that the oxygen pressure was changed to $1\times10^{-3}$ Torr. Its resistivity and sheet resistance were 600 $\mu\Omega$cm and 60 $\Omega/\square$, respectively. Further, the same electrode and protective layer as mentioned above were formed on the resistive heater element to obtain a thermal head $A_{4504}$.

The same step stress test as in Example 39 was conducted with respect to the thermal heads $A_{4501}$, $A_{4502}$, $A_{4503}$ and $A_{4504}$. The obtained results were good as in the case of the thermal head$_{450}$.

Figure 43:
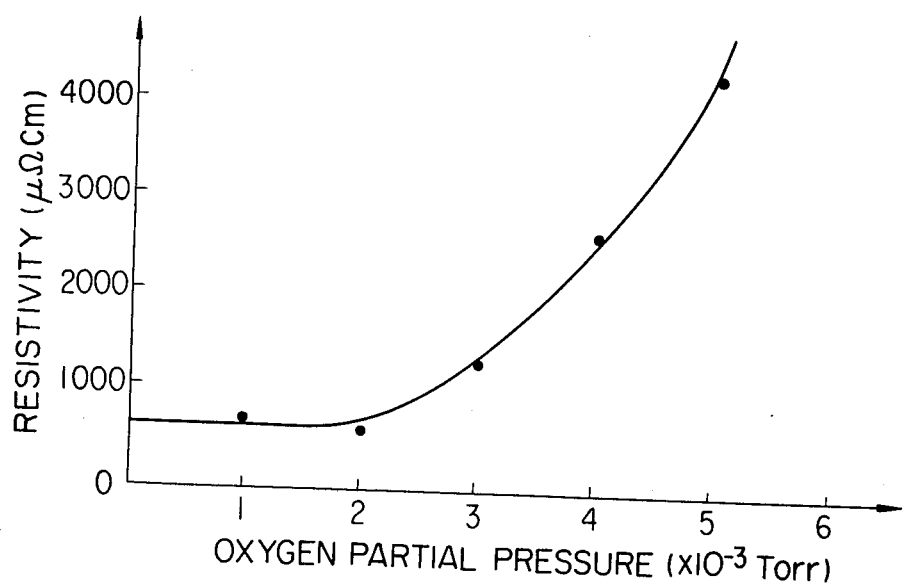
FIG. 43 is a graphical representation showing a relationship between resistivity of the resistive heater element and a pressure of oxygen at the time of its manufacturing.

FIG. 43 shows the relation between the resistivity of the resistive heater element of the thermal heads $A_{450}$, $A_{4501}$, $A_{4502}$, $A_{4503}$ and $A_{4504}$ and the oxygen pressure upon preparation of the resistive heater element. As is understood from FIG. 43, the resistivity of the resistive heater element can be controlled in the wide range by selecting the oxygen partial pressure.

In addition, when the oxygen partial pressure was increased from $5\times10^{-3}$ Torr to a higher pressure, it was difficult to control the resistivity of the resistive heater element because of suddenly increased resistance of such element.

EXAMPLE 42

R.F. sputtering was carried out under an atmosphere of argon and oxygen by using a target of hafnium boride (HfB$_2$) and a sufficiently washed, glazed alumina substrate while the substrate was heated at 200° C. and the argon pressure was controlled to $4\times10^{-2}$ Torr and the oxygen pressure was $4\times10^{-3}$ Torr. The target was that of 6 inches in diameter hot-pressed at 1300° C. The glass of the substrate was 50 $\mu$m in thickness. The sputtering was continued at a rate of 200 Å/min. by a supplied power of 300 W/cm$^2$ for three minutes to obtain a resistive heater element of 600 Å in thickness. The resistivity and sheet resistance of the resistive heater element were 2100 $\mu\Omega$cm and 350 $\Omega/\square$, respectively.

A vanadium film of 10 Å in thickness and aluminum film of 1 $\mu$m in thickness were formed on the resistive heater element by the electron beam deposition. The etching was selectively effected to form a thermal head pattern having a resolution of 4 lines/mm. Further, a silicon oxide (SiO$_2$) film of 2 $\mu$m in thickness and aluminum oxide (Al$_2$O$_3$) film of 5 $\mu$m in thickness were laminated on the thermal head pattern as the protective layer by the continuous sputtering to obtain a thermal head $A_{551}$.

The same step stress test as in Example 39 was carried out with respect to the thermal head to obtain good results as in the case of the thermal head $A_{451}$.

EXAMPLE 43

Thermal heads $A_{552}$-$A_{5510}$ were prepared in the same procedure as in Example 42 except that the target material was replaced by various metal borides. The characteristics of these thermal heads are shown in Table 21 (appearing after Example 64). Further, the same step stress test was carried out to obtain good results.

EXAMPLE 44

Zirconium boride (ZrB$_2$), titanium boride (TiB$_2$) and lanthanum boride (LaB$_6$) were uniformly mixed in a molar ratio of 2:1:1. The mixture was placed on a quartz plate of 5 inches in diameter, which was used as a target. The sputtering was carried out by using the target under the same conditions in Example 42 to form a resistive heater element of 1000 Å in thickness.

A titanium film of 30 Å in thickness and aluminum film of 1.5 $\mu$m in thickness were formed on the heater element by the electron beam deposition. The etching was selectively effected to prepare a thermal head having a resolution of 4 lines/mm. The thermal head was provided with silicon oxide film of 3 $\mu$m in thickness and magnesium oxide film of 6 $\mu$m in thickness as the protective layer.

This thermal head was subjected to the same step stress test as in Example 39 so that good results were obtained.

EXAMPLE 45

In this example, when a resistive heater element of hafnium boride and oxygen was formed by the sputtering, metal hafnium plate and boron plate were placed side by side, which was used as a target.

A sintered boron plate of $\frac{1}{4}$ inch in diameter was placed on a metal hafnium plate of 6 inches in diameter so that the surface area ratio of hafnium:boron might be 1:2, which was used as a target. R.F. sputtering was carried out under an atmosphere of argon and oxygen by using the target and a sufficiently washed, glazed ceramic substrate while the substrate was heated at 500° C. and the argon pressure was controlled to $3\times10^{-2}$ Torr and further the oxygen pressure was to $2\times10^{-3}$ Torr. The sputtering was continued at a rate of 100 Å/min. for 8 minutes to obtain a resistive heater element whose thickness was 800 Å, resistivity 1040 $\mu\Omega$cm, and sheet resistance 130 $\Omega/\square$.

A titanium film of 10 Å in thickness and aluminum film of 1 $\mu$m in thickness were formed on the heater element by the electron beam deposition. The etching was selectively effected to form a thermal head pattern having a resolution of 4 lines/mm. Further, a magnesium oxide (MgO) film of 10 $\mu$m in thickness was laminated as the protective layer by the sputtering method.

The step stress test was conducted with respect to the thermal head in the same manner as in Example 39. As the result, the percent resistance change of the resistive heater element was within $\pm2\%$ up to a power of 23.5 W/mm$^2$.

EXAMPLE 46

Thermal heads were prepared in the same procedure as in Example 45 except that the target material was replaced by various metals.

The step stress test was conducted with respect to the thus prepared thermal heads in the same manner as in Example 39. The limit value of power at the time when the percent resistance change was within $\pm2\%$ was measured, the results of which were shown in Table 22.

EXAMPLE 47

In this example, a resistive heater element of hafnium boride and oxygen was formed by the reactive sputtering.

The reactive sputtering was carried out under an atmosphere of mixed gas, argon, diborane and oxygen by using a metal hafnium plate of 6 inches in diameter as a target and employing a sufficiently washed, glazed ceramic substrate while the substrate was heated at 400° C. A thin film of 1000 Å in thickness was formed by R.F. sputtering under the total pressure of argon plus diborane plus oxygen of $3.5 \times 10^{-2}$ Torr, the partial pressure of diborane of $1.5 \times 10^{-4}$ Torr and the partial pressure of oxygen of $1 \times 10^{-4}$ Torr. The sheet resistance of such thin film was 50 $\Omega/\square$ (resistivity: 500 $\mu\Omega$cm).

A vanadium film of 100 Å in thickness and gold film of 1 $\mu$m in thickness were formed on the thin film by the electron beam deposition. The etching was selectively carried out to form a thermal head pattern having a resolution of 4 lines/mm. Further, an aluminum oxide ($Al_2O_3$) film of 10 $\mu$m in thickness was formed as the protective layer by the sputtering.

The thus obtained thermal head was subjected to the same step stress test as in Example 39. The percent resistance change was found to be within $\pm 2\%$ up to a power of 24 W/mm$^2$.

EXAMPLE 48

Thermal heads were obtained in the same manner as in Example 47 except that the target material was replaced by various metals.

The same step stress test as in Example 39 was conducted with respect to the thermal heads. The limit value of power at the time when the percent resistance change was within $\pm 2\%$ was measured, the results of which were shown in Table 23.

EXAMPLE 49

In this example, a resistive heater element composed of zirconium boride and oxygen was formed by the electron beam deposition.

Zirconium boride powder (supplied by Mitsuwa Chemicals) was pressed under a pressure of more than 100 Kg/cm$^2$ to prepare a tablet. The electron beam deposition was carried out by using the tablet and a sufficiently washed, glazed ceramic substrate in such a manner that the substrate was heated at 300° C. and the vacuum degree was controlled to $5 \times 10^{-6}$ Torr by introducing dry air through a needle valve after the vacuum degree had been once decreased to $2 \times 10^{-6}$ Torr. A resistive heater element of 1000 Å in thickness was formed by the electron beam deposition. Its sheet resistance was about 80 $\Omega/\square$ and the resistivity was about 800 $\mu\Omega$cm. The composition of the resistive heater element film was determined by an ion microanalyzer so that the atomic ratio of oxygen to zirconium was found to be 0.18.

A titanium film of 20 Å in thickness and aluminum film of 1 $\mu$m in thickness were formed on the resistive heater element by the electron beam deposition. The etching was selectively carried out to form a thermal head pattern having a resolution of 4 lines/mm. This thermal head is indicated by $A_{610}$.

Further, a silicon oxide ($SiO_2$) film of 1 $\mu$m in thickness and tantalum oxide ($Ta_2O_5$) film of 10 $\mu$m in thickness were continuously laminated as the protective layer on the thermal head $A_{610}$ by the sputtering method to obtain a thermal head $A_{650}$.

For comparison, the thermal heads $B_{41}$ and $B_{43}$ used in Example 39 are prepared. Such thermal heads have a resistive heater element of tantalum nitride having a thickness of 1000 Å. The head $B_{41}$ does not have a protective layer while the head $B_{43}$ is provided with two protective layers composed of silicon oxide ($SiO_2$) layer of 1 $\mu$m in thickness and tantalum oxide ($Ta_2O_5$) layer of 5 $\mu$m in thickness.

Figure 44:
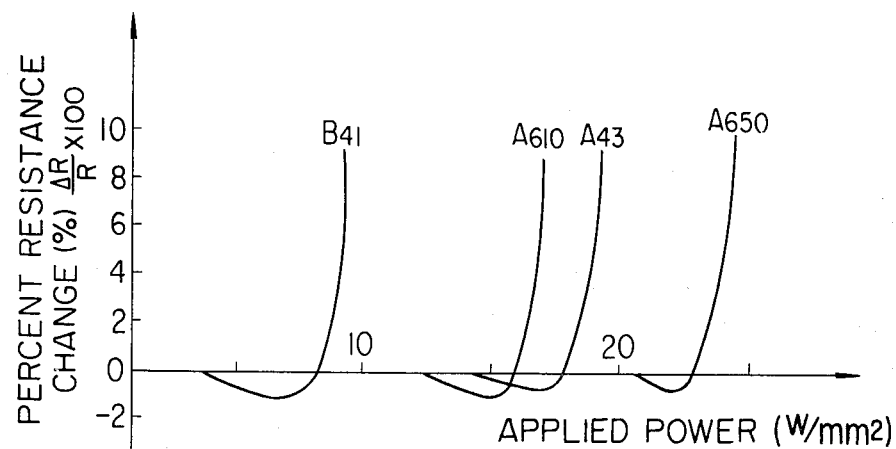

The above mentioned thermal heads were subjected to the same step stress test as in Example 39, the results of which are shown in FIG. 44.

EXAMPLE 50

Thermal heads were prepared in the same manner as in Example 49 except that the tablet material was replaced by various metal borides. Their characteristics are shown in Table 24 (appearing after Example 64).

In the table, the content of the oxygen is expressed by the atomic ratio of the oxygen to the metal amount in the resistive heater element.

The same step stress test was carried out with respect to the thermal heads to obtain good results.

EXAMPLE 51

In Examples 51-53, the conditions under which a resistive heater element composed of zirconium boride and oxygen was prepared by the electron beam deposition are changed.

Zirconium boride ($ZrB_2$) powder was pressed under a pressure of more than 100 Kg/cm$^2$ to prepare a tablet. The electron beam deposition was carried out by using the tablet and a sufficiently washed, glazed ceramic substrate while the substrate was heated at 500° C. and the vacuum degree was controlled to $4 \times 10^{-5}$ Torr by introducing dry air. As a result, a resistive heater element of 800 Å in thickness was formed on the substrate. The sheet resistance and resistivity of the resistive heater element were 70 $\Omega/\square$ and 560 $\mu\Omega$cm, respectively.

A vanadium film of 30 Å in thickness and gold film of 1.5 $\mu$m in thickness were formed on the resistive heater element by the electron beam deposition. The etching was selectively effected to form a thermal head pattern having a resolution of 4 lines/mm. Further, an $SiO_2$ film of 3 $\mu$m in thickness and $Al_2O_3$ film of 6 $\mu$m in thickness were continuously laminated to obtain a thermal head.

The same step stress test as in Example 39 was conducted with respect to the thermal head. The percent resistance change was found to be within 2% up to a power of 20 W/mm$^2$.

EXAMPLE 52

Zirconium boride ($ZrB_2$) powder was pressed under a pressure of more than 100 Kg/cm$^2$ to prepared a tablet. The electron beam deposition was carried out by using the tablet and a sufficiently washed, glazed ceramics substrate while the substrate was heated at 200° C. and the vacuum degree was controlled to $2 \times 10^{-5}$ Torr by introducing oxygen through a needle valve. As a result, a resistive heater element having a thickness of 800 Å was formed on the substrate. The sheet resistance and resistivity of the resistive heater element were 150 $\Omega/\square$ and 1200 $\mu\Omega$cm, respectively.

a titanium film of 30 Å in thickness and gold film of 1.5 $\mu$m in thickness were formed on the resistive heater element by the electron beam deposition. The etching was effectively carried out to form a thermal head pattern having a resolution of 4 lines/mm. Further, an MgO film of 6 $\mu$m in thickness was formed on the head pattern by the sputtering so that a thermal head was obtained.

The same step stress test as in Example 39 was carried out with respect to the thermal head. The percent resistance change was found to be within 2% up to a power of 21 W/mm².

EXAMPLE 53

Zirconium boride (ZrB₂) powder was pressed under a pressure of more than 100 Kg/cm² to prepare a tablet. A glazed ceramic substrate was sufficiently washed. The electron beam deposition was carried out by using the tablet and glazed ceramic substrate while the substrate was heated at 300° C. and the vacuum degree was controlled to $8 \times 10^{-5}$ Torr by introduction of oxygen through a needle valve. As a result, a resistive heater element of 800 A in thickness was formed on the substrate. The sheet resistance of the resistive heater element was 520 Ω/□ and the resistivity 4100 μΩcm.

A titanium film of 30 A in thickness and aluminum film of 1.5 μm in thickness were formed on the resistive heater element by the electron beam deposition. The etching was selectively effected to form a thermal head pattern having a resolution of 4 lines/mm. Further, an $SiO_2$ film of 3 μm in thickness and $Ta_2O_5$ film of 6 μm in thickness were continuously laminated on the thermal head pattern by the sputtering method to obtain a thermal head.

This thermal head was subjected to the same step stress test as in Example 39. The percent resistance change was found to be within 2% up to a power of 23 W/mm².

EXAMPLE 54

In this example, the glazed substrate is specified with respect to the thickness of its ceramic plate so that the heat responsibility of the thermal head is improved.

Figure 45:
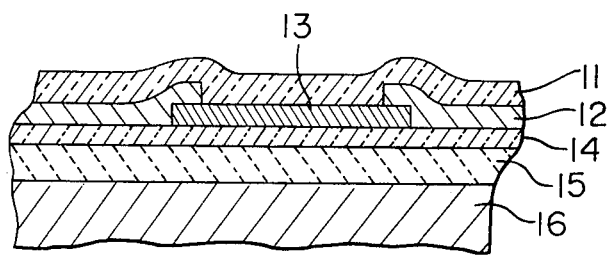

FIG. 45 shows an embodiment of the present invention, in which the numeral 11 is a protective layer ($SiO_2$, 5 μm in thickness), 12 an electrode (Al, 2 μm), 13 a resistive heater element (ZrB₂, 1000 Å), 14 a graze layer (glass, 30 μm), 15 an alumina plate and 16 a metal plate of aluminum (Al).

Figure 46:
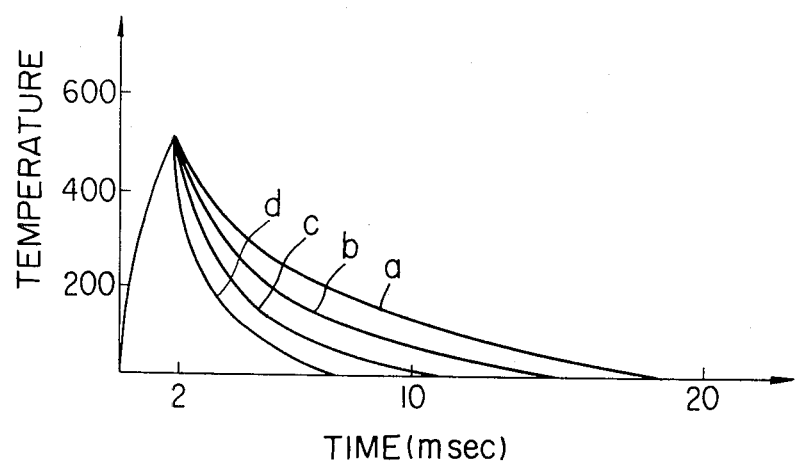
FIG. 46 is a graphical representation showing a relationship between temperature and time in glazed alumina plates of various thicknesses.

A power of 0.7 W/dot was applied to the resistive heater element having a resolution of 4 lines/mm for $t_1 = 2$ m sec.) and at that time, the temperature change was measured. The results are shown in FIG. 46. In the figure, "a" denotes the result in case of the alumina plate of 0.75 mm in thickness which constitutes the conventional thermal head, and "b, c and d" designate the results in cases of the alumina plates of 0.5, 0.4 and 0.3 mm in thickness, respectively, which constitute the thermal head of the present invention.

As clear from the figure, the conventional thermal head requires that $t_2$ is more than 18 m sec. On the contrary, the present invention requires only shorter $t_2$, that is, 16 m sec. in case of the alumina plate of 0.5 mm in thickness, 12 m sec. in case of the alumina plate of 0.4 mm in thickness and 8 m sec. in case of the alumina plate of 0.3 mm in thickness. This shows that the cooling speed of the thermal head is highly improved in the present invention.

Further, the same resistive heater elements were tested under the conditions that the power was 4 W/dot in case of the pulse duration of 300 μsec., and the powder was 2 W/dot in case of the pulse duration of 600 μsec., and so forth. Also in the test, good results were obtained. In short, up to now the pulse duration and power were limited to 1 m sec. and 1 W/dot, respectively, at most. On the contrary, the present invention makes it possible to effect to recording at a speed and power of 300 μsec. and 4 W/dot, or 600 μsec. and 2 W/dot in case of the ceramic plate of 0.3 mm in thickness. Therefore, in the thermal head of the present invention, the printing can be effected at about twofold speed as high as the conventional thermal head.

EXAMPLE 55

In this example, a low alkali glass layer was interposed between the glazed ceramics layer and the resistive heater element.

R.F. sputtering was carried out under an atmosphere of argon by using a glazed ceramic substrate (GS-2, supplied by Kyoto Ceramic K.K.) and a glass target. The glazed ceramic substrate is prepared by covering a sintered alumina plate of 0.63 mm in thickness with glass. The used glass target includes those having various compositions shown in Table 25 (appearing after Example 64). As the result of the sputtering, a glass film of about 2 μm in thickness was formed on the substrate.

In addition, the glass of the glazed layer of the substrate has a softening point (Ts°C.) of 620° C. and the total amount of $K_2O$ plus $Na_2O$ in such glass is 0.9 wt %.

R.F. sputtering was effected under an atmosphere of argon by using a target of zirconium boride to form a resistive heater element of about 800 Å in thickness on the glass film. Further, a Ti film of 50 Å in thickness and an Au film of 1.5 μm in thickness were formed on the heater element by the electron beam deposition.

The etching was selectively carried out to form a thermal head pattern, on which a silicon oxide ($Si_2O$) film of 2 μm in thickness and a tantalum oxide ($Ta_2O_5$) film of 8 μm in thickness were formed by the high speed sputtering. The thus obtained thermal head had a resolution of 4 lines/mm.

A rectangular pulse of 1 m sec. in a cycle of 50 Hz was applied to the resistive heater element for one hour by supplying a power of 2.4 W per one resistive heater element (this power being such one that can obtain a practical print density). The percent resistance change of the resistive heater element was measured, the results of which are shown in Table 26 (appearing after Example 64).

The example numbers in Table 26 correspond to those in Table 25.

The reference example 55-1 in Table 26 relates to the same thermal head except that a resistive heater element of zirconium boride was formed directly on the glazed ceramics substrate.

As clear from Table 26, the resistance change of the resistive heater element is largely influenced by the underlying material in contact with the resistive heater element.

That is, it was found that a good result was obtained when $K_2O + Na_2O \leq 1.0$ wt % and the softening point was more than 745° C.

Further, the thermal head of Example 55-6 in Table 26 was tested for a long time, i.e., 500 hours so that its percent resistance change was found to be within 3.4%. As the results, the life time of the thermal head was recognized to be more than 500 hours. On the contrary, the thermal head of Reference Examples 55-1 was broken down in only 50 hours in the same test. In view of the fact, it is clear that the present invention attains a great effect.

Furthermore, there is shown an example in which the above mentioned resistive heater element of zirconium boride was replaced by another resistive heater element of boride. These thermal heads are the same as the thermal head of Example 55-4 in Table 25 except that the resistive heater elements shown in Table 27 (appearing after Example 64) are formed on the glass layer. For comparison, the resistive heater elements of various borides are formed on the substrate, not having a glass layer, to prepare thermal heads.

A rectangular wave pulse was applied to the above mentioned thermal heads for one hour. At that time, in the pulse, the cycle was 50 Hz, pulse duration 1 ms and power 2.4 W/dot. The percent resistance change was measured, the results of which are shown in Table 27 (appearing after Example 64).

From such a results, the effect of the glass layer was confirmed. Further, the effect of the present invention was also recognized in case of the resistive heater element of tantalum nitride and nichrome.

EXAMPLE 56

In this example, a quartz layer is interposed between the glazed ceramic layer and the resistive heater element.

R.F. sputtering was carried out under an atmosphere of argon by using a glazed ceramic substrate and a quartz ($SiO_2$) plate target. The substrate was prepared by covering an alumina plate of 0.63 mm in thickness with a glass layer ($K_2O + Na_2O = 0.9$ wt %) of 50$\mu$ in thickness and 620° C. in the softening point. By the R.F. sputtering method, four kinds of quartz films of different thickness were formed on the substrate. Further, R.F. sputtering was carried out under an atmosphere of argon by using a target of zirconium boride to form a resistive heater element of 800 Å in thickness on the quartz layer. Then, a Ti layer of 50 Å in thickness and Au layer of 1.5 $\mu$m in thickness were formed by the electron beam deposition.

The photo-etching was selectively carried out with respect to the layered structure to form a thermal head pattern. Thereafter, a quartz film of 2$\mu$ in thickness and tantalum oxide of 8$\mu$ in thickness were formed on the thermal head pattern by the high speed sputtering operation.

Rectangular pulses were applied to the thermal heads in a cycle of 50 Hz for one hour. The rectangular pulses were those in which the pulse width and power were 2.8 ms and 1 W, respectively, per one resistive heater element and in which the pulse width and power were 1.0 ms and 2.4 W, respectively, per one resistive heater element. After that time, the percent resistance change of the resistive heater elements was measured, the results of which are shown in Table 28 (appearing after Example 64).

At that time, the record density was measured by a micro-densitometer and found to be more than 0.6.

The thermal heads of Examples 56-1 to 56-4 in Table 28 are those according to the present invention. The thermal head of Comparison Example 5 is that in which the resistive heater element was formed directly on the glazed ceramics and the other structure is the same as that of the thermal head of the present invention.

The thermal head of Example 56-1 was tested for a long time period, i.e., 500 hours under the conditions that the pulse width was 1 ms and power 2.4 W. It was found that the percent resistance change was +2.8% and the lifetime was more than 500 hours. On the contrary, the thermal head of the comparison example was broken in 50 hours in the same test. As the result, the effect of the present invention was recognized to be remarkable.

Further, in next Examples 56-5 to 56-12, the zirconium boride constituting the above mentioned resistive heater element was replaced by another boride. The quartz layer of the thermal head was formed in a thickness of 2 $\mu$m and the other structure was the same as that of the thermal head of Example 56-1. Further, for comparison, only the quartz layer was removed from the thermal heads of Examples 56-5 to 56-12 to prepare sample thermal head for comparison. These samples were used in Comparison Examples 56-2 to 56-9.

A rectangular electric pulse was applied to the thermal heads in a cycle of 50 Hz for one hour under the conditions that the pulse width and supplied power were 1.0 ms and 2.4 W, respectively, for one resistive heater element. The percent resistance change at that time was measured, the results of which are shown in Table 29 (appearing after Example 64).

In addition, the present invention was confirmed to be effective to resistive heater elements of nichrome alloy, tantalum nitride and the like.

EXAMPLE 57

In this example, the glaze layer of the glazed ceramics substrate is improved in the melting point.

Glass members of various compositions shown in Table 30 (appearing after Example 64) were applied onto a polished alumina substrate of 0.63 mm in thickness to prepare glazed ceramics substrates. Among Examples 57-1 to 57-9 in Table 30, the glass layer of Example 57-9 was 15 $\mu$m in thickness and the other glass layers were about 50 $\mu$m in thickness. The compositions (wt %) of these glass layers were shown in Table 30 (appearing after Example 64).

R.F. sputtering was carried out under an atmosphere of argon to form a zirconium boride ($ZrB_2$) film of about 600 Å in thickness on the various glazed ceramics substrates. Further, Ti and Au were deposited in the respective thickness of 50 Å and 1 $\mu$m by the electron beam deposition. The etching was selectively carried out to form a thermal head pattern. Furthermore, R.F. sputtering was effected under an atmosphere of argon to form a silicon oxide ($SiO_2$) film of 1.5 $\mu$m in thickness and tantalum oxide ($Ta_2O_5$) film of 5 $\mu$m in thickness as the protective coatings. The thermal heads thus prepared have a resolution of 4 lines/mm.

Pulse of 650 $\mu$s was applied to the thermal heads in a cycle of 50 Hz by a power of 3.2 W/dot for one hour. But, with respect to Example 57-9, the supplied power was 4.0 W/dot. At that time, the percent resistance change of the resistive heater elements was measured, the results of which are shown in Table 31 (appearing after Example 64).

It was found that practical print image was obtained by the above mentioned supplied power.

As shown in Table 31, the softening point of the glass layer and the content of the alkali component ($K_2O + Na_2O$) have great influence on the durability of the thermal head at a high temperature. Good results were obtained when $Na_2O + K_2O \leq 1.0$ wt %, the glass layer is of quartz only and the softening point of the glass layer was higher than 745° C.

The thermal head of Example 57-6 was subjected to the durability test for 500 hours under the foregoing conditions, and as the result the percent resistance change was found to be 3.5% or below. When the percent resistance change exceeds 10%, the lifetime is considered to expire. Therefore, the thermal head of Example 57-6 had a lifetime of longer than 500 hours while the thermal heads of Examples 57-1, 57-2 and 57-5 had a lifetime of only within one hour which did not fall under the present invention.

Further, another thermal head is shown in which zirconium boride constituting the above mentioned resistive heater element was replaced by another boride. The glass layer of Example 57-4 in Table 30 was used as that of such thermal head. The other structures of the thermal head are the same as those of the thermal head having a resistive heater element of zirconium boride.

Pulse of 650 μs in the pulse width was applied to the thermal head in a cycle of 50 Hz for one hour by a power of 3.2 W/dot. The percent resistance change at that time is shown in Table 32 (appearing after Example 64).

In this example, the effect of the glass layer was confirmed. Also, in case of using resistive heater elements of nichrome and tantalum nitride (TaN), good results were obtained under the conditions that $K_2O + Na_2O \leq 1.0$ wt % and $Ts \geq 745°$ C.

Figure 47:
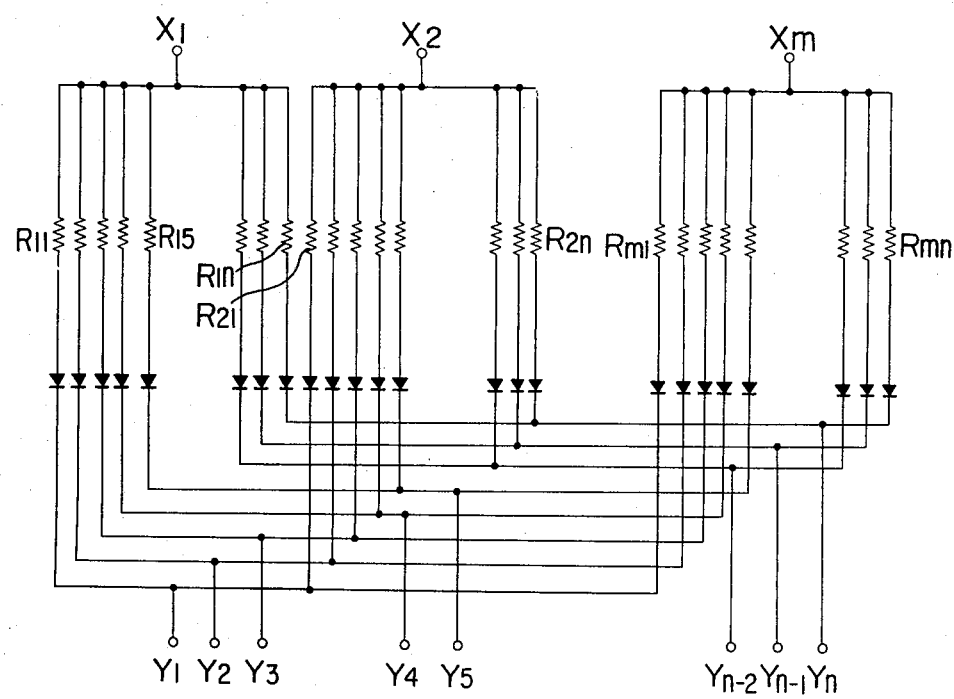
FIG. 47 is a matrix wiring diagram to be applied to the thermal head according to the present invention.

Moreover, a plurality of the above mentioned thermal heads were placed side by side. As shown in FIG. 47, 1536 resistive heater elements ($R_{11}$-$R_{mn}$) were disposed in a row so that the total width thereof might be in an effective recording width of A4 size, i.e. 192 mm, and they were connected in a matrix array. At that time, the "m and n" were fixed to 24 and 64, respectively.

The printing was carried out on a paper of A4 size by using the facsimile thermal head having a resolution of 8 lines/mm in the primary scanning. That is, the printing was carried out on one line of the effective recording width of A4 size paper, for example from its left side in such a manner that the upper common electrode ($X_1$) and lower common electrode were enabled to carry out the printing in accordance with the recording signal and successively the upper common electrodes ($X_2$-$X_m$) and lower common electrodes were also enabled to carry out the printing. The paper was advanced incrementally by a pulse motor so that the resolution in the secondary scanning might be 8 lines/mm, and the above mentioned printing operation was repeated. In such a manner, the printing was completed on the recording length of the paper (A4 size), i.e. 300 mm. When a pulse of 650 μs in pulse width was applied by a power of 80 W/mm² and the paper was advanced for 9 ms per line, it took about one minute to complete the printing on the whole recording area of A4 size.

In view of this, one minute machine is realized in the heat recording facsimile device having a resolution of 8 lines/mm in the primary and secondary scanning. The thermal head of the present invention is remarkably effective to attain the high speed heat recording device.

Further, when in the above mentioned recording operation using the thermal head of the present invention, signals are applied to the electrodes through two series, for example $X_1$-$X_{11}$ and $X_{12}$-$X_{24}$ to carry out the recording, twofold recording speed can be attained, and therefore, it is also possible to complete the recording on a paper of A4 size for 30 seconds only.

EXAMPLE 58

In this example, an under-coating layer was interposed between the resistive heater element and electrically conductive material.

Sputtering was carried out under argon partial pressure of $2 \times 10^{-2}$ Torr by using a sufficiently washed, glazed ceramics substrate and employing various targets of titanium boride ($TiB_2$), zirconium boride ($ZrB_2$), hafnium boride ($HfB_2$), vanadium boride ($VB_2$), niobium boride ($NbB_2$), tantalum boride ($TaB_2$), chromium boride ($CrB_2$), molybdenum boride ($MoB$), tungsten boride (mixture of WB and $WB_2$) and lanthanum boride ($LaB_6$) so that those metal boride films of 1000 Å in thickness were formed on the substrate. An under-coating layer was interposed between those metal boride films and electrically conductive material (gold, silver, copper and aluminum being used) films in order to test the adhesion therebetween. As the under-coating layer, three kinds of chromium, nichrome and titanium layers of 100 Å–200 Å in thickness were formed on the metal boride films by the electron beam deposition which was carried out under the vacuum degree of $5 \times 10^{-6}$ Torr. Gold, silver, copper and aluminum films of 5000 Å in thickness were formed, as the electrically conductive material layer, on the under-coating layer by the electron beam deposition.

The thus prepared samples were tested with respect to the adhesion between the boride film and electrically conductive material layer. That is, they were washed by ultrasonic waves in isopropyl alcohol for 15 minutes, and at that time, the peeled state of the electrically conductive material layer was observed, the results of which are shown in Table 33 (appearing after Example 64).

In the samples wherein gold and silver were deposited directly on the boride film, the gold and silver films were perfectly peeled off in the above mentioned test. Also in the samples wherein copper and aluminum were deposited directly on the boride film, the copper and aluminum films were locally peeled off. As regards the samples wherein the chromium, nichrome and titanium films were formed between the boride film and electrically conductive material layer in order to improve the adhesive therebetween, where the titanium film was provided, none of gold, silver, copper and aluminum films were peeled off. But, where the chromium and nichrome film were provided, a part of the gold and silver was removed.

In view of the results, it was found that the chromium, nichrome and titanium films improved the adhesion between the boride film and electrically conductive material layer. Particularly, the adhesion was largely improved by the interposition of the titanium film.

EXAMPLE 59

The same samples as those prepared in Example 58 were tested with respect to the heat stability. That is, they were subjected to the heat treatment at 450° C. for 5 hours and the resistances before and after the heat treatment were measured. The percent resistance change is shown in Table 34 (appearing after Example 64).

As understood from Table 34, the sample using titanium is very small in the resistance change and therefore very stable. As for the samples using gold and silver in which the undercoating layer was not formed, the adhesion between the gold and silver films and the boride film becomes poor by the heat treatment, and the film was peeled off to cause the contact to be poor.

Further, as the result of observation of the samples using chromium and nichrome before and after the heat treatment, it is considered that chromium and nichrome react rigorously with the boride, which results in poor contact between the boride film and electrically conductive material layer.

EXAMPLE 60

The titanium layer of Examples 58 and 59 was replaced by various titanium alloy layers. The titanium alloy includes:

60-1. alloy of titanium and aluminum in the weight ratio of 9:1,
60-2. alloy of titanium of gold in the weight ratio of 9:1,
60-3. alloy of titanium and copper in the weight ratio of 9:1,
60-4. alloy of titanium and silver in the weight ratio of 9:1,
60-5. alloy of titanium and zirconium in the weight ratio of 8:2,
60-6. alloy of titanium and hafnium in the weight ratio of 8:2,
60-7. alloy of titanium and niobium in the weight ratio of 8:2,
60-8. alloy of titanium and vanadium in the weight ratio of 8:2,
60-9. alloy of titanium and tantalum in the weight ratio of 8:2,
60-10. alloy of titanium and chromium in the weight ratio of 8:2,
60-11. alloy of titanium and molybdenum in the weight ratio of 8:2,
60-12. alloy of titanium and tungsten in the weight ratio of 8:2, and
60-13. alloy of titanium and lanthanum in the weight ratio of 8:2.

Those titanium alloy layers were formed by the electron beam deposition. The same test as in Examples 58 and 59 was conducted to obtain almost the same results.

EXAMPLE 61

Vanadium was substituted for the titanium used in Examples 58 and 59. The same test was conducted to obtain a similar results.

EXAMPLE 62

Vanadium was substituted for the titanium of Example 60. In addition, the alloy No. 60-8 was replaced by an alloy of vanadium and titanium in the weight ratio of 8:2.

The same test as in Example 62 was conducted to obtain almost the same results.

EXAMPLE 63

In this example, a thermal head was prepared which had a protective coating of zirconium oxide.

Sputtering was carried out under a vacuum degree of $3 \times 10^{-2}$ Torr by using a target of zirconium boride hot-pressed at 1300° C. and employing a glazed ceramics substrate. As the result, a resistive heater element of about 800 Å in thickness was formed on the substrate.

Further, a titanium film of 50 Å in thickness and gold film of 1.5 μm in thickness were formed, as the electrode materials, on the resistive heater element. The etching was selectively carried out to form a resistive heater element pattern having a resolution of 4 lines/mm. Then, zirconium oxide was deposited in a thickness of 2.5 μm as the protective coating in such a manner that sputtering was carried out under the vacuum degree of $3 \times 10^{-2}$ Torr by using a target of zirconium oxide ($ZrO_2$). The thus prepared thermal head is designated by $A_{560}$.

In the above mentioned procedure, the target used in forming the resistive heater element was replaced by a target of hafnium boride hot-pressed at 1300° C. to form a resistive heater element of hafnium boride of about 800 Å in thickness in the same manner. Further, the same electrodes and protective coating as those mentioned above were formed to prepare a thermal head $A_{561}$.

For comparison, conventional thermal head having a resistive heater element of tantalum nitride of 800° C. in the thickness was prepared. The tantalum nitride resistive heater element was formed in such a manner that R. F. sputtering was carried out under an atmosphere of argon and nitrogen by using a target of metal tantalum while the pressure of argon and nitrogen was controlled to $3 \times 10^{-2}$ Torr and the nitrogen partial pressure was $1 \times 10^{-4}$ Torr. X-ray analysis of the resistive heater element showed $Ta_2N$. On the resistive heater element, an electrode was formed in the same manner as mentioned above, and a silicon oxide ($SiO_2$) film of 2.5 μm in thickness and tantalum oxide ($Ta_2O_5$) film of 5 μm in thickness were formed as the protective coatings by the sputtering method so that a thermal head $B_{53}$ was prepared.

Figure 48:
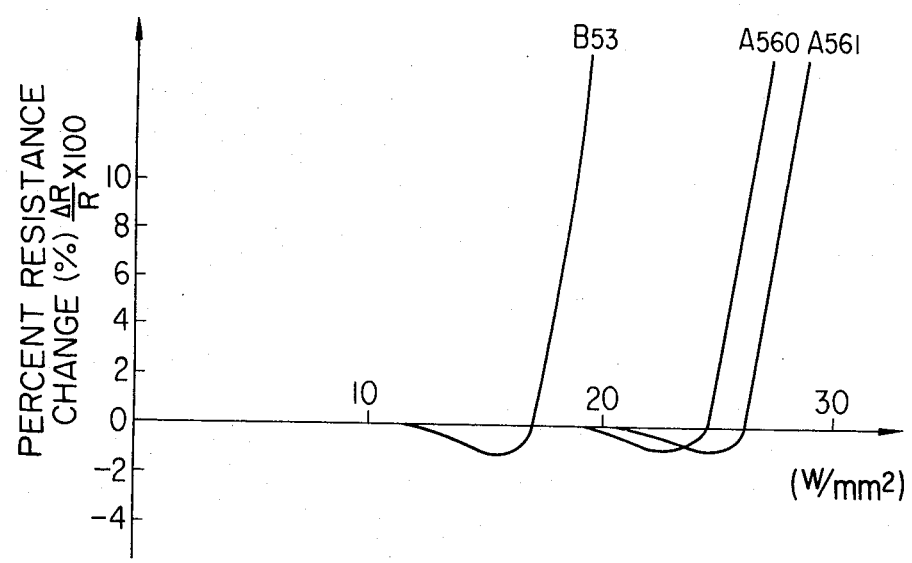

Pulse of rectangular wave having a pulse width of 6 ms was applied to the thermal heads $A_{560}$, $A_{561}$ and $B_{53}$ in a cycle of 50 Hz. At that time, the supplied power was increased by 1 W/mm² at each 30 minutes, and the percent resistance change was measured, the results of which are shown in FIG. 48.

EXAMPLE 64

The same thermal heads $A_{560}$, $A_{561}$ and $B_{53}$ as in Example 63 were prepared. These thermal heads were caused to scan on a heat-sensitive recording paper under a contact pressure of about 600 g/cm² to conduct abrasion resistance test. As the result, it was found that in the abrasion degree of the protective coating, the tantalum oxide coating was 0.2 μm/km and zirconium oxide was 0.18 μm/km.

As understood from the foregoing, the protective coating of zirconium oxide was excellent in the abrasion resistance and very good in the adhesion to the resistive heater element and electrode.

TABLE 20

| | | Example No. | | | | | | | | | |
|---|---|---|---|---|---|---|---|---|---|---|---|
| | | 40-1 | 40-2 | 40-3 | 40-4 | 40-5 | 40-6 | 40-7 | 40-8 | 40-9 | 40-10 |
| Target | Material | Hafnium boride | Lanthanum boride | Chromium boride | Titanium boride | Tantalum toride | Niobium boride | Tungsten boride | Molybdenum boride | Vanadium boride | Zirconium boride 50 mol % Hafnium boride 50 mol % |
| | Hot-press temp. (°C.) | 1100 | 1100 | 1100 | 1100 | 1100 | 1100 | 1100 | 1100 | 1100 | 1200 |
| Sputtering at- | Argon pressure | $4 \times 10^{-2}$ | $4 \times 10^{-2}$ | $4 \times 10^{-2}$ | $4 \times 10^{-2}$ | $4 \times 10^{-2}$ | $4 \times 10^{-2}$ | $4 \times 10^{-2}$ | $4 \times 10^{-2}$ | $4 \times 10^{-2}$ | $4 \times 10^{-2}$ |

TABLE 20-continued

Figure 33:
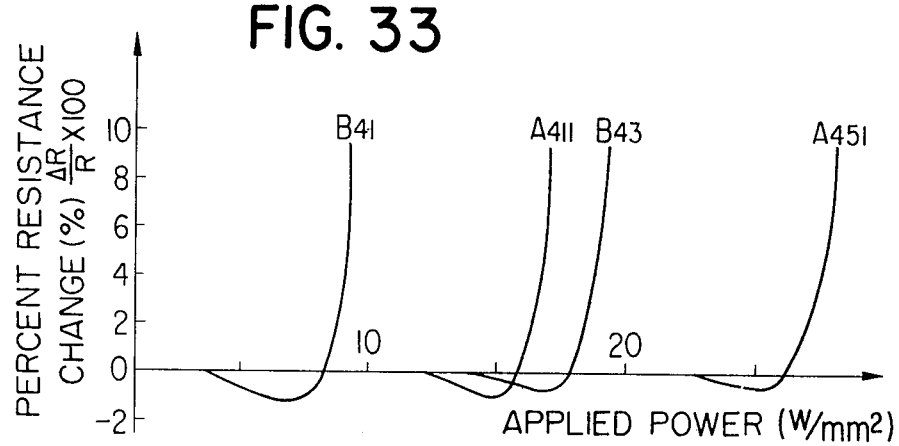
Figure 34:
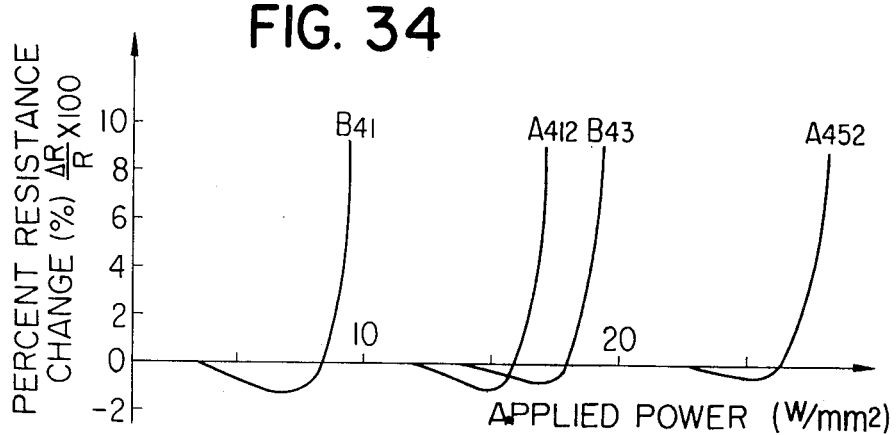
Figure 35:
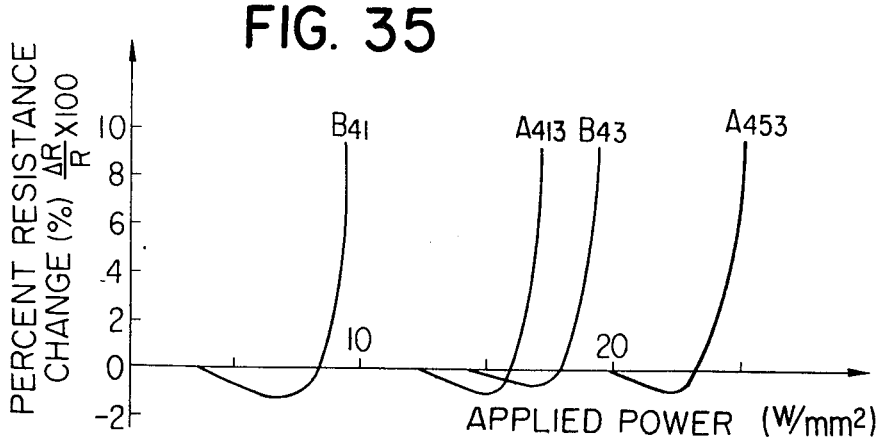
Figure 36:
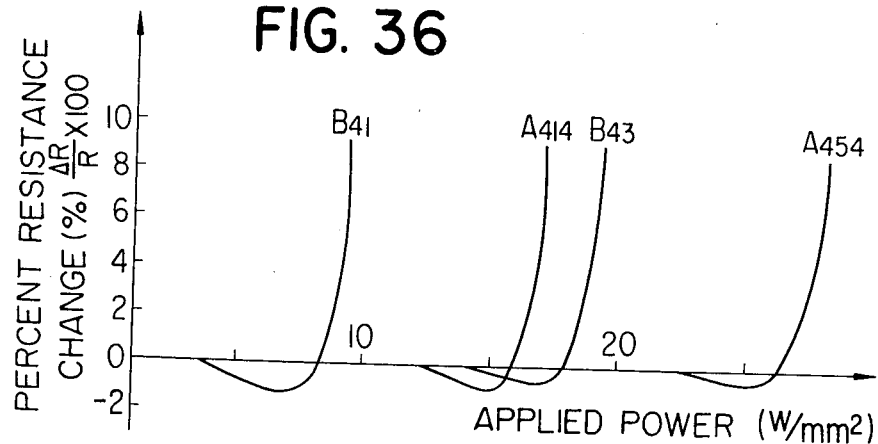
Figure 37:
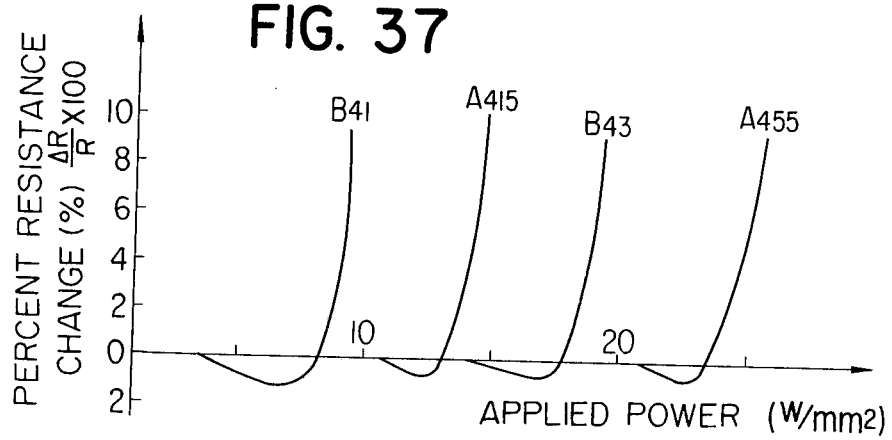
Figure 38:
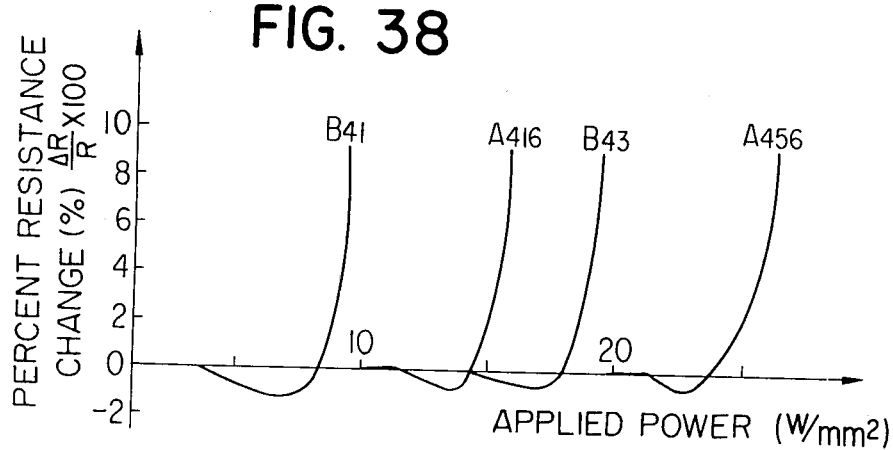
Figure 42:
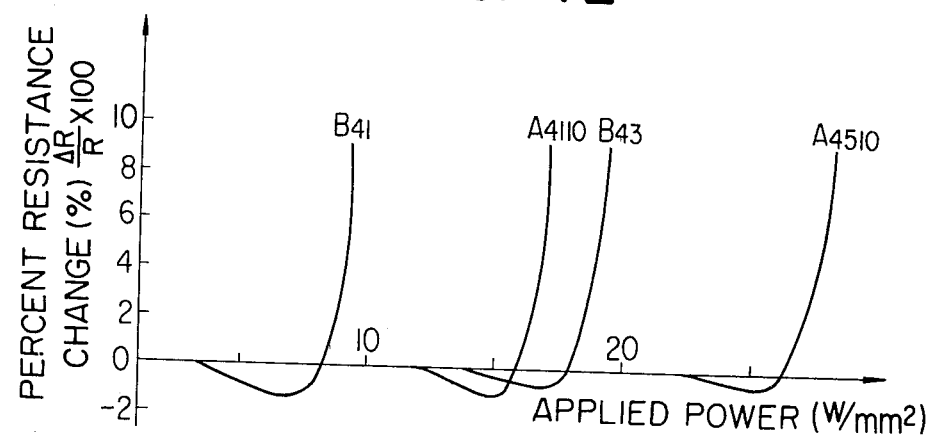

| | | \multicolumn{10}{c}{Example No.} | | | | | | | | | |
|---|---|---|---|---|---|---|---|---|---|---|---|
| | | 40-1 | 40-2 | 40-3 | 40-4 | 40-5 | 40-6 | 40-7 | 40-8 | 40-9 | 40-10 |
| mosphere (Torr) | Oxygen pressure (Torr) | $3 \times 10^{-3}$ | $3 \times 10^{-3}$ | $3 \times 10^{-3}$ | $3 \times 10^{-3}$ | $3 \times 10^{-3}$ | $3 \times 10^{-3}$ | $3 \times 10^{-3}$ | $3 \times 10^{-3}$ | $3 \times 10^{-3}$ | $1 \times 10^{-3}$ |
| Resistive heater element | Thickness (Å) | 1000 | 1000 | 1000 | 1000 | 1000 | 1000 | 1000 | 1000 | 1000 | 900 |
| | Resistivity ($\mu\Omega$cm) | 1200 | 1200 | 700 | 1000 | 600 | 700 | 750 | 1000 | 1200 | 800 |
| | Sheet resistance ($\Omega/\square$) | 120 | 120 | 70 | 100 | 60 | 70 | 75 | 100 | 120 | 80 |
| | Oxygen content (Atomic ratio) | 0.3 | 0.18 | 0.19 | 0.26 | 0.21 | 0.22 | 0.24 | 0.28 | 0.23 | 0.21 |
| Symbol for thermal head | No protective layer | $A_{411}$ | $A_{412}$ | $A_{413}$ | $A_{414}$ | $A_{415}$ | $A_{416}$ | $A_{417}$ | $A_{418}$ | $A_{419}$ | $A_{4110}$ |
| | Two protective layers | $A_{451}$ | $A_{452}$ | $A_{453}$ | $A_{454}$ | $A_{455}$ | $A_{456}$ | $A_{457}$ | $A_{458}$ | $A_{459}$ | $A_{4510}$ |
| Corresponding figure | | FIG. 33 | FIG. 34 | FIG. 35 | FIG. 36 | FIG. 37 | FIG. 38 | FIG. 39 | FIG. 40 | FIG. 41 | FIG. 42 |

TABLE 21

| | | \multicolumn{9}{c}{Example No.} | | | | | | | | |
|---|---|---|---|---|---|---|---|---|---|---|
| | | 43-2 | 43-3 | 43-4 | 43-5 | 43-6 | 43-7 | 43-8 | 43-9 | 43-10 |
| Target | Material | Lanthanum boride | Chromium boride | Titanium boride | Tantalum boride | Niobium boride | Tungsten boride | Molybdenum boride | Vanadium boride | Zirconium boride 50 mol % Titanium boride 50 mol |
| Sputtering conditions | Hot-press temp. (°C.) | 1300 | 1300 | 1300 | 1300 | 1300 | 1300 | 1300 | 1300 | 1200 |
| | Argon pressure (Torr) | $4 \times 10^{-2}$ | $4 \times 10^{-2}$ | $4 \times 10^{-2}$ | $4 \times 10^{-2}$ | $4 \times 10^{-2}$ | $4 \times 10^{-2}$ | $4 \times 10^{-2}$ | $4 \times 10^{-2}$ | $4 \times 10^{-2}$ |
| | Oxygen pressure (Torr) | $4 \times 10^{-3}$ | $4 \times 10^{-3}$ | $4 \times 10^{-3}$ | $4 \times 10^{-3}$ | $4 \times 10^{-3}$ | $4 \times 10^{-3}$ | $4 \times 10^{-3}$ | $4 \times 10^{-3}$ | $4 \times 10^{-2}$ |
| | Heating temp. for substrate (°C.) | 200 | 200 | 200 | 200 | 200 | 200 | 200 | 200 | 200 |
| Resistive heater element | Thickness (Å) | 600 | 600 | 600 | 600 | 600 | 600 | 600 | 600 | 600 |
| | Resistive ($\mu\Omega$cm) | 2100 | 1300 | 1900 | 1100 | 1300 | 1440 | 1800 | 2300 | 3000 |
| | Sheet resistance ($\Omega/\square$) | 350 | 215 | 310 | 180 | 215 | 240 | 300 | 390 | 500 |

TABLE 22

| | | \multicolumn{9}{c}{Example No.} | | | | | | | | |
|---|---|---|---|---|---|---|---|---|---|---|
| | | 46-2 | 46-3 | 46-4 | 46-5 | 46-6 | 46-7 | 46-8 | 46-9 | 46-10 |
| Target | Material | Lanthanum | Chromium | Titanium | Tantalum | Niobium | Tungsten | Molybdenum | Vanadium | Titanium: Hafnium: Boron |
| | Oxygen: Boron (Surface area ratio) | 1:6 | 1:2 | 1:2 | 1:2 | 1:2 | 1:2 | 1:1 | 1:2 | 2:1:6 |
| Resistive heater element | Thickness (Å) | 800 | 800 | 800 | 800 | 800 | 800 | 800 | 800 | 800 |
| | Resistivity ($\mu\Omega$cm) | 1040 | 640 | 920 | 540 | 600 | 640 | 880 | 1000 | 1600 |
| | Sheet resistance | 130 | 80 | 115 | 67 | 75 | 80 | 110 | 125 | 200 |

TABLE 22-continued

| | Example No. | | | | | | | | |
|---|---|---|---|---|---|---|---|---|---|
| | 46-2 | 46-3 | 46-4 | 46-5 | 46-6 | 46-7 | 46-8 | 46-9 | 46-10 |
| Limited value of power (W/mm²) (Ω/□) | 23 | 22 | 22 | 22.5 | 21.5 | 21 | 22 | 21.5 | 22 |

TABLE 23

| Example No. | 48-2 | 48-3 | 48-4 | 48-5 | 48-6 | 48-7 | 48-8 | 48-9 | 48-10 |
|---|---|---|---|---|---|---|---|---|---|
| Target Material | Lanthanum | Chromium | Titanium | Tantalum | Niobium | Tungsten | Molybdenum | Vanadium | Zirconium 3:Tantalum 1 (Surface area ratio) |
| Resistive heater element Thickness (Å) | 1000 | 1000 | 1000 | 1000 | 1000 | 1000 | 1000 | 1000 | 1000 |
| Resistivity (μΩcm) | 500 | 300 | 430 | 300 | 300 | 300 | 450 | 500 | 650 |
| Sheet resistance (Ω/□) | 50 | 30 | 43 | 30 | 30 | 30 | 45 | 50 | 65 |
| Limited value of power (W/mm²) | 22.5 | 21.5 | 22.5 | 22 | 21 | 21.5 | 22.5 | 21 | 21 |

TABLE 24

| No. | 50-1 | 50-2 | 50-3 | 50-4 | 50-5 | 50-6 | 50-7 | 50-8 | 50-9 | 50-10 |
|---|---|---|---|---|---|---|---|---|---|---|
| Target Material | Hafnium boride | Lanthanum boride | Chromium boride | Titanium boride | Tantalum boride | Niobium boride | Tungsten boride | Molybdenum boride | Vanadium boride | Zirconium boride 2: Chromium boride 1 (Mole ratio) |
| Resistive heater element Thickness (Å) | 1000 | 1000 | 1000 | 1000 | 1000 | 1000 | 1000 | 1000 | 1000 | 1000 |
| Resistivity (μΩcm) | 700 | 700 | 400 | 580 | 360 | 400 | 400 | 600 | 700 | 1000 |
| Sheet resistance (Ω/□) | 70 | 70 | 40 | 58 | 36 | 40 | 40 | 60 | 70 | 100 |
| Oxygen content (atomic ratio) | 0.21 | 0.15 | 0.16 | 0.18 | 0.09 | 0.20 | 0.21 | 0.23 | 0.16 | 0.10 |

TABLE 25

| Example No. | SiO₂ | CaO | BaO | MgO | Al₂O₃ | B₂O₃ | PbO | Na₂O + K₂O | Softening point °C |
|---|---|---|---|---|---|---|---|---|---|
| 55-1 | 80.1 | | | | 2.5 | 12.8 | | 4.6 | 720 |
| 55-2 | 50.0 | 10.0 | | | 10.0 | 8.0 | 20.0 | 2.0 | 725 |
| 55-3 | 51.6 | 10.0 | | | 10.0 | 8.0 | 20.0 | 0.4 | 745 |
| 55-4 | 50.2 | | 25.1 | | 10.7 | 13.0 | | | 820 |
| 55-5 | 48.6 | | 25.1 | | 10.7 | 13.0 | | 1.4 | 841 |
| 55-6 | 62.0 | 10.0 | | 5.0 | 16.0 | 5.2 | | 0.1 | 890 |
| 55-7 | 57.0 | 5.5 | 12.0 | | 20.5 | 4.0 | | 1.0 | 900 |

TABLE 26

| Example No. | Percent resistance change (%) |
|---|---|
| 55-1 | +30.5 |
| 55-2 | +16.4 |
| 55-3 | +3.2 |
| 55-4 | +1.9 |
| 55-5 | +10.3 |
| 55-6 | +0.7 |
| 55-7 | +4.3 |
| Comparison ex. 55-1 | +9.5 |

TABLE 27

| | | Resistive heater element | Percent resistance change (%) |
|---|---|---|---|
| Example | 55-8 | Hafnium boride | +1.5 |
| Reference ex. | 55-2 | | +10.2 |
| Example | 55-9 | Lanthanum boride | +1.8 |
| Reference ex. | 55-3 | | +9.9 |
| Example | 55-10 | Tantalum boride | +2.7 |
| Reference ex. | 55-4 | | +13.9 |
| Example | 55-11 | Chromium boride | +2.4 |
| Reference ex. | 55-5 | | +17.4 |
| Example | 55-12 | | +4.8 |

TABLE 27-continued

| | | Resistive heater element | Percent resistance change (%) |
|---|---|---|---|
| Reference ex. | 55-6 | Titanium boride | +20.6 |
| Example | 55-13 | | + 6.1 |
| | | Molybdenum boride | |
| Reference ex. | 55-7 | | +28.3 |
| Example | 55-14 | | + 6.9 |
| | | Tungsten boride | |
| Reference ex. | 55-8 | | Broken |
| Example | 55-15 | | + 8.3 |
| | | Niobium boride | |
| Reference ex. | 55-9 | | Broken |

TABLE 28

| Example No. | Quartz thickness μm | Percent resistance change (%) 2.8 ms 1W | 1.0 ms 2.4W |
|---|---|---|---|
| 56-1 | 2 | +0.3 | +0.5 |
| 56-2 | 0.5 | +3.0 | +4.3 |
| 56-3 | 0.2 | +5.8 | +8.5 |
| 56-4 | 10 | +0.2 | +0.3 |
| Comparison ex. 56-1 | None | +6.2 | +9.5 |

TABLE 29

| | | Resistive heater element | Percent resistance change (%) |
|---|---|---|---|
| Example | 56-5 | | + 0.4 |
| | | Hafnium boride | |
| Comparison ex. | 56-2 | | + 8.5 |
| Example | 56-6 | | + 0.7 |
| | | Lanthanum boride | |
| Comparison ex. | 56-3 | | + 9.5 |
| Example | 56-7 | | + 1.8 |
| | | Tantalum boride | |
| Comparison ex. | 56-4 | | +13.3 |
| Example | 56-8 | | + 1.5 |
| | | Chromium boride | |
| Comparison ex. | 56-5 | | +15.7 |
| Example | 56-9 | | + 2.2 |
| | | Titanium boride | |
| Comparison ex. | 56-6 | | +16.0 |
| Example | 56-10 | | + 5.3 |
| | | Molybdenum boride | |
| Comparison ex. | 56-7 | | +22.4 |
| Example | 56-11 | | + 4.5 |
| | | Tungsten boride | |
| Comparison ex. | 56-8 | | +25.6 |
| Example | 56-12 | | + 8.4 |
| | | Niobium boride | |
| Comparison ex. | 56-9 | | Broken |

TABLE 30

| Example No. | $SiO_2$ | CaO | BaO | MgO | $Al_2O_3$ | $B_2O_3$ | PbO | ZnO | $Na_2O + K_2O$ | Ts °C. |
|---|---|---|---|---|---|---|---|---|---|---|
| 57-1 | 80.1 | | | | 2.5 | 12.8 | | | 4.6 | 720 |
| 57-2 | 50.0 | 10.0 | | | 10.0 | 8.0 | 20.0 | | 2.0 | 725 |
| 57-3 | 51.6 | 10.0 | | | 10.0 | 8.0 | 20.0 | | 0.4 | 745 |
| 57-4 | 50.2 | | 25.1 | | 10.7 | 13.0 | | | | 820 |
| 57-5 | 48.5 | | 25.1 | | 10.7 | 13.0 | | | 1.4 | 841 |
| 57-6 | 62.0 | 10.0 | | 5.0 | 16.0 | 5.2 | | | | 890 |
| 57-7 | 57.0 | 5.5 | 12.0 | | 20.5 | 4.0 | | | 1.0 | 900 |
| 57-8 | 100 | | | | | | | | | 1400 |
| 57-9 | 100 | | | | | | | | | 1400 |

Note: Ts is a softening point of glass.

TABLE 31

| Example No. | Percent resistance change (%) |
|---|---|
| 57-1 | 39.4 |
| 57-2 | 24.3 |
| 57-3 | 2.9 |
| 57-4 | 2.3 |
| 57-5 | 15.2 |
| 57-6 | 0.9 |
| 57-7 | 2.2 |
| 57-8 | 0.6 |
| 57-9 | 1.8 |

TABLE 32

| Example No | Resistive heater element | Percent resistance change (%) |
|---|---|---|
| 57-8 | Hafnium boride | +1.8 |
| 57-9 | Lanthanum boride | +2.1 |
| 57-10 | Tantalum boride | +4.0 |
| 57-11 | Chromium boride | +4.7 |
| 57-12 | Titanium boride | +5.1 |
| 57-13 | Molybdenum boride | +7.3 |
| 57-14 | Tungsten boride | +9.8 |
| 57-15 | Niobium boride | +10.5 |

TABLE 33

| Conductive material | Undercoating | | | |
|---|---|---|---|---|
| | None | Chromium | Nichrome | Titanium |
| Gold | Perfectly peeled off | Partially peeled off | Partially peeled off | No peeled off |
| Silver | Perfectly peeled off | Partially peeled off | Partially peeled off | " |
| Copper | Partially peeled off | No peeled off | No peeled off | " |
| Aluminum | Partially peeled off | No peeled off | No peeled off | " |

TABLE 34

| Conductive material | Undercoating | | | |
|---|---|---|---|---|
| | None | Chromium | Nichrome | Titanium |
| Gold | 100% or above | 50-100% | 50-100% | 5% or less |
| Silver | 100% or above | " | " | " |
| Copper | 10-50% | 10-50% | 10-50% | " |
| Aluminum | 5%-10% | " | " | " |

What we claim is:

1. A thermal head comprising means for producing a pattern on a recording medium in accordance with information to be recorded, said means including a substrate, a thin film resistive heater element overlying the substrate, and electrically conductive members overlying the resistive heater element for supplying the resistive heater element with electric power, wherein the resistive heater element comprises a metal boride.

2. A thermal head according to claim 1 in which the metal boride is selected from the group consisting of hafnium boride, zirconium boride, lanthanum boride, tantalum boride, vanadium boride, niobium boride, tungsten boride, chromium boride, titanium boride, molybdenum boride and mixtures thereof.

3. A thermal head according to claim 1 in which the resistive heater element comprises a metal boride and oxygen in an atomic form.

4. A thermal head according to claim 3 in which the atomic ratio of oxygen to the metal of the metal boride except boron in the resistive heater element is at least 0.005.

5. A thermal head according to claim 3 in which the atomic ratio of oxygen to the metal of the metal boride except boron in the resistive heater element is in the range of from 0.01 to 1.0.

6. A thermal head comprising means for producing a pattern on a recording medium in accordance with information to be recorded, said means including a substrate, a thin film resistive heater element overlying the substrate, and electrically conductive members overlying the resistive heater element for supplying the resistive heater element with electric power, wherein the resistive heater element comprises a metal boride and a metal other than that constituting the metal boride.

7. A thermal head according to claim 6 in which the metal is at least one member selected from the group consisting of Ti, Zr, Hf, V, Nb, Ta, Cr, Mo, W, Cu, Ag, Au, Mn, Fe, Co, Ni, Pt, Rh, Pd, Os, Ir, Ru, and lanthanide series.

8. A thermal head according to claim 1 in which the resistive heater element is covered with a film containing silicon dioxide as the main component.

9. A thermal head according to claim 1 in which a protecting film of tantalum oxide covers the resistive heater element.

10. A thermal head according to claim 1 in which a protecting film of aluminum oxide covers the resistive heater element.

11. A thermal head according to claim 1 in which a protecting film of magnesium oxide covers the resistive heater element.

12. A thermal head according to claim 1 in which a protecting film of zirconium oxide covers the resistive heater element.

13. A thermal head according to claim 8 in which a protecting film of tantalum oxide covers the film of silicon dioxide.

14. A thermal head according to claim 8 in which a protecting film of aluminum oxide covers the film of silicon dioxide.

15. A thermal head according to claim 8 in which a protecting film of magnesium oxide covers the film of silicon dioxide.

16. A thermal head according to claim 8 in which a protecting film of zirconium oxide covers the film of silicon dioxide.

17. A thermal head according to claim 1 in which a titanium-containing layer is present between the resistive heater element and at least one electrically conductive member.

18. A thermal head according to claim 17 in which the titanium-containing layer is between 5 Å and 1000 Å in thickness.

19. A thermal head according to claim 1 in which a vanadium-containing layer is present between the resistive heater element and at least one electrically conductive member.

20. A thermal head according to claim 19 in which the vanadium-containing layer is between 5 Å and 1000 Å in thickness.

21. A thermal head according to claim 1 in which the substrate is a ceramic layer of 0.2-0.5 mm. in thickness.

22. A thermal head according to claim 1 in which the substrate is composed of a glazed substrate and a low alkali glass layer interposed between the glazed substrate and the resistive heater element and essentially consisting of a low alkali glass having a softening point of at least 745° C. and containing not more than 1.0% by weight of sodium oxide and potassium oxide based on the low alkali glass.

23. A thermal head according to claim 22 in which the low alkali glass layer is 0.2-50 μm in thickness.

24. A thermal head according to claim 1 in which the substrate is composed of a glazed substrate and a quartz layer interposed between the glazed substrate and the resistive heater element.

25. A thermal head according to claim 24 in which the quartz layer is 0.2-50 μm in thickness.

26. A thermal head according to claim 1 in which the substrate is composed of a layer composed of a material having a good thermal conductivity and a quartz layer interposed between the layer composed of a material having a good thermal conductivity and the resistive heater element.

27. A thermal head according to claim 26 in which the quartz layer is 1-90 μm in thickness.

28. A thermal head comprising a substrate, a thin film resistive heater element overlying the substrate, and electrically conductive members overlying the resistive heater element for supplying the resistive heater element with electric power, wherein the resistive heater element comprises a metal boride, and a semiconductor selected from the group consisting of Si and Ge.

29. A thermal head according to claim 1 in which the substrate is composed of a glazed substrate essentially consisting of a material of a good thermal conductivity, and a glass layer covering the material.

30. A thermal head according to claim 1 in which the substrate is composed of a material having a good thermal conductivity and a low alkali glass layer overlying the layer composed of a material having a good thermal conductivity and essentially consisting of a low alkali glass having a softening point of at least 745° C. and containing not more than 1.0% by weight sodium oxide and potassium oxide based on the low alkali glass.

31. A thermal head according to claim 30 in which the low alkali glass layer is 1-90 μm in thickness.

32. A thermal head according to claim 1 in which the thin film resistive heater element is formed by sputtering.

33. A thermal head according to claim 1 in which the thin film resistive heater element is formed by electron beam deposition.

34. A thermal head according to claim 32 or 33 in which oxygen is present in the atmosphere used in formation of the thin film resistive heater element.

35. A thermal head according to claim 28, wherein said resistive heater element further comprises oxygen in an atomic form.

36. A thermal head according to claim 1, wherein said means includes a plurality of resistive heater elements each provided with corresponding electrically conductive members.

* * * * *

UNITED STATES PATENT OFFICE
CERTIFICATE OF CORRECTION

Patent No. 4,296,309                 Dated   October 20, 1981

Inventor(s)  AKIRA SHINMI, ET AL.

It is certified that error appears in the above-identified patent and that said Letters Patent are hereby corrected as shown below:

Column 1, line 66, "to" should read --for a--;
         line 67, "for a" should read --to--.

Column 2, line 51, delete "a".

Column 11, line 15, "protectively" should read --protective--.

Column 14, line 1, "twolayered" should read --two-layered--;
         line 27, "thesurface" should read --the surface--.

Column 21, line 26, "$5 \times 10^2$" should read --$5 \times 10^{-2}$--.

Column 40, line 59, "a titanium" should read --A titanium--.

Column 41, line 13, "800 A" should read --800 $\overset{\circ}{A}$--;

line 16, "30 A" should read --30 $\overset{\circ}{A}$--.

Column 42, line 58, "3.4%" should read --± 3.4%--;
         line 59, "the results" should read --a result--.

UNITED STATES PATENT OFFICE
CERTIFICATE OF CORRECTION

Patent No. 4,296,309　　　　　　　　Dated　October 20, 1981

Inventor(s)　AKIRA SHINMI, ET AL.

It is certified that error appears in the above-identified patent and that said Letters Patent are hereby corrected as shown below:

Column 43, line 13, "such a results" should read --such results--.

Column 47, line 39, "a similar results" should read --similar results--.

Column 50, line 40, (Table 21), the oxygen pressure, for example, 43-10, "$4 \times 10^{-2}$" should read --$4 \times 10^{-3}$--.

Signed and Sealed this

*Twenty-third* Day of *March 1982*

|SEAL|

*Attest:*

GERALD J. MOSSINGHOFF
*Attesting Officer*　　　*Commissioner of Patents and Trademarks*